(12) United States Patent
Sasaki

(10) Patent No.: US 8,778,577 B2
(45) Date of Patent: Jul. 15, 2014

(54) COLORED COMPOSITION, COLORED CURED FILM, COLOR FILTER, METHOD FOR PRODUCING COLOR FILTER, LIQUID CRYSTAL DISPLAY DEVICE, SOLID-STATE IMAGING DEVICE, AND NOVEL DIPYRROMETHENE METAL COMPLEX COMPOUND OR TAUTOMER THEREOF

(71) Applicant: Fujifilm Corporation, Tokyo (JP)

(72) Inventor: Daisuke Sasaki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/043,827

(22) Filed: Oct. 1, 2013

(65) Prior Publication Data
US 2014/0038092 A1 Feb. 6, 2014

Related U.S. Application Data

(63) Continuation of application No. PCT/JP2012/059267, filed on Apr. 4, 2012.

(30) Foreign Application Priority Data

Apr. 4, 2011 (JP) ................................. 2011-083181

(51) Int. Cl.
G03F 7/20 (2006.01)
G02B 5/20 (2006.01)
G03F 7/004 (2006.01)

(52) U.S. Cl.
USPC ............. 430/7; 430/270.1; 548/402; 548/403

(58) Field of Classification Search
None
See application file for complete search history.

(56) References Cited

FOREIGN PATENT DOCUMENTS

| JP | H06-75375 A | 3/1994 |
|---|---|---|
| JP | 3387541 B2 | 3/2003 |
| JP | 2007-039478 A | 2/2007 |
| JP | 2008-292970 A | 12/2008 |
| JP | 2012-041330 A | * 3/2012 |

OTHER PUBLICATIONS

Computer-generated transaltion of JP 2012-041330 (Mar. 2012).*
International Search Report issued in International Application No. PCT/JP2012/059267on Jul. 3, 2012.
Written Opinion of the ISA issued in International Application No. PCT/JP2012/059267 on Jul. 3, 2012.

* cited by examiner

*Primary Examiner* — John A. McPherson
(74) *Attorney, Agent, or Firm* — SOLARIS Intellectual Property Group, PLLC

(57) ABSTRACT

A colored composition including at least one selected from the group consisting of a compound represented by the following formula (I) and a tautomer thereof. In formula (I), $R^2$ to $R^5$ each independently represent a hydrogen atom or a monovalent substituent, $R^7$ represents a hydrogen atom, a halogen atom, an alkyl group, or the like, Ma represents a metal or a metal compound, $X^3$ and $X^4$ each independently represent NR, a nitrogen atom, an oxygen atom, or a sulfur atom, R represents a hydrogen atom, an alkyl group, or the like, $Y^1$ and $Y^2$ each independently represent NRc, a nitrogen atom, or a carbon atom, Rc represents a hydrogen atom, an alkyl group, or the like, and $R^8$ and $R^9$ each independently represent an alkyl group, an alkenyl group, or the like. Z represents an atomic group that forms a nitrogen-containing ring having a specific structure.

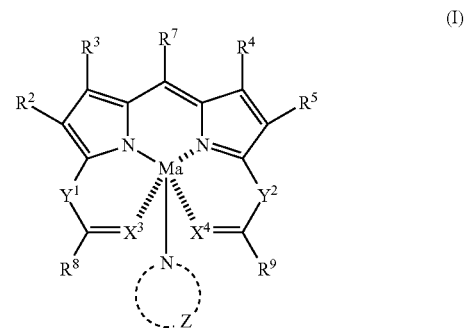

18 Claims, No Drawings

COLORED COMPOSITION, COLORED CURED FILM, COLOR FILTER, METHOD FOR PRODUCING COLOR FILTER, LIQUID CRYSTAL DISPLAY DEVICE, SOLID-STATE IMAGING DEVICE, AND NOVEL DIPYRROMETHENE METAL COMPLEX COMPOUND OR TAUTOMER THEREOF

CROSS-REFERENCE TO RELATED APPLICATIONS

This application is a continuation application of International Application No. PCT/JP2012/059267, filed Apr. 4, 2012, the disclosure of which is incorporated herein by reference in its entirety. Further, this application claims priority from Japanese Patent Application No. 2011-083181, filed Apr. 4, 2011, the disclosure of which is incorporated herein by reference in its entirety.

TECHNICAL FIELD

The present invention relates to a colored composition, a colored cured film, a color filter, a method for producing a color filter, a liquid crystal display device, a solid-state imaging device, and a novel dipyrromethene metal complex compound or a tautomer thereof.

BACKGROUND ART

In the conventional art, color filters are produced by incorporating a pigment-dispersed composition in which an organic pigment or an inorganic pigment is dispersed, a polyfunctional monomer, a polymerization initiator, an alkali soluble resin, and other optional components to give a colored composition, and forming a colored pattern by a photolithography method, an ink jet method, or the like using the colored composition.

In recent years, there has been a trend in which the use of color filters for liquid crystal display devices (LCDs) has been expanding from monitors to televisions (TVs). Along with this trend of expanding use, the color filters have come to be required to have a high degree of color characteristics in terms of chromaticity, contrast, and the like. Similarly, color filters for image sensors (solid-state imaging devices) have also come to be required to have further improved color characteristics such as reduced color unevenness and improved color resolution.

However, in conventional color filters prepared using a pigment dispersion system, problems such as occurrence of scattering due to coarse pigment particles and an increase in viscosity caused by poor dispersion stability tend to occur, and it is difficult to further improve the contrast and the luminance in many cases.

Therefore, use of a dye as well as a pigment as a colorant has thus far been studied (see, for example, Japanese Patent Application Laid-Open (JP-A) No. H06-75375). It is thought that a dye is useful because, when a dye is used as a colorant, the hue and the luminance of a display image can be improved due to the color purity of the dye itself and the vivid hue thereof, and the contrast can be improved due to a lack of coarse particles.

As an example of the dye, compounds having a variety of colorant main structures are known, such as a dipyrromethene-based dye, a pyrimidine azo-based dye, a pyrazole azo-based dye, and a xanthene-based dye (see, for example, JP-A Nos. 2008-292970 and 2007-039478, and Japanese Patent No. 3387541).

SUMMARY OF INVENTION

Technical Problem

However, in a case in which a dye is used in a colored composition for preparing a color filter, a decrease in light resistance and heat resistance tends to occur, as compared with a conventional case in which a pigment is used. Further, when a color filter prepared using a dye is applied to a liquid crystal display device, a decrease in the voltage retention rate tends to occur. In particular, a decrease in the voltage retention rate may lead to an increased driving voltage, increased power consumption, decreased contrast, display unevenness, or color change, and is therefore preferably suppressed as much as possible.

Moreover, the above compounds, which are conventionally known dyes, have insufficient heat resistance in a case in which a color filter is prepared using a colored composition containing the compound. Further, when the color filter is applied to a liquid crystal display device, the voltage retention rate is insufficient, and improvement in the display image quality has been desired.

The present invention has been made in consideration of the above circumstances, and it is an object of the present invention to provide a colored composition that is useful for production of a color filter, has high color purity, provides a high absorption coefficient in a thin layer, enables formation of a colored film having excellent toughness (in particular, heat resistance and light resistance), and provides a high voltage retention rate when a voltage is applied to a liquid crystal display device including a color filter having the colored film; a colored cured film obtained from the colored composition; a color filter and a method for producing the same; a liquid crystal display device that displays images with vivid colors and exhibits high contrast; and a solid-state imaging device having decreased color unevenness and improved color resolution.

It is another object of the present invention to provide a novel dipyrromethene metal complex compound and a tautomer thereof, which have high color purity, a high absorption coefficient that enables formation of a thin layer, and excellent toughness (in particular, heat resistance and light resistance), and are useful for forming a colored film included in a color filter.

Solution to Problem

Means for solving the above problems are as follows.
<1> A colored composition comprising at least one selected from the group consisting of a compound represented by the following formula (I) and a tautomer thereof:

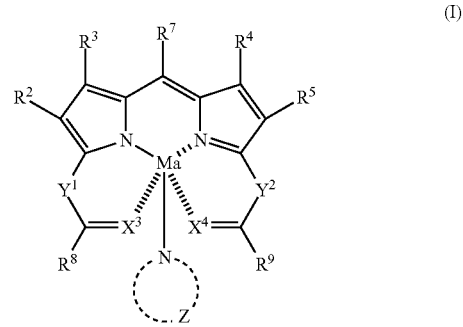

wherein in formula (I), $R^2$, $R^3$, $R^4$, and $R^5$ each independently represent a hydrogen atom or a monovalent substituent; $R^2$ and $R^3$ may be bonded to each other to form a 5-, 6-, or 7-membered saturated or unsaturated ring; $R^4$ and $R^5$ may be bonded to each other to form a 5-, 6-, or 7-membered saturated or unsaturated ring; $R^7$ represents a hydrogen atom, a halogen atom, an alkyl group, an aryl group, or a heterocyclic group; Ma represents a metal or a metal compound; $X^3$ and $X^4$ each independently represent NR, a nitrogen atom, an oxygen atom, or a sulfur atom, wherein R represents a hydrogen atom, an alkyl group, an alkenyl group, an aryl group, a heterocyclic group, an acyl group, an alkylsulfonyl group, or an arylsulfonyl group; $Y^1$ and $Y^2$ each independently represent NRc, a nitrogen atom, or a carbon atom, wherein Rc represents a hydrogen atom, an alkyl group, an alkenyl group, an aryl group, a heterocyclic group, an acyl group, an alkylsulfonyl group, or an arylsulfonyl group; $R^8$ and $R^9$ each independently represent an alkyl group, an alkenyl group, an aryl group, a heterocyclic group, an alkoxy group, an aryloxy group, an alkylamino group, an arylamino group, or a heterocyclic amino group; $R^8$ and $Y^1$ may be bonded to each other to form a 5-, 6-, or 7-membered ring; $R^9$ and $Y^2$ may be bonded to each other to form a 5-, 6-, or 7-membered ring; and Z represents an atomic group that is combined with an adjacent nitrogen atom to form a structure represented by the following formula (II) or (III):

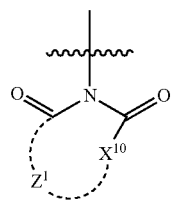

(II)

wherein in formula (II), $X^{10}$ represents $NR^{15}$, an oxygen atom, or a sulfur atom, wherein $R^{15}$ represents a hydrogen atom, an alkyl group, an alkenyl group, an aryl group, a heterocyclic group, an acyl group, an alkylsulfonyl group, or an arylsulfonyl group; and $Z^1$ represents an atomic group that includes a chain structure containing zero or one nitrogen atom and a carbon atom and connects an adjacent carbonyl carbon and $X^{10}$ by the chain structure to form a 5- or 6-membered ring;

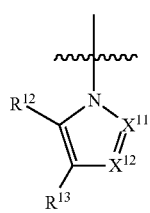

(III)

wherein in formula (III), $X^{11}$ and $X^{12}$ each independently represent a nitrogen atom or $CR^{16}$, wherein $R^{16}$ represents a hydrogen atom or a substituent; and $R^{12}$ and $R^{13}$ each independently represent a hydrogen atom or a monovalent substituent.

<2> The colored composition according to <1>, wherein Ma in formula (I) represents Fe, Zn, Co, V=O, or Cu.

<3> The colored composition according to <1> or <2>, further comprising a polymerizable compound and a photopolymerization initiator.

<4> The colored composition according to any one of <1> to <3>, further comprising either a pigment or an anthraquinone compound, or both of the pigment and the anthraquinone compound.

<5> The colored composition according to <4>, wherein the anthraquinone compound is a compound represented by the following formula (IX):

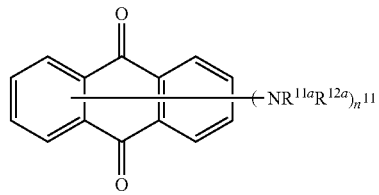

Formula (IX)

wherein in formula (IX), $R^{11a}$ and $R^{12a}$ each independently represent a hydrogen atom, an alkyl group, an aryl group, or a heterocyclic group, but $R^{11a}$ and $R^{12a}$ do not represent a hydrogen atom simultaneously; and $n^{11}$ represents an integer of from 1 to 4, and in a case in which $n^{11}$ represents an integer of from 2 to 4, a plurality of $NR^{11a}R^{12a}$'s may be the same as or different from each other.

<6> The colored composition according to any one of <1> to <5>, wherein a content of the at least one selected from the group consisting of a compound represented by formula (I) and a tautomer thereof is from 0.1% by mass to 30% by mass based on a total solid content of the colored composition.

<7> A compound represented by the following formula (I) or a tautomer thereof:

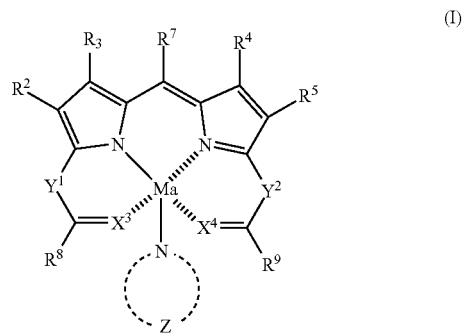

(I)

wherein in formula (I), $R^2$, $R^3$, $R^4$, and $R^5$ each independently represent a hydrogen atom or a monovalent substituent; $R^2$ and $R^3$ may be bonded to each other to form a 5-, 6-, or 7-membered saturated or unsaturated ring; $R^4$ and $R^5$ may be bonded to each other to form a 5-, 6-, or 7-membered saturated or unsaturated ring; $R^7$ represents a hydrogen atom, a halogen atom, an alkyl group, an aryl group, or a heterocyclic group; Ma represents a metal or a metal compound; $X^3$ and $X^4$ each independently represent NR, a nitrogen atom, an oxygen atom, or a sulfur atom, wherein R represents a hydrogen atom, an alkyl group, an alkenyl group, an aryl group, a heterocyclic group, an acyl group, an alkylsulfonyl group, or an arylsulfonyl group; $Y^1$ and $Y^2$ each independently represent NRc, a nitrogen atom, or a carbon atom, wherein Rc represents a hydrogen atom, an alkyl group, an alkenyl group, an aryl group, a heterocyclic group, an acyl group, an alkylsulfonyl group, or an arylsulfonyl group; $R^8$ and $R^9$ each independently represent an alkyl group, an alkenyl group, an aryl group, a heterocyclic group, an alkoxy group, an aryloxy group, an alkylamino group, an arylamino group, or a heterocyclic amino group; $R^8$ and $Y^1$ may be bonded to each other to form a 5-, 6-, or 7-membered ring; $R^9$ and $Y^2$ may be bonded to each other to form a 5-, 6-, or 7-membered ring; and Z represents an atomic group that is combined with an adjacent nitrogen atom to form a structure represented by the following formula (II) or (III):

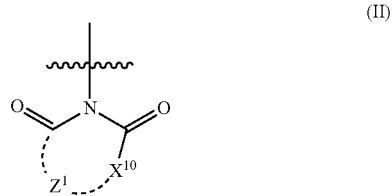

(II)

wherein in formula (II), $X^{10}$ represents $NR^{15}$, an oxygen atom, or a sulfur atom, wherein $R^{15}$ represents a hydrogen atom, an alkyl group, an alkenyl group, an aryl group, a heterocyclic group, an acyl group, an alkylsulfonyl group, or an arylsulfonyl group; and $Z^1$ represents an atomic group that includes a chain structure containing zero or one nitrogen atom and a carbon atom and connects an adjacent carbonyl carbon and $X^{10}$ by the chain structure to form a 5- or 6-membered ring;

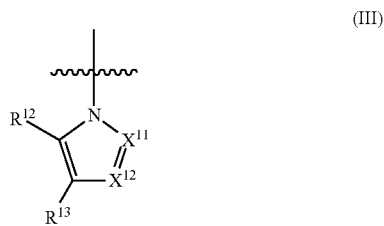

(III)

wherein in formula (III), $X^{11}$ and $X^{12}$ each independently represent a nitrogen atom or $CR^{16}$, wherein $R^{16}$ represents a hydrogen atom or a substituent; and $R^{12}$ and $R^{13}$ each independently represent a hydrogen atom or a monovalent substituent.

<8> A colored cured film obtained by curing the colored composition according to any one of <1> to <6>.

<9> A color filter comprising the colored cured film according to <8>.

<10> A method for producing a color filter, comprising: applying the colored composition according to any one of <1> to <6> onto a support to form a colored composition layer; and patternwise exposing and developing the formed colored composition layer to form a patterned colored region.

<11> A liquid crystal display device comprising the color filter according to <9> or a color filter produced by the method for producing a color filter according to <10>.

<12> A solid-state imaging device comprising the color filter according to <9> or a color filter produced by the method for producing a color filter according to <10>.

Advantageous Effects of Invention

According to the present invention, it is possible to provide a colored composition that is useful for production of a color filter, has high color purity, provides a high absorption coefficient in a thin layer, enables formation of a colored film having excellent toughness (in particular, heat resistance and light resistance), and provides a high voltage retention rate when a voltage is applied to a liquid crystal display device including a color filter having the colored film; a colored cured film obtained from the colored composition; and a color filter and a method for producing the same. According to the present invention, it is possible to provide a liquid crystal display device that displays images with vivid colors and exhibits high contrast; and a solid-state imaging device having decreased color unevenness and improved color resolution. According to the present invention, it is possible to provide a novel dipyrromethene metal complex compound and a tautomer thereof, which have high color purity, a high absorption coefficient that enables formation of a thin layer, and excellent toughness (in particular, heat resistance and light resistance), and are useful for forming a colored film included in a color filter.

DESCRIPTION OF EMBODIMENTS

Hereinafter, the colored composition, the colored cured film obtained by curing the colored composition, the color filter and the method for producing the same, the liquid crystal display device, the solid-state imaging device, and the novel dipyrromethene metal complex compound and tautomer thereof of the present invention will be described in detail.

With the colored composition, and the novel dipyrromethene metal complex compound and tautomer thereof of the present invention, the problems that could not be solved with a color resist using a conventionally known dye are solved, and therefore, they are useful, in particular, for a color filter used in a solid-state imaging device or an image display device (for example, a liquid crystal display device and an organic EL display device).

The description of the constituents of the present invention described below is based on the representative embodiments of the present invention, but the present invention is not limited to such embodiments.

In the colored composition of the present invention, the total solid content refers to a total mass of the components excluding an organic solvent from the total composition of the colored composition.

In the present specification, a numerical value range expressed with "to" means a range including the numerical values described before and after "to" as the lower limit and the upper limit, respectively.

In the present specification, for example, "alkyl group" indicates a "linear, branched, or cyclic" alkyl group. Further, in the description of groups (atomic groups) in the present specification, when the groups (atomic groups) are denoted without specifying whether substituted or unsubstituted, the groups include both groups having no substituent and groups having a substituent. For example, "alkyl groups" include not only alkyl groups having no substituent (unsubstituted alkyl groups) but also alkyl groups having a substituent (substituted alkyl groups).

Incidentally, in the present specification, "(meth)acrylate" indicates either or both of an "acrylate" and a "methacrylate", "(meth)acryl" indicates either or both of an "acryl" and a "methacryl", and "(meth)acryloyl" indicates either or both of "acryloyl" and "methacryloyl".

Further, in the present specification, a "monomer" has the same meaning as a "monomer". The "monomer" in the present specification is differentiated from an oligomer and a polymer, and refers to a compound having a weight average molecular weight of 2,000 or less.

In the present specification, the "polymerizable compound" refers to a compound having a polymerizable group and may be a monomer, an oligomer, or a polymer. The term "polymerizable group" refers to a group that participates in a polymerization reaction.

In the present specification, the term "step" encompasses not only an independent step but also a step of accomplishing a predetermined action of the step even though it cannot be differentiated from other steps.

In the present invention, the term "radiation" encompasses visible light rays, ultraviolet rays, far ultraviolet rays, electron beams, X-rays, and the like.

<Colored Composition, and Compound Represented by Formula (I) and Tautomer Thereof>

The colored composition of the present invention includes at least one selected from a compound represented by formula (I) and a tautomer compound thereof (hereinafter appropriately referred to as a "specific metal complex compound"), and preferably further includes a polymerizable compound and a photopolymerization initiator to be photosensitive.

In addition, the colored composition of the present invention preferably further includes a binder such as an alkali soluble resin, and an organic solvent, and may include various additives as desired.

In the present invention, among dipyrromethene metal complex compounds, in particular, at least one selected from a compound represented by formula (I) that is a metal complex compound having a specific nitrogen-containing ring ligand as a ligand coordinated to a metal or a metal compound, and a tautomer thereof (specific metal complex compound) is included. The specific metal complex compound is a novel compound and is included as a colorant in the colored composition of the present invention.

By incorporating a specific metal complex compound having a specific nitrogen-containing ring ligand as a colorant, it becomes possible to provide a colored composition that enables formation of a colored cured film (colored pattern) having excellent heat resistance, light resistance, voltage retention rate, contrast, and luminance; and a color filter including the same. Particularly, the specific metal complex compound of the present invention exhibits an excellent effect in improving the voltage retention rate in a case in which it is included in a colored composition for preparing a color filter or the like, as compared with various conventionally known dye compounds that have been used as a colorant.

Such an excellent effect exhibited by the specific metal complex compound and the colored composition including the same of the present invention are based on the following findings obtained by the inventor of the present invention.

In a case in which a conventionally known dye compound is included in a colored composition for preparing a color filter or the like, the voltage retention rate is decreased according to the type of the dye compound. In a case in which a conventionally known dye compound is used, the mechanism of action by which the voltage retention rate is decreased is not clear, but the reason is thought to be that the metal complex compound is ionized to generate ions by an electric field applied to a color filter. Therefore, it is thought that the improvement of the stability (binding power between the metal and the ligand) of the metal complex compound is important.

Here, in general, it may be considered that the coordination bond of a metal complex is a bond generated by a neutralization reaction between a metal ion that is a Lewis acid and a ligand that is a base. Accordingly, the stability of the metal complex generated through such a process is greatly affected by the basicity of the ligand.

However, for example, in a metal complex having $CH_3COO^-$ as a ligand, the ligand has a low electron density and a low basicity, and therefore, the stability of the metal complex (binding power between the metal and the ligand) is low and the metal complex is likely to be ionically dissociated. As a result, it is thought that a color filter obtained by using a colored composition including such a metal complex tends to cause a decrease in the voltage retention rate.

On the other hand, the specific metal complex compound of the present invention has a nitrogen-containing ring ligand with a high electron density as shown by formula (I). Accordingly, although not being necessarily clear, it is thought that the ligand in the specific metal complex compound has an increased basicity, and accordingly, the coordination power with a metal becomes higher, and thus, the complex stability is improved and the compound is hardly ionized.

Therefore, it is thought that a color filter including a colored cured film formed using a colored composition including such a specific metal complex compound having high stability may exhibit a high voltage retention rate.

Furthermore, it is thought that excellent stability exhibited by the specific metal complex compound contributes to an improvement of heat resistance and light resistance. Therefore, it is possible to obtain a color filter having less color change in which a decrease in the luminance is not caused by heat or light, by using a colored composition including the specific metal complex compound.

<Compound Represented by Formula (I) and Tautomer Compound Thereof>

The colored composition of the present invention includes at least one of a compound represented by the following formula (I) or a tautomer thereof (specific metal complex compound).

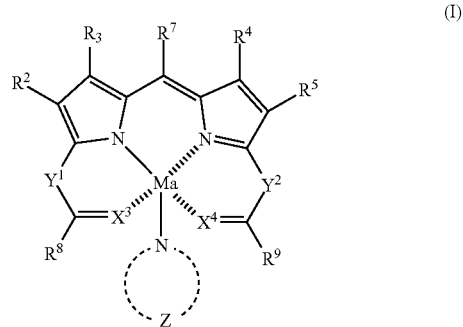

(I)

In formula (I), $R^2$, $R^3$, $R^4$, and $R^5$ each independently represent a hydrogen atom or a monovalent substituent. $R^2$ and $R^3$ may be bonded to each other to form a 5-, 6-, or 7-membered saturated or unsaturated ring. $R^4$ and $R^5$ may be bonded to each other to form a 5-, 6-, or 7-membered saturated or unsaturated ring. $R^7$ represents a hydrogen atom, a halogen atom, an alkyl group, an aryl group, or a heterocyclic group. Ma represents a metal or a metal compound. $X^3$ and $X^4$ each independently represent NR(R represents a hydrogen atom, an alkyl group, an alkenyl group, an aryl group, a heterocyclic group, an acyl group, an alkylsulfonyl group, or an arylsulfonyl group), a nitrogen atom, an oxygen atom, or a sulfur atom. $Y^1$ and $Y^2$ each independently represent NRc (Rc represents a hydrogen atom, an alkyl group, an alkenyl group, an aryl group, a heterocyclic group, an acyl group, an alkylsulfonyl group, or an arylsulfonyl group), a nitrogen atom, or a carbon atom. $R^8$ and $R^9$ each independently represent an alkyl group, an alkenyl group, an aryl group, a heterocyclic group, an alkoxy group, an aryloxy group, an alkylamino group, an arylamino group, or a heterocyclic amino group. $R^8$ and $Y^1$ may be bonded to each other to form a 5-, 6-, or 7-membered ring, and $R^9$ and $Y^2$ may be bonded to each other to form a 5-, 6-, or 7-membered ring. Z represents an atomic group that is combined with an adjacent nitrogen atom to form a structure represented by the following formula (II) or (III).

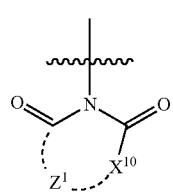
(II)

In formula (II), $X^{10}$ represents $NR^{15}$ ($R^{15}$ represents a hydrogen atom, an alkyl group, an alkenyl group, an aryl group, a heterocyclic group, an acyl group, an alkylsulfonyl group, or an arylsulfonyl group), an oxygen atom, or a sulfur atom. $Z^1$ represents an atomic group that includes a chain structure containing zero or one nitrogen atom and a carbon atom and connects the adjacent carbonyl carbon and $X^{10}$ by the chain structure to form a 5- or 6-membered ring.

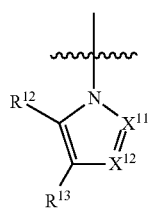
(III)

In formula (III), $X^{11}$ and $X^{12}$ each independently represent a nitrogen atom or $CR^{16}$ ($R^{16}$ represents a hydrogen atom or a substituent), and $R^{12}$ and $R^{13}$ each independently represent a hydrogen atom or a monovalent substituent.

Formula (I) will be described in detail.

In formula (I), $R^2$, $R^3$, $R^4$, and $R^5$ each independently represent a hydrogen atom or a monovalent substituent.

In formula (I), examples of the monovalent substituent represented by $R^2$, $R^3$, $R^4$, or $R^5$ include halogen atoms (for example, a fluorine atom, a chlorine atom, and a bromine atom), alkyl groups (preferably linear, branched, or cyclic alkyl groups having 1 to 48 carbon atoms, and more preferably linear, branched, or cyclic alkyl groups having 1 to 24 carbon atoms, for example, a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, and a 1-adamantyl group); alkenyl groups (preferably alkenyl groups having 2 to 48 carbon atoms, and more preferably alkenyl groups having 2 to 18 carbon atoms, for example, a vinyl group, an allyl group, and a 3-buten-1-yl group); aryl groups (preferably aryl groups having 6 to 48 carbon atoms, and more preferably aryl groups having 6 to 24 carbon atoms, for example, a phenyl group and a naphthyl group); heterocyclic groups (preferably heterocyclic groups having 1 to 32 carbon atoms, and more preferably 1 to 18 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group); silyl groups (preferably silyl groups having 3 to 38 carbon atoms, and more preferably silyl groups having 3 to 18 carbon atoms, for example, a trimethylsilyl group, a triethylsilyl group, a tributylsilyl group, a t-butyldimethylsilyl group, and a t-hexyldimethylsilyl group); a hydroxyl group; a cyano group; a nitro group; alkoxy groups (preferably alkoxy groups having 1 to 48 carbon atoms, and more preferably alkoxy groups having 1 to 24 carbon atoms, for example, a methoxy group, an ethoxy group, a 1-butoxy group, a 2-butoxy group, an isopropoxy group, a t-butoxy group, a dodecyloxy group, and a cycloalkyloxy group (for example, a cyclopentyloxy group and a cyclohexyloxy group)); aryloxy groups (preferably aryloxy groups having 6 to 48 carbon atoms, and more preferably aryloxy groups having 6 to 24 carbon atoms, for example, a phenoxy group and a 1-naphthoxy group); heterocyclic oxy groups (preferably heterocyclic oxy groups having 1 to 32 carbon atoms, and more preferably heterocyclic oxy groups having 1 to 18 carbon atoms, for example, a 1-phenyltetrazol-5-oxy group and a 2-tetrahydropyranyloxy group); silyloxy groups (preferably silyloxy groups having 1 to 32 carbon atoms, and more preferably silyloxy groups having 1 to 18 carbon atoms, for example, a trimethylsilyloxy group, a t-butyldimethylsilyloxy group, and a diphenylmethylsilyloxy group); acyloxy groups (preferably acyloxy groups having 2 to 48 carbon atoms, and more preferably acyloxy groups having 2 to 24 carbon atoms, for example, an acetoxy group, a pivaloyloxy group, a benzoyloxy group, and a dodecanoyloxy group); alkoxycarbonyloxy groups (preferably alkoxycarbonyloxy groups having 2 to 48 carbon atoms, and more preferably alkoxycarbonyloxy groups having 2 to 24 carbon atoms, for example, an ethoxycarbonyloxy group, a t-butoxycarbonyloxy group, and a cycloalkyloxycarbonyloxy group (for example, a cyclohexyloxycarbonyloxy group));

aryloxycarbonyloxy groups (preferably aryloxycarbonyloxy groups having 7 to 32 carbon atoms, and more preferably aryloxycarbonyloxy groups having 7 to 24 carbon atoms, for example, a phenoxycarbonyloxy group); carbamoyloxy groups (preferably carbamoyloxy groups having 1 to 48 carbon atoms, and more preferably carbamoyloxy groups having 1 to 24 carbon atoms, for example, an N,N-dimethylcarbamoyloxy group, an N-butylcarbamoyloxy group, an N-phenylcarbamoyloxy group, and an N-ethyl-N-phenylcarbamoyloxy group); sulfamoyloxy groups (preferably sulfamoyloxy groups having 1 to 32 carbon atoms, and more preferably sulfamoyloxy groups having 1 to 24 carbon atoms, for example, an N,N-diethylsulfamoyloxy group and an N-propylsulfamoyloxy group); alkylsulfonyloxy groups (preferably alkylsulfonyloxy groups having 1 to 38 carbon atoms, and more preferably alkylsulfonyloxy groups having 1 to 24 carbon atoms, for example, a methylsulfonyloxy group, a hexadecylsulfonyloxy group, and a cyclohexylsulfonyloxy group); arylsulfonyloxy groups (preferably arylsulfonyloxy groups having 6 to 32 carbon atoms, and more preferably arylsulfonyloxy groups having 6 to 24 carbon atoms, for example, a phenylsulfonyloxy group); acyl groups (preferably acyl groups having 1 to 48 carbon atoms, and more preferably acyl groups having 1 to 24 carbon atoms, for example, a formyl group, an acetyl group, a pivaloyl group, a benzoyl group, a tetradecanoyl group, and a cyclohexanoyl group); alkoxycarbonyl groups (preferably alkoxycarbonyl groups having 2 to 48 carbon atoms, and more preferably alkoxycarbonyl groups having 2 to 24 carbon atoms, for example, a methoxycarbonyl group, an ethoxycarbonyl group, an octadecyloxycarbonyl group, a cyclohexyloxycarbonyl group, and a 2,6-di-tert-butyl-4-methylcyclohexyloxycarbonyl group); aryloxycarbonyl groups (preferably aryloxycarbonyl groups having 7 to 32 carbon atoms, and more preferably aryloxycarbonyl groups having 7 to 24 carbon atoms, for example, a phenoxycarbonyl group); carbamoyl groups (preferably carbamoyl groups having 1 to 48 carbon atoms, and more preferably carbamoyl groups having 1 to 24 carbon atoms, for example, a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, an N-methyl-N-phenylcarbamoyl group, and an N,N-dicyclohexylcarbamoyl group); amino groups (preferably amino groups having 32 or less carbon atoms, and more preferably amino groups having 24 or less carbon atoms, for example, an amino group, a methylamino group, an N,N-dibutylamino group, a tetradecylamino group, a 2-ethylhexylamino group, and a cyclohexylamino group); anilino groups (preferably anilino groups having 6 to 32 carbon atoms, and more preferably anilino groups having 6 to 24 carbon atoms, for example, an anilino group and an N-methylanilino group);

heterocyclic amino groups (preferably heterocyclic amino groups having 1 to 32 carbon atoms, and more preferably heterocyclic amino groups having 1 to 18 carbon atoms, for example, a 4-pyridylamino group); carbonamido groups (preferably carbonamido groups having 2 to 48 carbon atoms, and more preferably carbonamido groups having 2 to 24 carbon atoms, for example, an acetamido group, a benzamido group, a tetradecaneamido group, a pivaloylamido group, and a cyclohexaneamido group); ureido groups (preferably ureido groups having 1 to 32 carbon atoms, and more preferably ureido groups having 1 to 24 carbon atoms, for example, an ureido group, an N,N-dimethylureido group, and an N-phenylureido group); imido groups (preferably imido groups having 36 or less carbon atoms, and more preferably imido groups having 24 or less carbon atoms, for example, an N-succinimido group and an N-phthalimido group); alkoxycarbonylamino groups (preferably alkoxycarbonylamino groups having 2 to 48 carbon atoms, and more preferably alkoxycarbonylamino groups having 2 to 24 carbon atoms, for example, a methoxycarbonylamino group, an ethoxycarbonylamino group, a t-butoxycarbonylamino group, an octadecyloxycarbonylamino group, and a cyclohexyloxycarbonylamino group); aryloxycarbonylamino groups (preferably aryloxycarbonylamino groups having 7 to 32 carbon atoms, and more preferably aryloxycarbonylamino groups having 7 to 24 carbon atoms, for example, a phenoxycarbonylamino group); sulfonamido groups (preferably sulfonamido groups having 1 to 48 carbon atoms, and more preferably sulfonamido groups having 1 to 24 carbon atoms, for example, a methanesulfonamido group, a butanesulfonamido group, a benzenesulfonamido group, a hexadecanesulfonamido group, and a cyclohexanesulfonamido group); sulfamoylamino groups (preferably sulfamoylamino groups having 1 to 48 carbon atoms, and more preferably a sulfamoylamino groups having 1 to 24 carbon atoms, for example, an N,N-dipropylsulfamoylamino group and an N-ethyl-N-dodecylsulfamoylamino group); azo groups (preferably azo groups having 1 to 32 carbon atoms, and more preferably azo groups having 1 to 24 carbon atoms, for example, a phenylazo group and a 3-pyrazolylazo group); alkylthio groups (preferably alkylthio groups having 1 to 48 carbon atoms, and more preferably alkylthio groups having 1 to 24 carbon atoms, for example, a methylthio group, an ethylthio group, an octylthio group, and a cyclohexylthio group); arylthio groups (preferably arylthio groups having 6 to 48 carbon atoms, and more preferably arylthio groups having 6 to 24 carbon atoms, for example, a phenylthio group); heterocyclic thio groups (preferably heterocyclic thio groups having 1 to 32 carbon atoms, and more preferably heterocyclic thio groups having 1 to 18 carbon atoms, for example, a 2-benzothiazolylthio group, a 2-pyridylthio group, and a 1-phenyltetrazolylthio group); alkylsulfinyl groups (preferably alkylsulfinyl groups having 1 to 32 carbon atoms, and more preferably alkylsulfinyl groups having 1 to 24 carbon atoms, for example, a dodecanesulfinyl group);

arylsulfinyl groups (preferably arylsulfinyl groups having 6 to 32 carbon atoms, and more preferably arylsulfinyl groups having 6 to 24 carbon atoms, for example, a phenylsulfinyl group); alkylsulfonyl groups (preferably alkylsulfonyl groups having 1 to 48 carbon atoms, and more preferably alkylsulfonyl groups having 1 to 24 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group); arylsulfonyl groups (preferably arylsulfonyl groups having 6 to 48 carbon atoms, and more preferably arylsulfonyl groups having 6 to 24 carbon atoms, for example, a phenylsulfonyl group and a 1-naphthylsulfonyl group); sulfamoyl groups (preferably sulfamoyl groups having 32 or less carbon atoms, and more preferably sulfamoyl groups having 24 or less carbon atoms, for example, a sulfamoyl group, an N,N-dipropylsulfamoyl group, an N-ethyl-N-dodecylsulfamoyl group, an N-ethyl-N-phenylsulfamoyl group, and an N-cyclohexylsulfamoyl group); a sulfo group; phosphonyl groups (preferably phosphonyl groups having 1 to 32 carbon atoms, and more preferably phosphonyl groups having 1 to 24 carbon atoms, for example, a phenoxyphosphonyl group, an octyloxyphosphonyl group, and a phenylphosphonyl group); and phosphinoylamino groups (preferably phosphinoylamino groups having 1 to 32 carbon atoms, and more preferably phosphinoylamino groups having 1 to 24 carbon atoms, for example, a diethoxyphosphinoylamino group and a dioctyloxyphosphinoylamino group).

When the monovalent substituent represented by $R^2$ to $R^5$ in formula (I) is a group that may be further substituted, it may further has a substituent described for $R^2$ to $R^5$. In a case in which the monovalent substituent represented by $R^2$ to $R^5$ has two or more monovalent substituents, these substituents may be the same as or different from each other.

In formula (I), $R^2$ and $R^3$ may be bonded to each other to form a 5-, 6-, or 7-membered saturated or unsaturated ring, and $R^4$ and $R^5$ may be bonded to each other to form a 5-, 6-, or 7-membered saturated or unsaturated ring.

Examples of the 5-, 6-, or 7-membered saturated or unsaturated ring formed by $R^2$ and $R^3$, or $R^4$ and $R^5$ include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

In a case in which the 5-, 6-, or 7-membered ring formed by $R^2$ and $R^3$ or/and $R^4$ and $R^5$ in formula (I) is a group that may be further substituted, it may further has a monovalent substituent described for $R^2$ to $R^5$, and in a case in which the 5-, 6-, or 7-membered ring has two or more monovalent substituents, these monovalent substituents may be the same as or different from each other.

In formula (I), as $R^2$ and $R^5$, among the above groups, an alkoxycarbonyl group, an aryloxycarbonyl group, a carbamoyl group, an alkylsulfonyl group, an arylsulfonyl group, a cyano group, an imido group, or a carbamoylsulfonyl group is preferable; an alkoxycarbonyl group, an aryloxycarbonyl group, a carbamoyl group, an alkylsulfonyl group, a cyano group, an imide group, or a carbamoylsulfonyl group is more preferable; an alkoxycarbonyl group, an aryloxycarbonyl group, a carbamoyl group, a cyano group, an imido group or a carbamoylsulfonyl group is even more preferable; and an alkoxycarbonyl group, an aryloxycarbonyl group, or a carbamoyl group is particularly preferable.

In formula (I), as $R^3$ and $R^4$, among the above groups, an alkyl group, an aryl group, or a heterocyclic group is preferable, and an alkyl group or an aryl group is more preferable.

Each of the groups represented by the above preferable embodiments may be unsubstituted or may have the above-described substituent.

In formula (I), in a case in which $R^3$ and $R^4$ represent an alkyl group, examples of the alkyl group preferably include a linear, branched or cyclic alkyl group having 1 to 12 carbon atoms, and more specifically, for example, a methyl group, an ethyl group, an n-propyl group, an isopropyl group, a cyclopropyl group, an n-butyl group, an i-butyl group, a t-butyl group, a cyclobutyl group, a cyclopentyl group, a cyclohexyl group, or a benzyl group, more preferably a branched or cyclic alkyl group having 1 to 12 carbon atoms, more specifically, for example, an isopropyl group, a cyclopropyl group, an i-butyl group, a t-butyl group, a cyclobutyl group, a cyclopentyl group, or a cyclohexyl group, even more preferably a secondary or tertiary alkyl group having 1 to 12 carbon atoms, more specifically, for example, an isopropyl group, a cyclopropyl group, an i-butyl group, a t-butyl group, a cyclobutyl group, or a cyclohexyl group.

Each alkyl group shown in the preferable embodiments above may be unsubstituted or may have the above-described substituent.

In formula (I), in a case in which $R^3$ and $R^4$ each represent an aryl group, examples of the aryl group preferably include a substituted or unsubstituted phenyl group and a substituted or unsubstituted naphthyl group, and more preferably a substituted or unsubstituted phenyl group.

In formula (I), in a case in which $R^3$ and $R^4$ represent an aryl group, examples of the aryl group preferably include a phenyl group and a naphthyl group, and more preferably a phenyl group.

Each of the aryl groups shown in the preferable embodiments above may be unsubstituted or may have the above-described substituent.

In a case in which $R^3$ and $R^4$ represent a heterocyclic group, examples of the heterocyclic group preferably include a 2-thienyl group, a 4-pyridyl group, a 3-pyridyl group, a 2-pyridyl group, a 2-furyl group, a 2-pyrimidinyl group, a 2-benzothiazolyl group, a 1-imidazolyl group, a 1-pyrazolyl group, and a benzotriazol-1-yl group, and more preferably a 2-thienyl group, a 4-pyridyl group, a 2-furyl group, a 2-pyrimidinyl group, and a 1-imidazolyl group.

Each of the heterocyclic groups shown in the preferable embodiments above may be unsubstituted or may have the above-described substituent.

In formula (I), $R^7$ represents a hydrogen atom, a halogen atom, an alkyl group, an aryl group, or a heterocyclic group.

In a case in which $R^7$ is a halogen atom, an alkyl group, an aryl group, or a heterocyclic group, $R^7$ represents the same group as the halogen atom, the alkyl group, the aryl group or the heterocyclic group described above as the substituent represented by $R^2$ to $R^5$, and its preferable definition is also the same.

In a case in which the alkyl group, the aryl group, or the heterocyclic group represented by $R^7$ is a group that may be further substituted in formula (I), it may be substituted with the substituent described as a monovalent substituent represented by $R^2$ to $R^5$ above. In a case in which the alkyl group, the aryl group, or the heterocyclic group represented by $R^7$ is substituted with two or more substituents, these substituents may be the same as or different from each other.

In formula (I), Ma represents a metal or a metal compound.

Ma may be any metal atom or metal compound as long as it is capable of forming a complex, and examples thereof include a divalent metal atom, a divalent metal oxide, a divalent metal hydroxide, and a divalent metal chloride.

Examples of the metal represented by Ma include Zn, Mg, Si, Sn, Rh, Pt, Pd, Mo, Mn, Pb, Cu, Ni, Co, Fe, and B.

Examples of the metal compound represented by Ma include metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, Fe, Zn, Mg, Si, Pt, Pd, Mo, Mn, Cu, Ni, Co, TiO, B, or VO is preferable, Fe, Zn, Mg, Si, Pt, Pd, Cu, Ni, Co, B, or VO is more preferable, and Fe, Zn, Cu, Co, or VO (V=O) is most preferable, from the viewpoints of stability, spectral properties, heat resistance, light resistance, production suitability, and the like of the complex. Among these, as Ma, Zn is particularly preferable.

In formula (I), $R^8$ and $R^9$ each independently represent an alkyl group (preferably a linear, branched, or cyclic alkyl group having 1 to 36 carbon atoms, and more preferably a linear, branched, or cyclic alkyl group having 1 to 12 carbon atoms, for example, a methyl group, an ethyl group, a propyl group, an isopropyl group, a butyl group, an isobutyl group, a t-butyl group, a 1,1-dimethylpropyl group, a hexyl group, an octyl group, a 2-ethylhexyl group, a dodecyl group, a cyclopropyl group, a cyclopentyl group, a cyclohexyl group, and a 1-adamantyl group), an alkenyl group (preferably an alkenyl group having 2 to 24 carbon atoms, and more preferably an alkenyl group having 2 to 12 carbon atoms, for example, a vinyl group, an allyl group, and a 3-buten-1-yl group), an aryl group (preferably an aryl group having 6 to 36 carbon atoms, and more preferably an aryl group having 6 to 18 carbon atoms, for example, a phenyl group, a naphthyl group, and a tolyl group), a heterocyclic group (preferably a heterocyclic group having 1 to 24 carbon atoms, and more preferably a heterocyclic group having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group), an alkoxy group (preferably an alkoxy group having 1 to 36 carbon atoms, and more preferably an alkoxy group having 1 to 18 carbon atoms, for example, a methoxy group, an ethoxy group, a propyloxy group, a butoxy group, a hexyloxy group, a 2-ethylhexyloxy group, a dodecyloxy group, and a cyclohexyloxy group), an aryloxy group (preferably an aryloxy group having 6 to 24 carbon atoms, and more preferably an aryloxy group having 1 to 18 carbon atoms, for example, a phenoxy group and a naphthyloxy group), an alkylamino group (preferably an alkylamino group having 1 to 36 carbon atoms, and more preferably an alkylamino group having 1 to 18 carbon atoms, for example, a methylamino group, an ethylamino group, a propylamino group, a butylamino group, a hexylamino group, a 2-ethylhexylamino group, an isopropylamino group, a t-butylamino group, a t-octylamino group, a cyclohexylamino group, an N,N-diethylamino group, an N,N-dipropylamino group, an N,N-dibutylamino group, and an N-methyl-N-ethylamino group), an arylamino group (preferably an arylamino group having 6 to 36 carbon atoms, and more preferably an arylamino group having 6 to 18 carbon atoms, for example, a phenylamino group, a naphthylamino group, an N,N-diphenylamino group, and an N-ethyl-N-phenylamino group), or a heterocyclic amino group (preferably a heterocyclic amino group having 1 to 24 carbon atoms, and more preferably a heterocyclic amino group having 1 to 12 carbon atoms, for example, a 2-aminopyrrole group, a 3-aminopyrazole group, a 2-aminopyridine group, and a 3-aminopyridine group).

In formula (I), in a case in which the alkyl group, alkenyl group, aryl group, heterocyclic group, alkoxy group, aryloxy group, alkylamino group, arylamino group, or heterocyclic amino group represented by $R^8$ or $R^9$ is a group that may be further substituted, the group may be substituted with the monovalent substituent described above for $R^2$ to $R^5$. When the group is substituted with two or more monovalent substituents, these substituents may be the same as or different from each other.

In formula (I), $X^3$ and $X^4$ each independently represent NR, a nitrogen atom, an oxygen atom, or a sulfur atom.

R represents a hydrogen atom, an alkyl group (preferably a linear, branched, or cyclic alkyl group having 1 to 36 carbon atoms, and more preferably a linear, branched, or cyclic alkyl group having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, and a 1-adamantyl group), an alkenyl group (preferably an alkenyl group having 2 to 24 carbon atoms, and more preferably an alkenyl group having 2 to 12 carbon atoms, for example, a vinyl group, an allyl group, and a 3-buten-1-yl group), an aryl group (preferably an aryl group having 6 to 36 carbon atoms, and more preferably an aryl group having 6 to 18 carbon atoms, for example, a phenyl group and a naphthyl group), a heterocyclic group (preferably a heterocyclic group having 1 to 24 carbon atoms, and more preferably a heterocyclic group having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group), an acyl group (an acyl group preferably having 1 to 24 carbon atoms, and more preferably an acyl group having 2 to 18 carbon atoms, for example, an acetyl group, a pivaloyl group, a 2-ethylhexyl group, a benzoyl group, and a cyclohexanoyl group), an alkylsulfonyl group (preferably an alkylsulfonyl group having 1 to 24 carbon atoms, and more preferably an alkylsulfonyl group having 1 to 18 carbon atoms, for example, a methylsulfonyl group, an ethylsulfonyl group, an isopropylsulfonyl group, and a cyclohexylsulfonyl group), or an arylsulfonyl group (an arylsulfonyl group preferably having 6 to 24 carbon atoms, and more preferably an arylsulfonyl group having 6 to 18 carbon atoms, for example, a phenylsulfonyl group and a naphthylsulfonyl group).

In a case in which the alkyl group, alkenyl group, aryl group, heterocyclic group, acyl group, alkylsulfonyl group, or arylsulfonyl group represented by R may be further substituted, the group may be substituted with the monovalent substituent described above for $R^2$ to $R^5$. When the group is substituted with plural monovalent substituents, these substituents may be the same as or different from each other.

$X^3$ and $X^4$ are each independently preferably an oxygen atom or a sulfur atom, and $X^3$ and $X^4$ are particularly preferably all oxygen atoms.

In formula (I), $Y^1$ and $Y^2$ each independently represent $NR_c$, a nitrogen atom, or a carbon atom. $R_c$ has the same definition as R in NR represented by $X^3$ or $X^4$.

$Y^1$ and $Y^2$ are each independently preferably $NR_c$ ($R_c$ is preferably a hydrogen atom, or an alkyl group having 1 to 8 carbon atoms), and $Y^1$ and $Y^2$ are particularly preferably all NH.

In formula (I), $R^8$ and $Y^1$ may be bonded to each other to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, and a quinazoline ring), or a 7-membered ring (for example, a cycloheptane ring or a hexamethyleneimine ring), together with the carbon atom to which $R^8$ and $Y^1$ are bonded.

In formula (I), $R^9$ and $Y^2$ may be bonded to each other to form a 5-, 6-, or 7-membered ring, together with the carbon atom. Examples of the 5-, 6-, or 7-membered ring thus formed include the same rings as the above rings formed by $R^8$, $Y^1$, and the carbon atom.

In formula (I), in a case in which the 5-, 6-, or 7-membered ring formed by bonding of $R^8$ and $Y^1$, or $R^9$ and $Y^2$ is a ring that may be further substituted, the ring may be substituted with the monovalent substituent described above for $R^2$ to $R^5$. In a case in which the ring is substituted with two or more substituents, these monovalent substituents may be the same as or different from each other.

In formula (I), Z represents an atomic group that forms a structure represented by the following formula (II) or (III), together with the adjacent nitrogen atom.

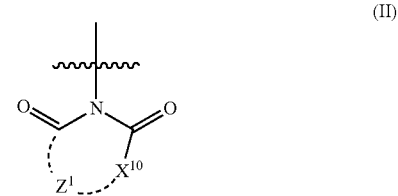

(II)

In formula (II), $X^{10}$ represents $NR^{15}$, an oxygen atom, or a sulfur atom.

$R^{15}$ represents a hydrogen atom, an alkyl group (a linear, branched, or cyclic alkyl group preferably having 1 to 36 carbon atoms, and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms, and more preferably having 2 to 12 carbon atoms, for example, a vinyl group, an allyl group, or a 3-buten-1-yl group), an aryl group (an aryl group preferably having 6 to 36 carbon atoms, and more preferably having 6 to 18 carbon atoms, for example, a phenyl group or a naphthyl group), a heterocyclic group (a heterocyclic group preferably having 1 to 24 carbon atoms, and more preferably a heterocyclic group having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, or a benzotriazol-1-yl group), an acyl group (an acyl group preferably having 1 to 24 carbon atoms, and more preferably having 2 to 18 carbon atoms, for example, an acetyl group, a pivaloyl group, a 2-ethylhexyl group, a benzoyl group, or a cyclohexanoyl group), an alkylsulfonyl group (preferably an alkylsulfonyl group having 1 to 24 carbon atoms, and more preferably having 1 to 18 carbon atoms, for example, a methylsulfonyl group, an ethylsulfonyl group, an isopropylsulfonyl group, or a cyclohexylsulfonyl group), or an arylsulfonyl group (an arylsulfonyl group preferably having 6 to 24 carbon atoms, and more preferably an arylsulfonyl group having 6 to 18 carbon atoms, for example, a phenylsulfonyl group or a naphthylsulfonyl group).

The alkyl group, alkenyl group, aryl group, heterocyclic group, acyl group, alkylsulfonyl group, or arylsulfonyl group represented by $R^{15}$ may be further substituted with the monovalent substituent described above for $R^2$ to $R^5$. When the group is substituted with plural monovalent substituents, these substituents may be the same as or different from each other.

$X^{10}$ is preferably $NR^{15}$ ($R^{15}$ is preferably a hydrogen atom, an alkyl group, or an aryl group), or an oxygen atom.

$Z^1$ represents an atomic group that includes a chain structure containing zero or one nitrogen atom and a carbon atom and connects the adjacent carbonyl carbon and $X^{10}$ by the chain structure to form a 5- or 6-membered ring. The chain structure in $Z^1$ may further have a substituent. Examples of the substituent include a hydrogen atom, an amino group, an alkyl group, an aryl group, a halogen atom, and a keto oxygen (a structure shown below).

Specific examples of the structure represented by formula (II) are shown below, but the present invention is not limited thereto.

H-1

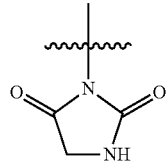

H-2

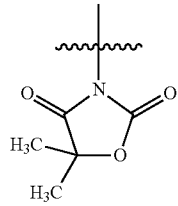

H-3

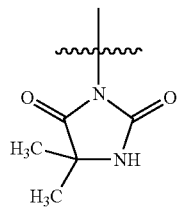

H-4

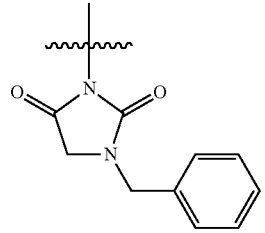

H-5

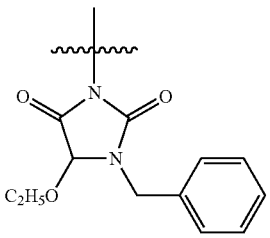

H-6

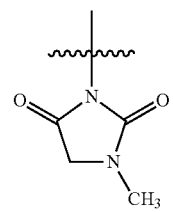

H-7

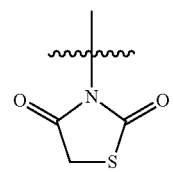

H-8

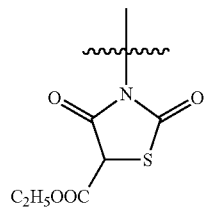

H-9

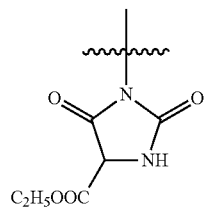

H-10

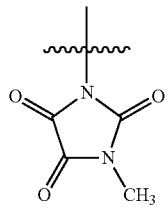

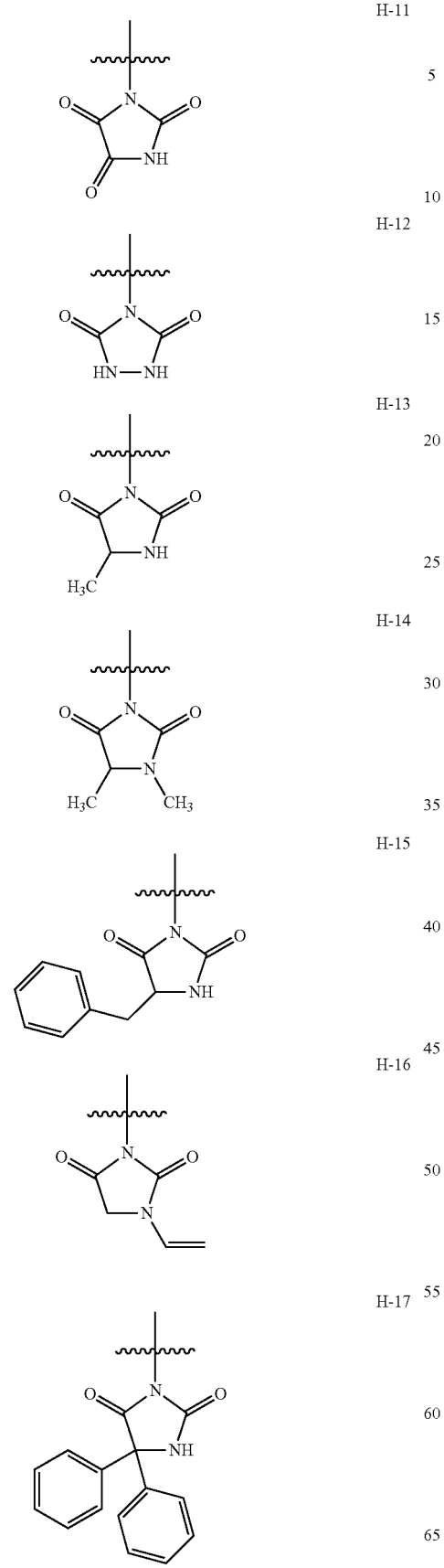
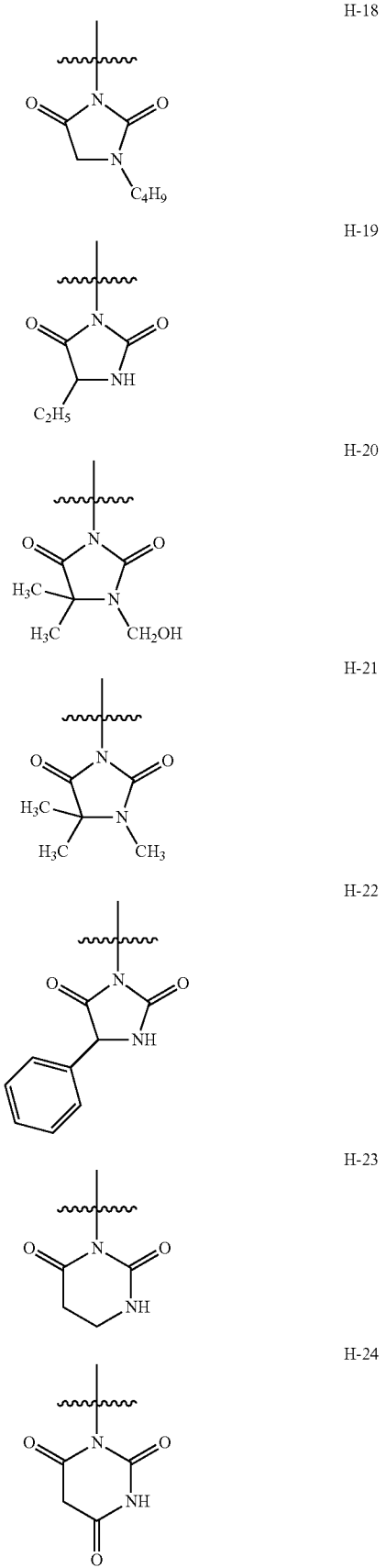

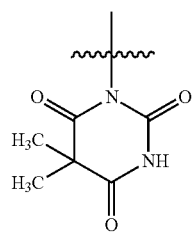
H-25

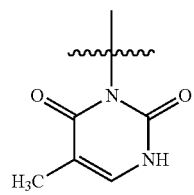
H-26

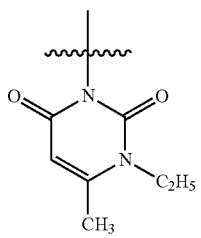
H-27

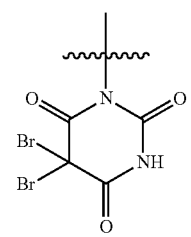
H-28

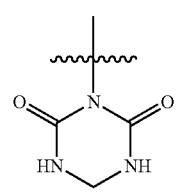
H-29

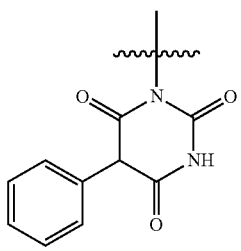
H-30

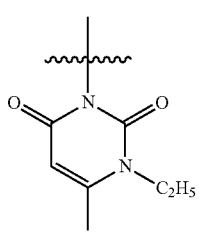
H-31

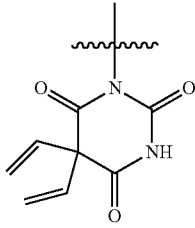
H-32

Among those specific examples, H-1 to H-9, H-14, H-16, H-17, H-18, H-20, H-21, H-23, H-24, H-25, H-27, and H-32 are more preferable, and H-1, H-2, H-4, H-5, H-6, H-8, H-17, H-18, H-23, and H-24 are even more preferable, from the viewpoints of synthesis suitability, heat resistance, and solubility.

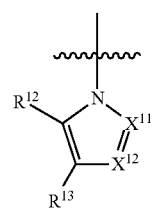

(III)

In formula (III), $X^{11}$ and $X^{12}$ each independently represent a nitrogen atom or $CR^{16}$ ($R^{16}$ represents a hydrogen atom or a substituent), and $R^{12}$ and $R^{13}$ each independently represent a hydrogen atom or a monovalent substituent.

$R^{16}$ represents a hydrogen atom, or monovalent substituent, and the monovalent substituent has the same definition as the monovalent substituent described above for $R^2$ to $R^5$.

Among the monovalent substituents represented by $R^{16}$, an alkyl group, an aryl group, or a heterocyclic group is preferable, and an alkyl group or an aryl group is even more preferable.

Each of the groups represented by the preferable embodiments above may be unsubstituted or may have the substituent described above.

$R^{12}$ and $R^{13}$ each independently represent a hydrogen atom or a monovalent substituent, and the monovalent substituent has the same definition as the monovalent substituent described above for $R^2$ to $R^5$.

Among the monovalent substituents represented by $R^{12}$ or $R^{13}$, an alkyl group, an aryl group, or a heterocyclic group is preferable, and an alkyl group or an aryl group is even more preferable.

Each of the groups represented by the preferable embodiments above may be unsubstituted or may have the substituent described above.

In formula (III), $R^{12}$ and $R^{13}$ may be bonded to each other to form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, and a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, pyridazine ring, a quinoline ring, and a quinazoline ring), or a 7-membered ring (for example, a cycloheptane ring and a hexamethyleneimine ring), together with the carbon atoms to which $R^{12}$ and $R^{13}$ are bonded.

In formula (III), when $R^{12}$, $R^{13}$, or $R^{16}$ represents an alkyl group, the alkyl group is preferably a linear, branched, or cyclic alkyl group having 1 to 12 carbon atoms, and more specifically, for example, a methyl group, an ethyl group, an n-propyl group, an isopropyl group, a cyclopropyl group, an n-butyl group, an i-butyl group, a t-butyl group, a cyclobutyl group, a cyclopentyl group, a cyclohexyl group, or a benzyl group; more preferably a branched or cyclic alkyl group having 1 to 12 carbon atoms, and more specifically, for example, an isopropyl group, a cyclopropyl group, an i-butyl group, a t-butyl group, a cyclobutyl group, a cyclopentyl group, or a cyclohexyl group; and even more preferably a secondary or tertiary alkyl group having 1 to 12 carbon atoms, and more specifically, for example, an isopropyl group, a cyclopropyl group, an i-butyl group, a t-butyl group, a cyclobutyl group, or a cyclohexyl group.

Each of the alkyl groups represented by the preferable embodiments above may be unsubstituted or may have the substituent described above.

In formula (III), in a case in which $R^{12}$, $R^{13}$ or $R^{16}$ represents an aryl group, examples of the aryl group preferably include a phenyl group and a naphthyl group, and more preferably a phenyl group.

Each of the aryl groups represented by the preferable embodiments above may be unsubstituted or may have the substituent described above.

Specific examples of the structure represented by formula (III) are shown below, but the present invention is not limited thereto.

J-1

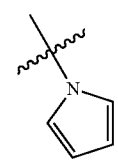

J-2

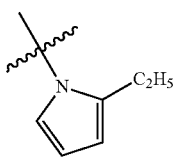

J-3

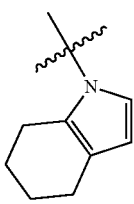

J-4

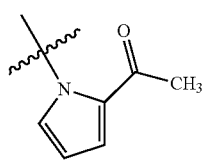

J-5

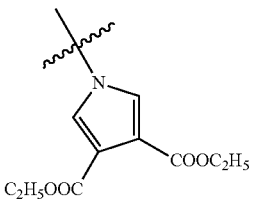

J-6

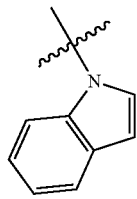

J-7

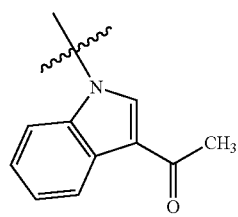

J-8

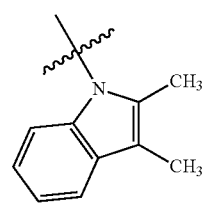

J-9

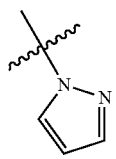

J-10

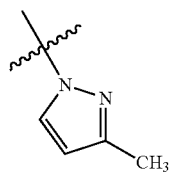

J-11

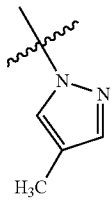

J-12

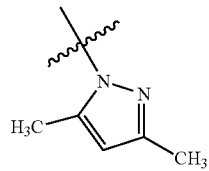

J-13 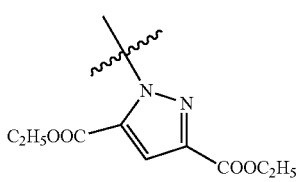

J-14 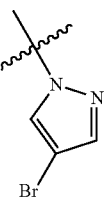

J-15 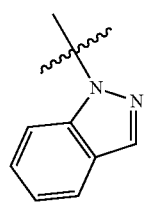

J-16 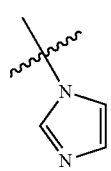

J-17 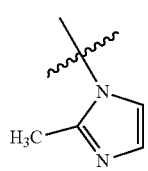

J-18 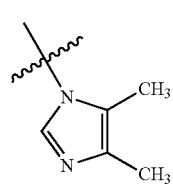

J-19 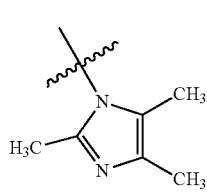

J-20 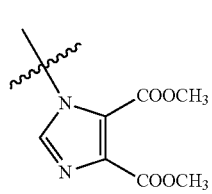

J-21 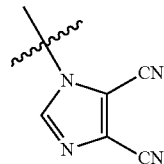

J-22 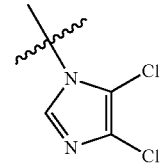

J-23 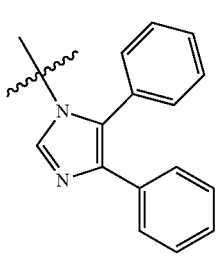

J-24 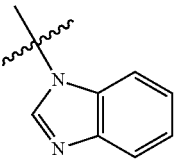

J-25 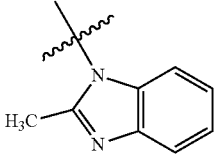

J-26 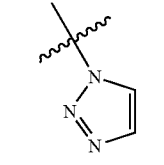

J-27 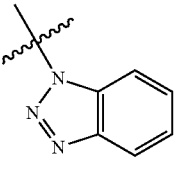

Among the specific examples above, J-1, J-2, J-4, J-6, J-9, J-12, J-13, J-16, J-18, J-20, J-21, and J-24 are more preferable, and J-1, J-2, J-6, J-9, J-13, J-16, J-18, J-20, J-21, and J-24 are even more preferable, from the viewpoints of synthesis suitability, heat resistance, and solubility.

The compound represented by formula (I) may be a tautomer. The tautomer in the present invention may be any compound having a structure that may be formed by movement of one hydrogen atom in the molecule, and may be any one of the structures of the formulae (a) through (f), for example.

Furthermore, $R^2$, $R^3$, $R^4$, $R^5$, $R^7$, $R^8$, $R^9$, $X^3$, $X^4$, $Y^1$, $Y^2$, and Ma in the formulae (a) through (f) correspond to $R^2$, $R^3$, $R^4$, $R^5$, $R^7$, $R^8$, $R^9$, $X^3$, $X^4$, $Y^1$, $Y^2$, and Ma in formula (I). Further, $X_1$ in the formulae (a) through (f) generally represents the structure represented by formula (II) or (III) in formula (I).

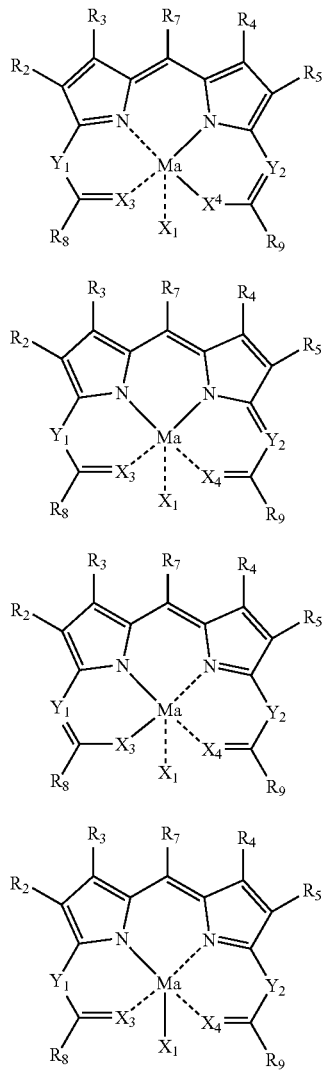

Formula (a)

Formula (b)

Formula (c)

Formula (d)

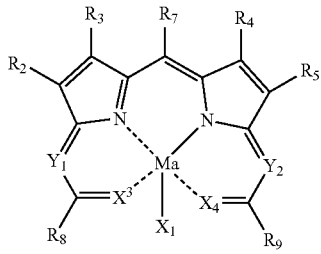

Formula (e)

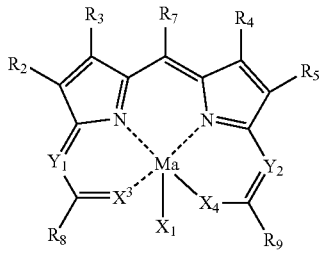

Formula (f)

The molar absorption coefficient of the specific metal complex compound is preferably as high as possible from the viewpoint of a decrease in the film thickness when a colored film is formed with a colored composition including the compound.

Furthermore, the maximum absorption wavelength λmax of the specific metal complex compound is preferably from 520 nm to 580 nm, and more preferably from 530 nm to 570 nm, from the viewpoint of improvement of color purity.

Furthermore, the maximum absorption wavelength and the molar absorption coefficient are measured by means of a spectrophotometer UV-2400 PC (manufactured by Shimadzu Corporation).

Exemplary compounds of the specific metal complex compound are shown below, but the present invention is not limited thereto.

Furthermore, in the exemplary compounds A-1 to A-112, the symbols shown in the section of "X" correspond to the symbols attached to the structures described above as the specific examples of the structures represented by formula (II) or (III).

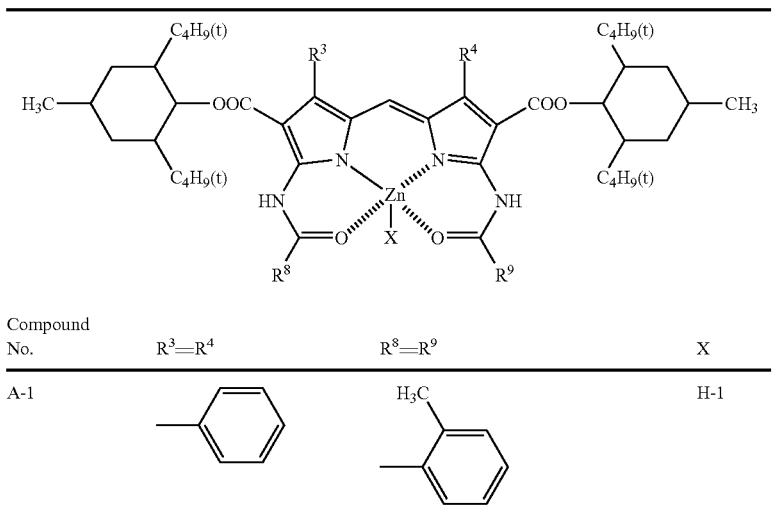

| Compound No. | $R^3=R^4$ | $R^8=R^9$ | X |
|---|---|---|---|
| A-1 | ![phenyl] | ![o-tolyl] | H-1 |

-continued
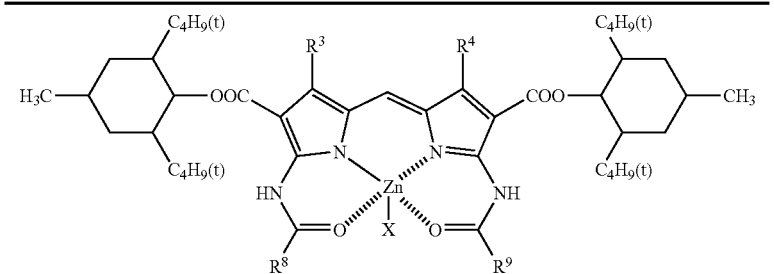
| Compound No. | R³=R⁴ | R⁸=R⁹ | X |
|---|---|---|---|
| A-2 | phenyl | o-tolyl (H₃C) | H-2 |
| A-3 | phenyl | o-tolyl (H₃C) | H-5 |
| A-4 | phenyl | o-tolyl (H₃C) | H-23 |
| A-5 | phenyl | o-tolyl (H₃C) | H-24 |
| A-6 | phenyl | o-tolyl (H₃C) | J-2 |
| A-7 | phenyl | o-tolyl (H₃C) | J-6 |
| A-8 | phenyl | o-tolyl (H₃C) | J-13 |
| A-9 | phenyl | o-tolyl (H₃C) | J-20 |
| A-10 | phenyl | o-tolyl (H₃C) | J-21 |

-continued
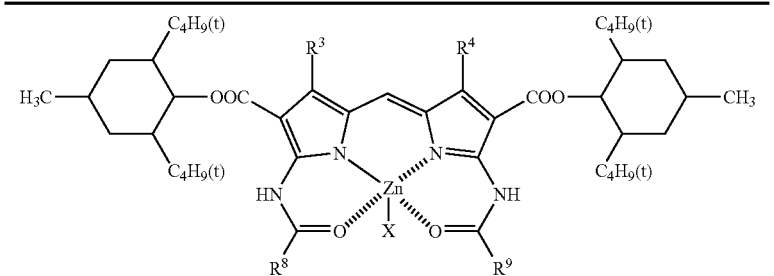
| Compound No. | $R^3=R^4$ | $R^8=R^9$ | X |
|---|---|---|---|
| A-11 | 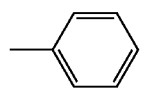 | 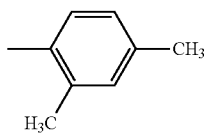 | H-2 |
| A-12 | 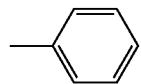 | 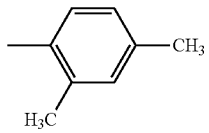 | H-5 |
| A-13 | 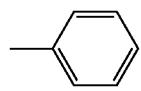 | 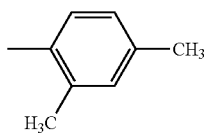 | H-24 |
| A-14 | 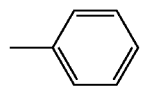 | 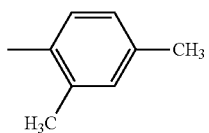 | J-4 |
| A-15 | 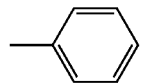 | 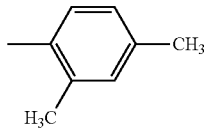 | J-21 |
| A-16 | 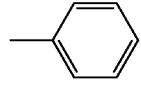 | 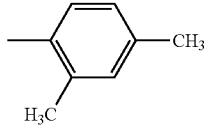 | J-24 |
| A-17 | 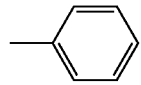 | 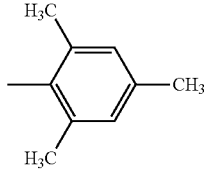 | H-3 |
| A-18 | 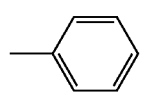 | 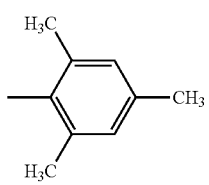 | H-5 |

-continued
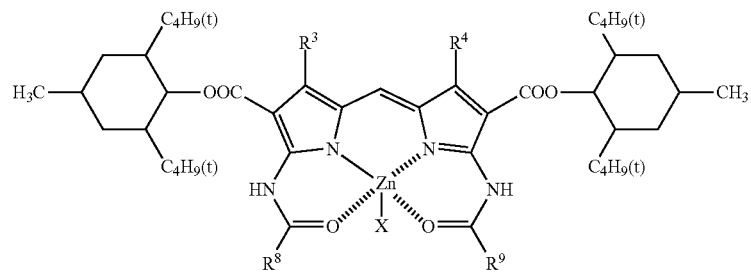
| Compound No. | $R^3 = R^4$ | $R^8 = R^9$ | X |
|---|---|---|---|
| A-19 | 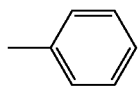 | 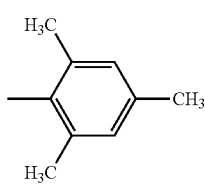 | J-1 |
| A-20 | 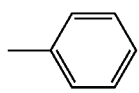 | 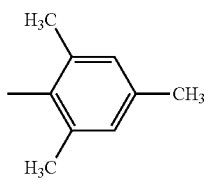 | J-20 |
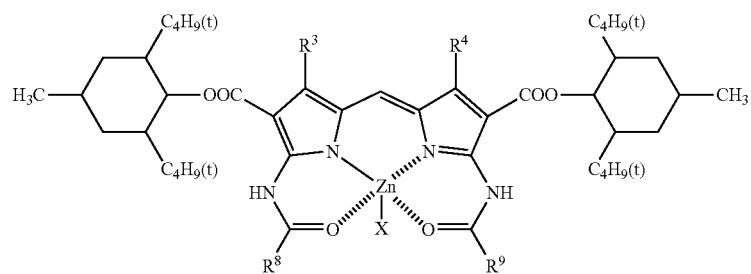
| Compound No. | $R^3 = R^4$ | $R^8 = R^9$ | X |
|---|---|---|---|
| A-21 | 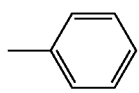 | 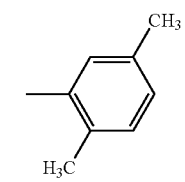 | H-4 |
| A-22 | 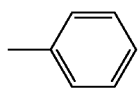 | 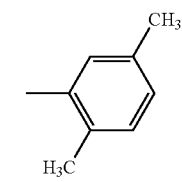 | H-25 |

-continued
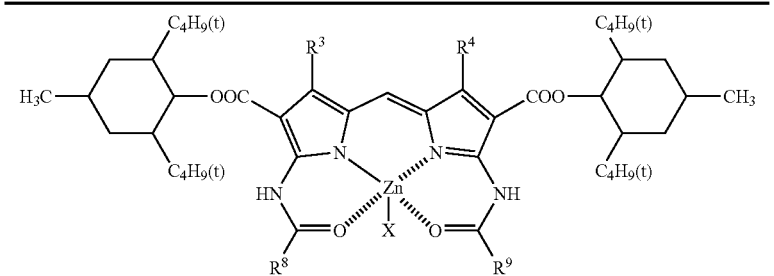
| Compound No. | R³=R⁴ | R⁸=R⁹ | X |
|---|---|---|---|
| A-23 | phenyl | 2,5-dimethylphenyl | J-5 |
| A-24 | phenyl | 2,5-dimethylphenyl | J-18 |
| A-25 | phenyl | 2,3-dimethylphenyl | H-6 |
| A-26 | phenyl | 2,3-dimethylphenyl | H-31 |
| A-27 | phenyl | 2,3-dimethylphenyl | J-8 |
| A-28 | phenyl | 2,3-dimethylphenyl | J-16 |
| A-29 | phenyl | phenyl | H-7 |
| A-30 | phenyl | phenyl | H-14 |
| A-31 | phenyl | phenyl | J-9 |

-continued
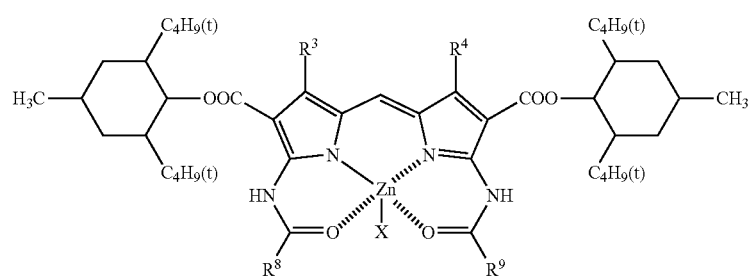
| Compound No. | $R^3=R^4$ | $R^8=R^9$ | X |
|---|---|---|---|
| A-32 | phenyl | phenyl | J-22 |
| A-33 | phenyl | m-tolyl | H-9 |
| A-34 | phenyl | m-tolyl | H-18 |
| A-35 | phenyl | m-tolyl | J-15 |
| A-36 | phenyl | m-tolyl | J-25 |
| A-37 | phenyl | —C$_4$H$_9$(t) | H-16 |
| A-38 | phenyl | —C$_4$H$_9$(t) | H-17 |
| A-39 | phenyl | —C$_4$H$_9$(t) | J-10 |
| A-40 | phenyl | —C$_4$H$_9$(t) | J-17 |

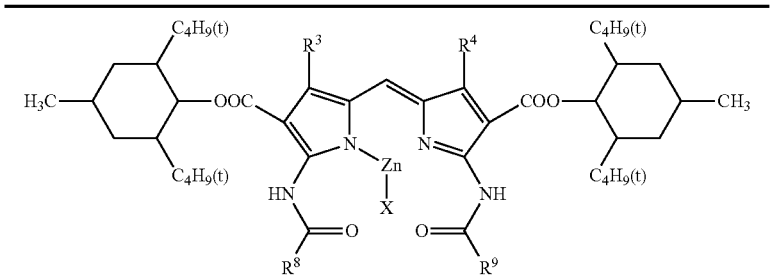
| Compound No. | R³=R⁴ | R⁸=R⁹ | X |
|---|---|---|---|
| A-41 | 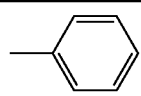 | 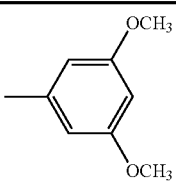 | H-10 |
| A-42 | 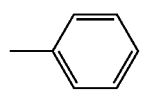 | 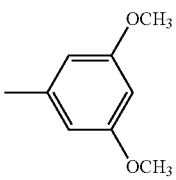 | H-29 |
| A-43 | 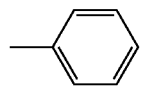 | 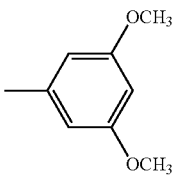 | J-3 |
| A-44 | 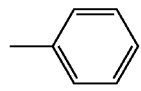 | 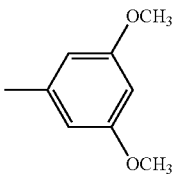 | J-19 |
| A-45 | 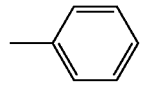 | 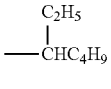 | H-12 |
| A-46 | 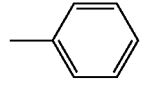 | 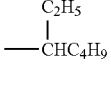 | H-20 |
| A-47 | 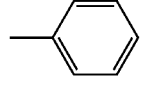 | 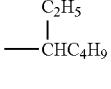 | J-23 |
| A-48 | 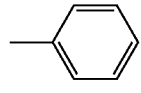 | 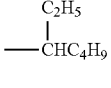 | J-26 |
| A-49 | 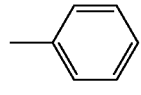 | 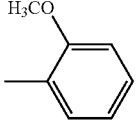 | H-30 |

-continued
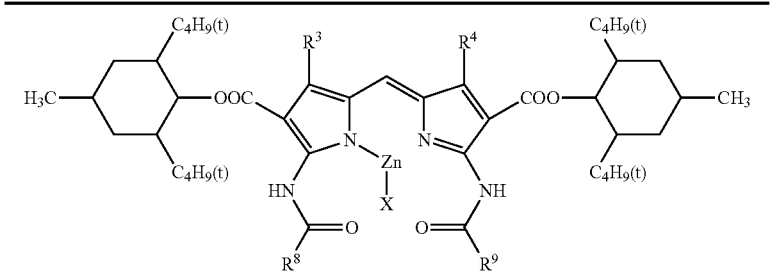
| Compound No. | $R^3=R^4$ | $R^8=R^9$ | X |
|---|---|---|---|
| A-50 | 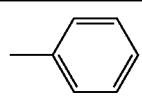 | 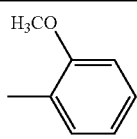 | H-32 |
| A-51 | 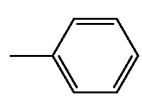 | 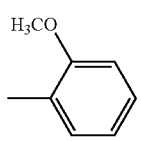 | J-7 |
| A-52 | 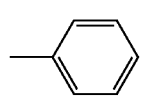 | 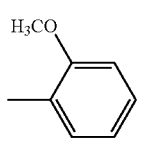 | J-27 |
| A-53 | 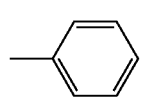 | 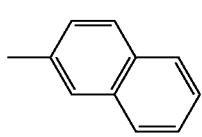 | H-2 |
| A-54 | 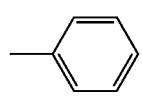 | 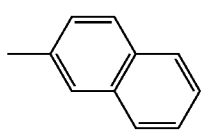 | H-27 |
| A-55 | 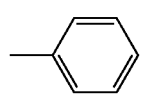 | 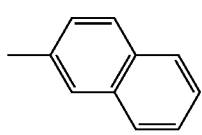 | J-11 |
| A-56 | 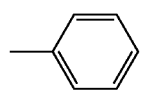 | 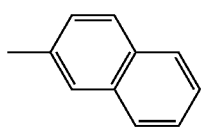 | J-12 |
| A-57 | 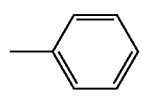 | 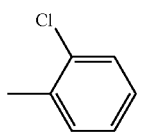 | H-5 |
| A-58 | 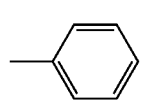 | 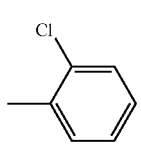 | H-8 |

-continued
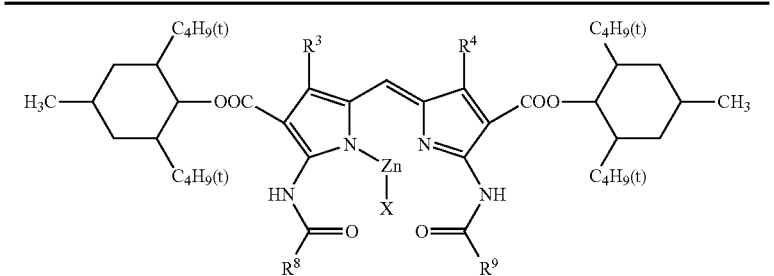
| Compound No. | R³=R⁴ | R⁸=R⁹ | X |
|---|---|---|---|
| A-59 | 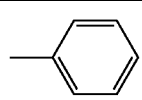 | 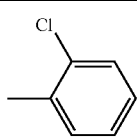 | J-6 |
| A-60 | 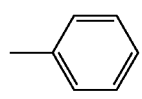 | 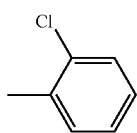 | J-14 |
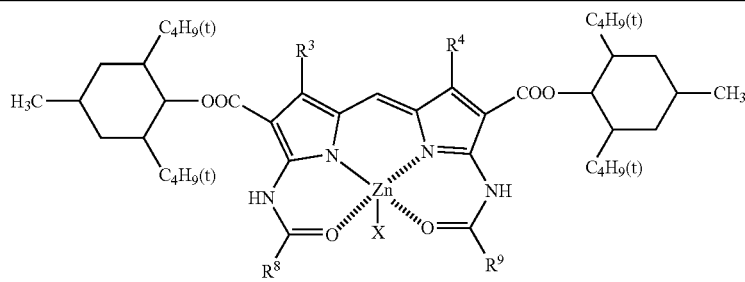
| Compound No. | R³=R⁴ | R⁸=R⁹ | X |
|---|---|---|---|
| A-61 | 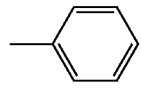 | 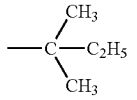 | H-24 |
| A-62 | 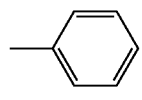 | 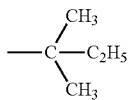 | H-28 |
| A-63 | 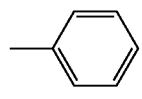 | 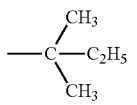 | J-13 |
| A-64 | 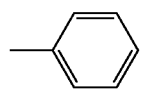 | 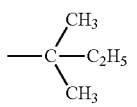 | J-20 |
| A-65 | 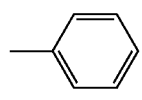 | 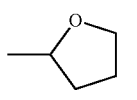 | H-3 |

-continued
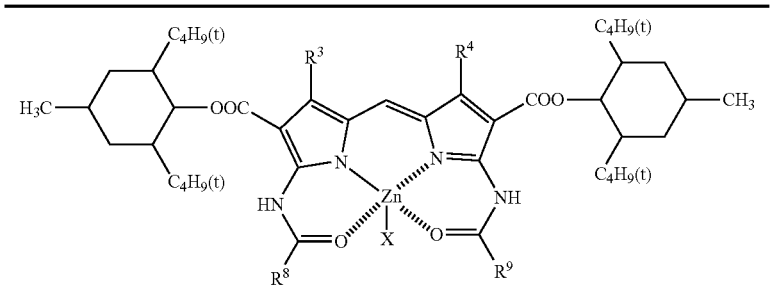
| Compound No. | R³=R⁴ | R⁸=R⁹ | X |
|---|---|---|---|
| A-66 | phenyl | tetrahydrofuran-2-yl | H-25 |
| A-67 | phenyl | tetrahydrofuran-2-yl | J-10 |
| A-68 | phenyl | tetrahydrofuran-2-yl | J-21 |
| A-69 | phenyl | styryl | H-19 |
| A-70 | phenyl | styryl | H-21 |
| A-71 | phenyl | styryl | J-2 |
| A-72 | phenyl | styryl | J-19 |
| A-73 | phenyl | 4-methylphenyl | H-18 |
| A-74 | phenyl | 4-methylphenyl | H-27 |
| A-75 | phenyl | 4-methylphenyl | J-6 |
| A-76 | phenyl | 4-methylphenyl | J-18 |
| A-77 | phenyl | 2,6-dimethylphenyl | H-21 |

-continued
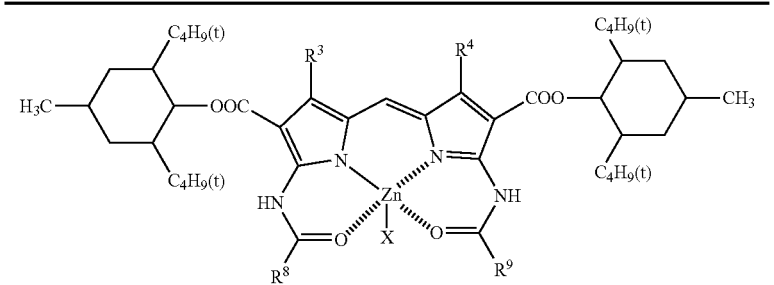
| Compound No. | R³=R⁴ | R⁸=R⁹ | X |
|---|---|---|---|
| A-78 | phenyl | 2,6-dimethylphenyl | J-29 |
| A-79 | phenyl | 2,6-dimethylphenyl | J-5 |
| A-80 | phenyl | 2,6-dimethylphenyl | J-13 |
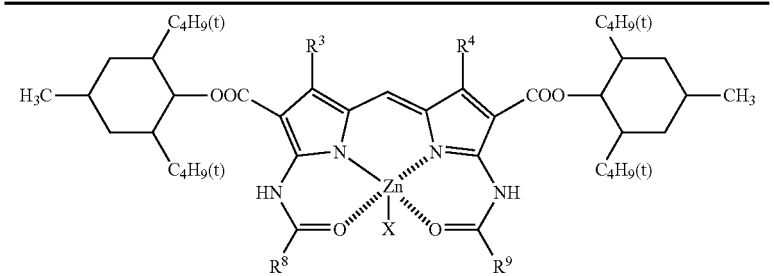
| Compound No. | R³=R⁴ | R⁸=R⁹ | X |
|---|---|---|---|
| A-81 | —CH₃ | 2-methylphenyl | H-2 |
| A-82 | —CH₃ | 2-methylphenyl | J-2 |

-continued
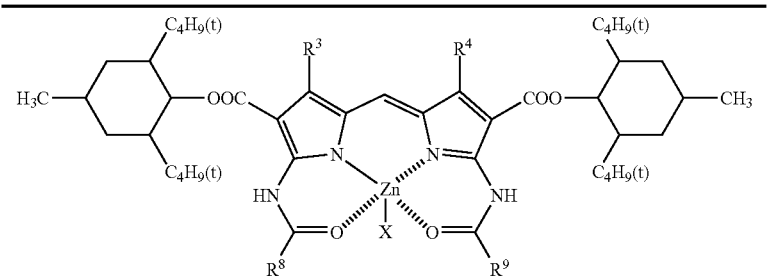
| Compound No. | R³=R⁴ | R⁸=R⁹ | X |
|---|---|---|---|
| A-83 | —CH₃ | 2,3-dimethylphenyl | H-5 |
| A-84 | —CH₃ | 2,3-dimethylphenyl | J-13 |
| A-85 | —CH₃ | 2,3-dimethylphenyl | J-21 |
| A-86 | —C₃H₇(iso) | 2-methylphenyl | H-5 |
| A-87 | —C₃H₇(iso) | 2-methylphenyl | J-6 |
| A-88 | —C₃H₇(iso) | 3,5-dimethylphenyl | H-2 |
| A-89 | —C₃H₇(iso) | 3,5-dimethylphenyl | J-20 |
| A-90 | —C₃H₇(iso) | 3,5-dimethylphenyl | J-21 |
| A-91 | 2-methylphenyl | 3,5-dimethylphenyl | H-5 |

-continued
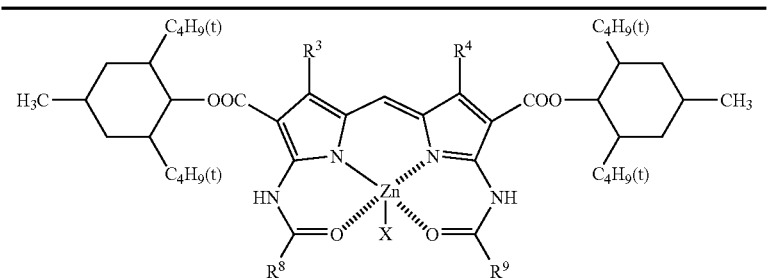
| Compound No. | R³=R⁴ | R⁸=R⁹ | X |
|---|---|---|---|
| A-92 | 2-methylphenyl | 2,4-dimethylphenyl | J-10 |
| A-93 | 2-methylphenyl | 3,4-dimethylphenyl | H-5 |
| A-94 | 2-methylphenyl | 3,4-dimethylphenyl | J-18 |
| A-95 | 2-methylphenyl | 3,4-dimethylphenyl | J-24 |
| A-96 | 2,3-dimethylphenyl | —C₄H₉(t) | H-2 |
| A-97 | 2,3-dimethylphenyl | —C₄H₉(t) | H-24 |
| A-98 | 2,3-dimethylphenyl | 2-methylphenyl | J-6 |

-continued
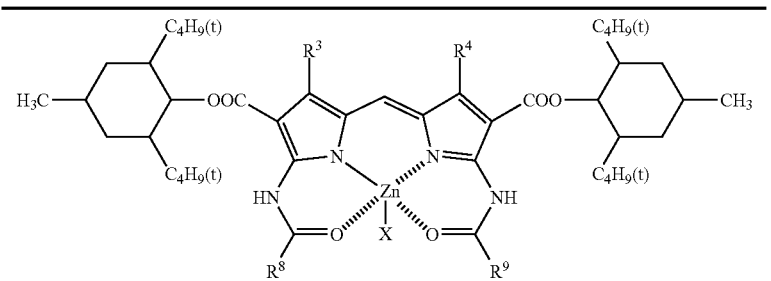
| Compound No. | $R^3=R^4$ | $R^8=R^9$ | X |
|---|---|---|---|
| A-99 | 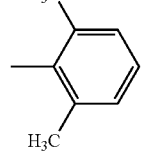 | 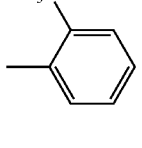 | J-21 |
| A-100 | 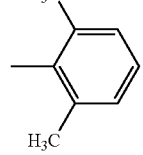 | 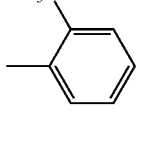 | J-24 |
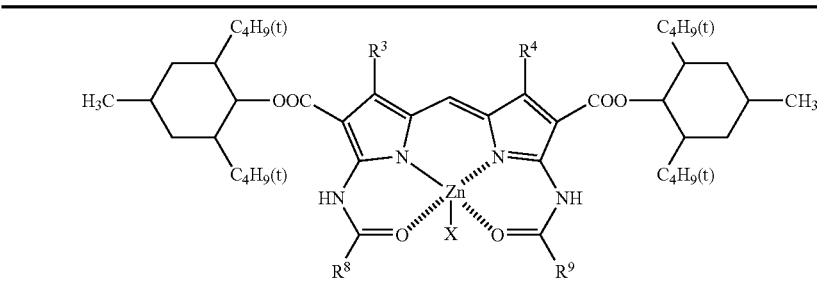
| Compound No. | $R^3$ | $R^4$ | $R^8$ | $R^9$ | X |
|---|---|---|---|---|---|
| A-101 | 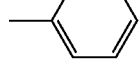 | —CH₃ | 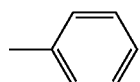 | 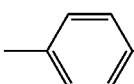 | H-5 |
| A-102 | 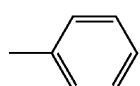 | —CH₃ | 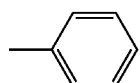 | 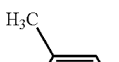 | H-5 |
| A-103 | 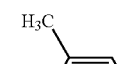 | —CH₃ | —C₄H₉(t) | —C₄H₉(t) | J-20 |
| A-104 | | —C₃H₇(iso) | | | H-5 |

-continued
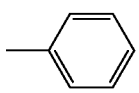
| Compound No. | R³ | R⁴ | R⁸ | R⁹ | X |
|---|---|---|---|---|---|
| A-105 | 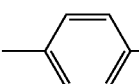 | —C₃H₇(iso) |  | 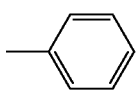 | H-5 |
| A-106 | 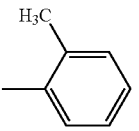 | —C₃H₇(iso) | —C₄H₉(t) | —C₄H₉(t) | H-2 |
| A-107 | —C₃H₇(iso) | —C₃H₇(iso) | 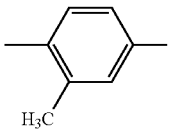 | 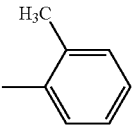 | H-5 |
| A-108 | —C₃H₇(iso) | —C₃H₇(iso) | 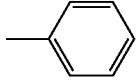 | —C₄H₉(t) | H-2 |
| A-109 | 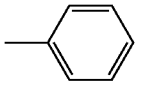 | 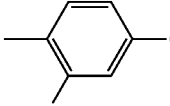 | 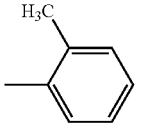 | 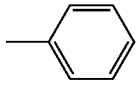 | H-5 |
| A-110 | 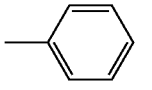 | 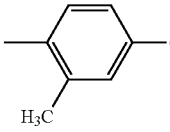 | 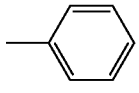 | —C₄H₉(t) | H-2 |
| A-111 | 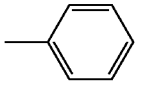 | 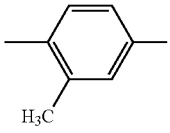 | —C₄H₉(t) | 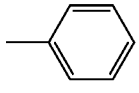 | J-20 |
| A-112 | 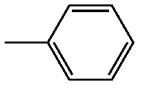 | 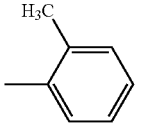 | —C₄H₉(t) |  | H-5 |

A-113
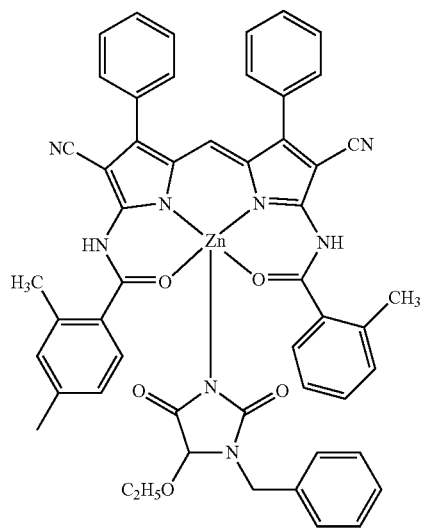
A-114
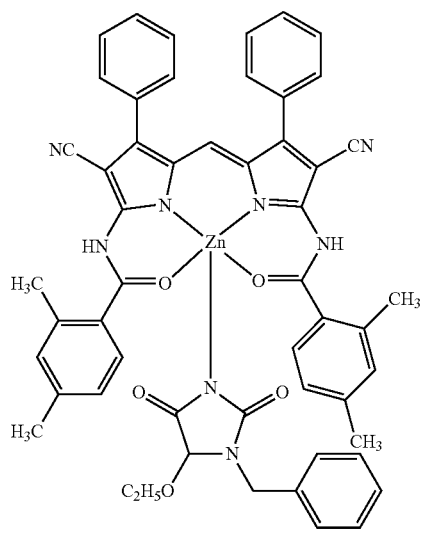
A-115
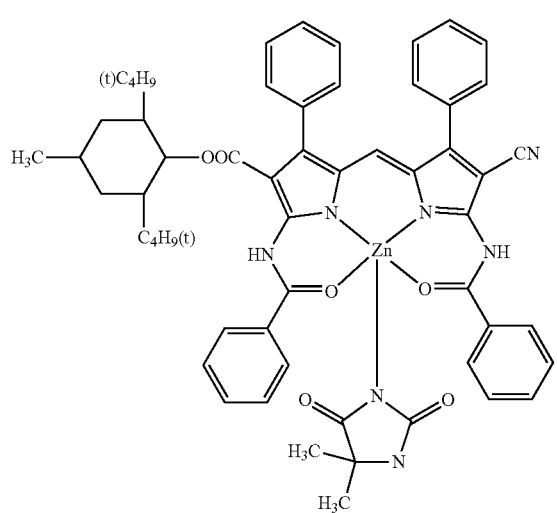
A-116
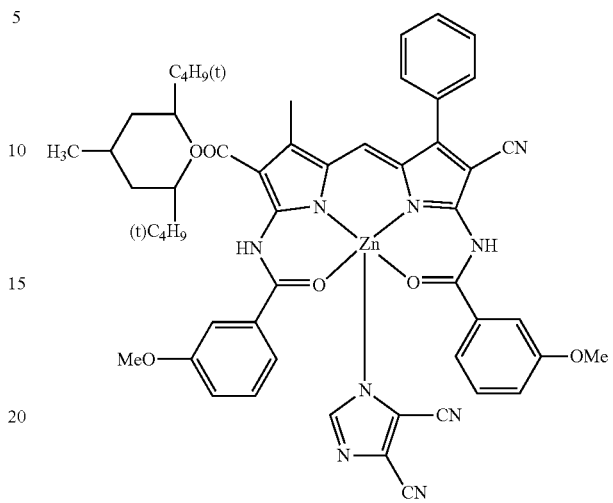
A-117
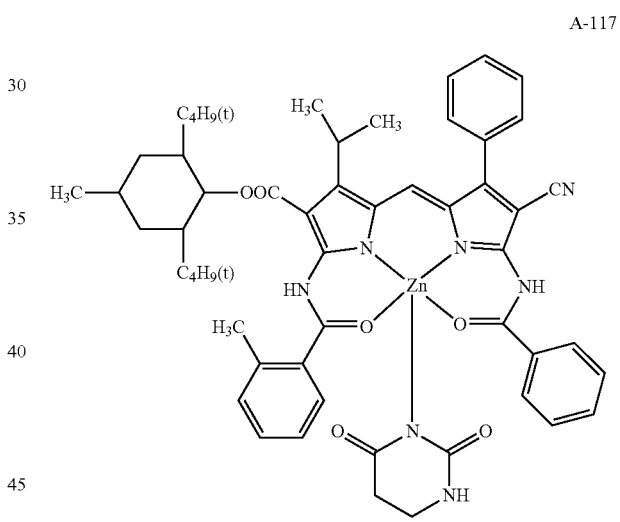
A-118
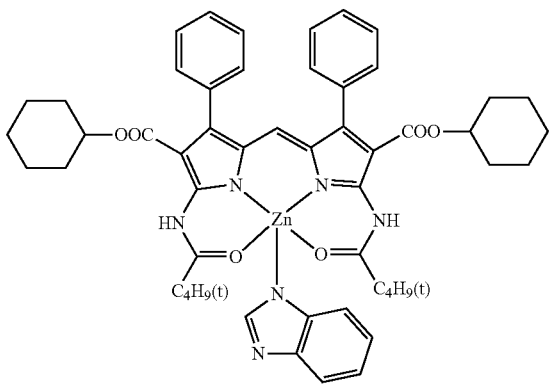

-continued

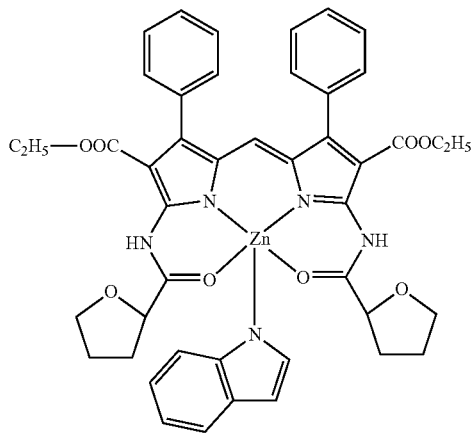
A-119

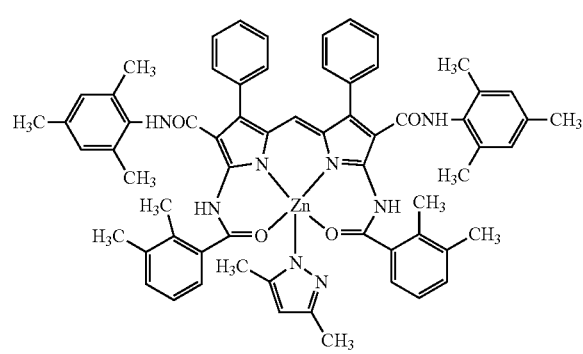
A-120

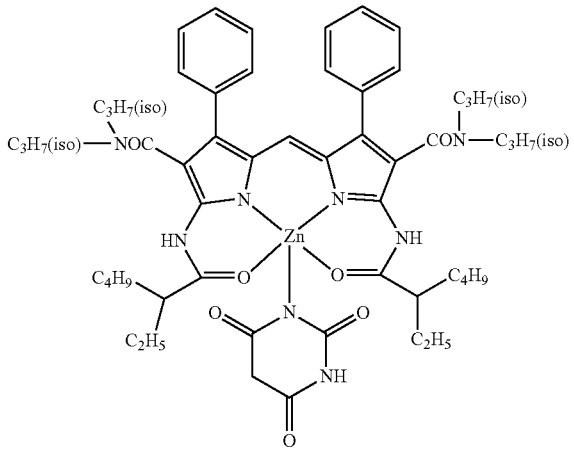
A-121

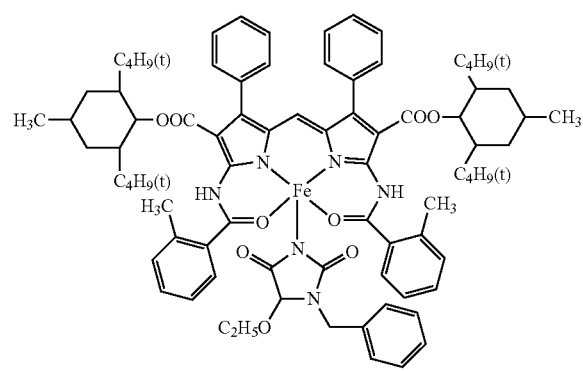
A-122

-continued

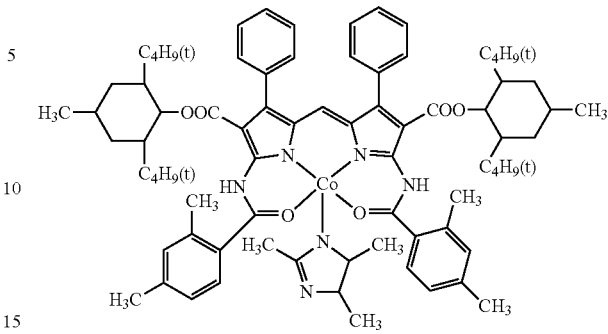
A-123

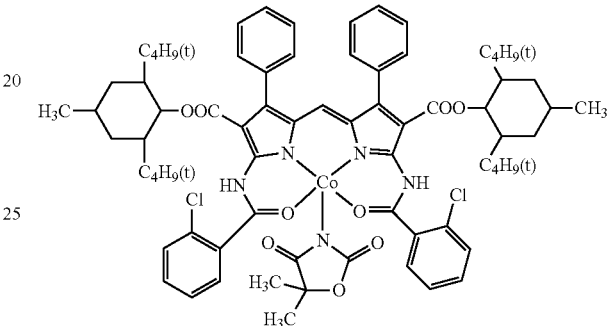
A-124

The specific metal complex compound may be synthesized by the method described in U.S. Pat. Nos. 4,774,339 and 5,433,896, JP-A Nos. 2001-240761, 2002-155052, and 2008-0076044, Japanese Patent No. 3614586, Aust. J. Chem, 1965, 11, 1835-1845, J. H. Boger et al, Heteroatom Chemistry, Vol. 1, No. 5, 389 (1990), or the like.

The colored composition of the present invention may include one kind or a combination of two or more kinds of the specific metal complex compounds.

The content of the specific metal complex compound in the colored composition varies depending on the molecular weight and the absorption coefficient, but is preferably from 0.1% by mass to 30% by mass, and more preferably from 0.5 to 20% by mass, in terms of mass, based on the total solid content of the colored composition.

By setting the content of the specific metal complex compound within the above range, a good color density (for example, a color density suitable for liquid crystal display) can be obtained and also, the patterning of pixels is improved.

For the colored composition of the present invention, a dye having another structure or a pigment may also be used, in addition to the specific metal complex compound, within a range not interfering with the effect of the present invention.

(Dye Having Other Structure)

For the colored composition of the present invention, a dye having another structure may also be used, in addition to the pyrromethene dye. The dye having another structure is not particularly limited, but a known dye may be used. Examples thereof include the colorants described in JP-A Nos. S64-90403, S64-91102, H01-94301, and H06-11614, Japanese Patent No. 2592207, U.S. Pat. Nos. 4,808,501, 5,667,920, and 5,059,500, JP-A Nos. H05-333207, H06-35183, H06-51115, H06-194828, H08-211599, H04-249549, H10-123316, H11-302283, H07-286107, 2001-4823, H08-15522, H08-29771, H08-146215, H11-343437, H08-62416, 2002-

14220, 2002-14221, 2002-14222, 2002-14223, H08-302224, H08-73758, H08-179120, H08-151531, and H06-230210, and the like.

Examples of the chemical structure of the dye having another structure include dyes based on pyrazole azo, anilinoazo, triphenylmethane, anthraquinone, anthrapyridone, benzylidene, oxonol, pyrazolotriazole azo, pyridone azo, cyanine, phenothiazine, pyrrolopyrazole azomethine, xanthene, squarylium, phthalocyanine, benzopyran, and indigo. Among these, the dyes based on xanthene or squarylium are preferable in view of hues.

The colored composition of the present invention may contain one kind or a combination of two or more kinds of the dye.

The content of the dye in the colored composition is preferably from 0.1% by mass to 30% by mass, and more preferably from 0.5% by mass to 20% by mass, in terms of mass, based on the total solid content of the colored composition.

By setting the content of the dye within the above range, a good color density (for example, a color density suitable for liquid crystal display) can be obtained and also, the patterning of pixels is improved, which is thus advantageous. Further, in a case in which in the colored composition of the present invention, the specific metal complex compound and another dye are used in combination, the content of the dye other than the specific metal complex compound is preferably from 1% by mass to 200% by mass, and more preferably from 10% by mass to 150% by mass, based on the specific metal complex compound.

(Pigment)

In the colored composition of the present invention, the above-described dye and a pigment may also be used.

As the pigment, a pigment having an average primary particle diameter of 10 nm to 30 nm is preferable. In this embodiment, a colored composition having excellent hue and contrast is obtained.

As the pigment, various conventionally known inorganic pigments or organic pigments may be used, but an organic pigment is preferably used from the viewpoint of reliability. Examples of the organic pigment in the present invention include the organic pigments described in paragraph 0093 of JP-A No. 2009-256572

In particular,

C. I. Pigment Red 177, 224, 242, 254, 255, 264,
C. I. Pigment Yellow 138, 139, 150, 180, 185,
C. I. Pigment Orange 36, 38, 71,
C. I. Pigment Green 7, 36, 58,
C. I. Pigment Blue 15:6, and
C. I. Pigment Violet 23 are suitable from the viewpoint of color reproducibility, but the present invention is not limited thereto. These organic pigments may be used singly or in various combinations to increase the color purity.

In the case of using the pigment, the content thereof in the colored composition of the present invention is preferably from 0.5% by mass to 50% by mass, and more preferably from 1% by mass to 30% by mass, based on the total solid content of the composition. If the content of the pigment is within the above range, it is effective for achieving excellent color characteristics.

—Pigment Dispersant—

In a case in which the colored composition of the present invention includes a pigment together with the specific metal complex compound, it may include a pigment dispersant.

Examples of the pigment dispersant that may be used in the present invention includes a polymer dispersant (for example, polyamidoamine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalenesulfonic acid-formalin condensate), and a surfactant such as a polyoxyethylene alkyl phosphate ester, a polyoxyethylene alkylamine, and an alkanolamine, and a pigment derivative.

The polymer dispersants may be further classified into a linear polymer, a terminal-modified polymer, a graft type polymer, and a block type polymer according to their structure.

Examples of the terminal-modified polymer having an anchor moiety with respect to the surface of the pigment include polymers having a phosphoric acid group at the terminal described in JP-A No. H03-112992, JP-T No. 2003-533455, and the like, polymers having a sulfonic acid group at the terminal described in JP-A No. 2002-273191 and the like, and polymers having an organic dye partial structure or a heterocyclic ring described in JP-A No. H09-77994 and the like. Further, a polymer in which two or more anchor moieties (an acid group, a basic group, a partial structure of an organic colorant, a heterocyclic ring, and the like) with respect to the surface of the pigment are introduced into the polymer terminal, described in JP-A No. 2007-277514, is excellent in dispersion stability, which is thus preferable.

Examples of the graft type polymer having an anchor moiety with respect to the surface of the pigment include polyester-based dispersants, and specifically reaction products of a poly(lower alkylene imine) and a polyester described in JP-A No. S54-37082, JP-T No. H08-507960, JP-A No. 2009-258668, and the like, reaction products of a polyallylamine and a polyester described in JP-A No. H09-169821 and the like, copolymers of a macromonomer and a nitrogen atom-containing monomer described in JP-A Nos. H10-339949 and 2004-37986, and the like, graft polymers having an organic colorant partial structure or a heterocyclic ring described in JP-A Nos. 2003-238837, 2008-9426, and 2008-81732, and the like, and copolymers of a macromonomer and an acid group-containing monomer described in JP-A No. 2010-106268 and the like. In particular, the amphoteric dispersant resins having a basic group and an acidic group, described in JP-A No. 2009-203462, are particularly preferable from the viewpoints of the dispersibility and dispersion stability of a pigment dispersion, and developability exhibited by a colored composition using a pigment dispersion.

As for the macromonomer used when producing a graft polymer having an anchor moiety with respect to the surface of a pigment by radical polymerization, a known macromonomer may be used, and examples thereof include Macromonomer AA-6 (a polymethyl methacrylate with the terminal group being a methacryloyl group), AS-6 (a polystyrene with the terminal group being a methacryloyl group), AN-6S (a copolymer of an acrylonitrile and a styrene with the terminal group being a methacryloyl group), and AB-6 (a polybutyl acrylate with the terminal group being a methacryloyl group), all manufactured by Toagosei Ltd.; PLACCEL FM5 (a 5 molar equivalent ∈-caprolactone adduct of 2-hydroxyethyl methacrylate) and FA10L (a 10 molar equivalent ∈-caprolactone adduct of 2-hydroxyethyl acrylate), both manufactured by Daicel Chemical Industries, Ltd.; and a polyester-based macromonomer described in JP-A No. H02-272009. Among these, a polyester-based macromonomer is excellent in flexibility and solvent affinity, and is preferable in view of dispersibility and dispersion stability of the pigment dispersion as well as developability exhibited by a colored composition using the pigment dispersion, and a polyester-based macromonomer described in JP-A No. H02-272009 is most preferable.

As the block type polymer having an anchor moiety on the surface of a pigment, the block type polymers described in JP-A Nos. 2003-49110 and 2009-52010, and the like are preferable.

The pigment dispersant that may be used in the present invention is commercially available, and specific examples thereof include "DA-7301" manufactured by Kusumoto Chemicals, Ltd., "DISPERBYK-101 (polyamidoamine phosphate), 107 (carboxylic acid ester), 110 (copolymer containing an acid group), 130 (polyamide), 161, 162, 163, 164, 165, 166, and 170 (high-molecular-weight copolymer)", and "BYK-P 104 and P105 (high-molecular-weight unsaturated polycarboxylic acid)", all manufactured by Byk-Chemie; "EFKA 4047, 4050-4010-4165 (polyurethane-based), EFKA 4330-4340 (block copolymer), 4400-4402 (modified polyacrylate), 5010 (polyester amide), 5765 (high-molecular-weight polycarboxylate), 6220 (fatty acid polyester), 6745 (phthalocyanine derivative), and 6750 (azo pigment derivative)", all manufactured by EFKA; "AJISPUR PB821, PB822, PB880, and PB881" manufactured by Ajinomoto Fine Techno Co., Inc.; "FLOWLEN TG-710 (urethane oligomer)" and "POLYFLOW No. 50E, and No. 300 (acrylic copolymer)", all manufactured by Kyoeisha Chemical Co., Ltd.; "Disperon KS-860, 873SN, 874, #2150 (aliphatic polyvalent carboxylic acid), #7004 (polyetherester), DA-703-50, DA-705, and DA-725" manufactured by Kusumoto Chemicals Ltd.; "DEMOL RN, N (naphthalenesulfonic acid-formalin polycondensate), MS, C, SN-B (aromatic sulfonic acid-formalin polycondensate)", "HOMOGENOL L-18 (high-molecular-weight polycarboxylic acid)", "EMULGEN 920, 930, 935, and 985 (polyoxyethylene nonylphenyl ether)", and "ACETAMINE 86 (stearylamine acetate), all manufactured by Kao Corporation; "SOLSPERSE 5000 (phthalocyanine derivative), 22000 (azo pigment derivative), 13240 (polyester amine), 3000, 17000, and 27000 (polymer having a functional moiety in the end part), 24000, 28000, 32000, and 38500 (graft polymer)", all manufactured by Lubrizol Japan Ltd.; "NIKKOL T106 (polyoxyethylene sorbitan monooleate), MYS-IEX (polyoxyethylene monostearate)", both manufactured by Nikko Chemicals Co., Ltd.; HINO-ACT T-8000E and the like, manufactured by Kawaken Fine Chemicals Co., Ltd.; Organosiloxane Polymer KP341, manufactured by Shin-Etsu Chemical Co., Ltd.; "W001, cationic surfactant", a nonionic surfactant such as polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate and sorbitan fatty acid esters, and an anionic surfactant such as "W004, W005 and W017", all manufactured by Yusho Co., Ltd.; "EFKA-46, EFKA-47, EFKA-47EA, EFKA Polymer 100, EFKA Polymer 400, EFKA Polymer 401 and EFKA Polymer 450", all manufactured by Morishita & Co., Ltd.; a polymer dispersant such as "DISPERSE AID 6, DISPERSE AID 8, DISPERSE AID 15 and DISPERSE AID 9100", all manufactured by San Nopco Ltd.; "ADEKA PLURONIC L31, F38, L42, L44, L61, L64, F68, L72, P95, F77, P84, F87, P94, L101, P103, F108, L121, and P-123", all manufactured by ADEKA Corporation; and "IONET (trade name) S-20", manufactured by Sanyo Chemical Industries, Co., Ltd.

These pigment dispersants may be used singly or in a combination of two or more kinds thereof. In the present invention, particularly, a combination of a pigment derivative and a polymer dispersant is preferably used. Further, as for the pigment dispersant of the present invention, the terminal-modified polymer, graft type polymer, or block type polymer having an anchor moiety with respect to the surface of the pigment may be also used in combination with an alkali soluble resin. Examples of the alkali soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in the side chain, and a resin obtained by modifying a hydroxyl group-containing polymer with an acid anhydride, and among these, a (meth)acrylic acid copolymer is preferable. In addition, N-position substituted maleimide monomer copolymers described in JP-A No. H10-300922, ether dimer copolymers described in JP-A No. 2004-300204, and polymerizable group-containing alkali soluble resins described in JP-A No. H07-319161 are also preferable.

The content of the pigment dispersant in the colored composition is preferably from 1 part by mass to 80 parts by mass, more preferably from 5 parts by mass to 70 parts by mass, and even more preferably from 10 parts by mass to 60 parts by mass, based on 100 parts by mass of the pigment.

Specifically, in the case of using the polymer dispersant, the use amount thereof is preferably in the range of 5 parts by mass to 100 parts by mass, and more preferably in the range of 10 parts by mass to 80 parts by mass, based on 100 parts by mass of the pigment.

Furthermore, in the case of using the pigment derivative in combination therewith, the use amount of the pigment derivative is preferably in the range of 1 part to 30 parts, more preferably in the range 3 parts to 20 parts, and particularly preferably in the range of 5 parts to 15 parts, in terms of mass, based on 100 parts by mass of the pigment.

<Other Components>

The colored composition of the present invention may further include other components described below, within a range not interfering with the effect of the present invention.

(Anthraquinone Compound)

The colored composition of the present invention may include an anthraquinone compound.

By incorporating the anthraquinone compound, the contrast of the color filter prepared using the colored composition of the present invention may be effectively increased.

The anthraquinone compound in the present invention is a compound having a maximum absorption at 400 nm to 700 nm, and in the present invention, it is preferably an anthraquinone compound having a maximum absorption at 500 nm to 700 nm, and particularly preferably an anthraquinone compound having a maximum absorption at 550 nm to 700 nm. The anthraquinone compound having such a maximum absorption is not particularly limited in terms of structure and the effect of improvement of the contrast is excellent.

Among the anthraquinone compounds in the present invention, the aminoanthraquinone compound represented by the following formula (IX) is preferable.

Among these aminoanthraquinone compounds, from the viewpoint of the absorption characteristics, a compound represented by the following formula (X) is more preferable; from the viewpoint of thermal stability, a compound represented by the following formula (XI) is even more preferable; and from the viewpoint of satisfying both of absorption characteristics and thermal stability, a compound represented by the following formula (XII) or (XIII) is particularly preferable.

First, a compound represented by the following formula (IX) will be described.

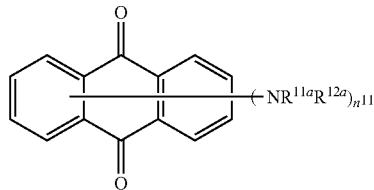

Formula (IX)

In formula (IX), $R^{11a}$ and $R^{12a}$ each independently represent a hydrogen atom, an alkyl group, an aryl group, or a heterocyclic group, but $R^{11a}$ and $R^{12a}$ do not represent a hydrogen atom simultaneously.

The alkyl group represented by $R^{11a}$ or $R^{12a}$ is preferably an alkyl group having 1 to 30 carbon atoms, more preferably an alkyl group having 1 to 20 carbon atoms, and particularly preferably an alkyl group having 1 to 10 carbon atoms, and examples thereof include a methyl group, an ethyl group, an iso-propyl group, a tert-butyl group, an n-octyl group, an n-decyl group, an n-hexadecyl group, a cyclopropyl group, a cyclopentyl group, and a cyclohexyl group.

The aryl group represented by $R^{11a}$ or $R^{12a}$ is preferably an aryl group having 6 to 30 carbon atoms, more preferably an aryl group having 6 to 20 carbon atoms, and particularly preferably an aryl group having 6 to 12 carbon atoms, and examples thereof include a phenyl group, an o-methylphenyl group, a p-methylphenyl group, a 2,6-dimethylphenyl group, a 2,6-diethylphenylbiphenyl group, a 2,6-dibromophenyl group, a naphthyl group, an anthranyl group, and a phenanthryl group.

The heterocyclic group represented by $R^{11a}$ or $R^{12a}$ is preferably a heterocyclic group having 1 to 30 carbon atoms, and more preferably a heterocyclic group having 1 to 12 carbon atoms, and examples of the hetero atom include a nitrogen atom, an oxygen atom, and a sulfur atom. Examples of the heterocyclic group include an imidazolyl group, a pyridyl group, a quinolyl group, a furyl group, a thienyl group, a benzoxazolyl group, a benzimidazolyl group, a benzthiazolyl group, a naphthothiazolyl group, a benzoxazolyl group, a carbazolyl group, and an azepinyl group.

Furthermore, the alkyl group, aryl group, or heterocyclic group represented by $R^{11a}$ or $R^{12a}$ may further have a substituent.

In a case of having a substituent, examples thereof include alkyl groups (preferably alkyl groups having 1 to 30 carbon atoms, more preferably alkyl groups having 1 to 20 carbon atoms, and particularly preferably alkyl groups having 1 to 10 carbon atoms, and examples thereof include a methyl group, an ethyl group, an iso-propyl group, a tert-butyl group, an n-octyl group, an n-decyl group, an n-hexadecyl group, a cyclopropyl group, a cyclopentyl group, and a cyclohexyl group), alkenyl groups (preferably alkenyl groups having 2 to 30 carbon atoms, more preferably alkenyl groups having 2 to 20 carbon atoms, and particularly preferably alkenyl groups having 2 to 10 carbon atoms, and examples thereof include a vinyl group, an allyl group, a 2-butenyl group, and a 3-pentenyl group), alkynyl groups (preferably alkynyl groups having 2 to 30 carbon atoms, more preferably alkynyl groups having 2 to 20 carbon atoms, and particularly preferably alkynyl groups having 2 to 10 carbon atoms, and examples thereof include a propargyl group and a 3-pentynyl group), aryl groups (preferably aryl groups having 6 to 30 carbon atoms, more preferably aryl groups having 6 to 20 carbon atoms, and particularly preferably aryl groups having 6 to 12 carbon atoms, and examples thereof include a phenyl group, a p-methylphenyl group, a biphenyl group, a naphthyl group, an anthranyl group, and a phenanthryl group), amino groups (preferably amino groups having 0 to 30 carbon atoms, more preferably amino groups having 0 to 20 carbon atoms, and particularly preferably amino groups having 0 to 10 carbon atoms, and examples thereof include an alkylamino group, an arylamino group, and a heterocyclic amino group, and specific examples include an amino group, a methylamino group, a dimethylamino group, a diethylamino group, a dibenzylamino group, a diphenylamino group, and a ditolylamino group), alkoxy groups (preferably alkoxy groups having 1 to 30 carbon atoms, more preferably alkoxy groups having 1 to 20 carbon atoms, and particularly preferably alkoxy groups having 1 to 10 carbon atoms, and examples thereof include a methoxy group, an ethoxy group, a butoxy group, and a 2-ethylhexyloxy group), aryloxy groups (preferably aryloxy groups having 6 to 30 carbon atoms, more preferably aryloxy groups having 6 to 20 carbon atoms, and particularly preferably aryloxy groups having 6 to 12 carbon atoms, and examples thereof include a phenyloxy group, a 1-naphthyloxy group, and a 2-naphthyloxy group), aromatic heterocyclic oxy groups (preferably aromatic heterocyclic oxy groups having 1 to 30 carbon atoms, more preferably aromatic heterocyclic oxy groups having 1 to 20 carbon atoms, and particularly preferably aromatic heterocyclic oxy groups having 1 to 12 carbon atoms, and examples thereof include a pyridyloxy group, a pyrazyloxy group, a pyrimidyloxy group, and a quinolyloxy group), acyl groups (preferably acyl groups having 1 to 30 carbon atoms, more preferably acyl groups having 1 to 20 carbon atoms, and particularly preferably acyl groups having 1 to 12 carbon atoms, and examples thereof include an acetyl group, a benzoyl group, a formyl group, and a pivaloyl group), alkoxycarbonyl groups (preferably alkoxycarbonyl groups having 2 to 30 carbon atoms, more preferably alkoxycarbonyl groups having 2 to 20 carbon atoms, and particularly preferably alkoxycarbonyl groups having 2 to 12 carbon atoms, and examples thereof include a methoxycarbonyl group and an ethoxycarbonyl group), aryloxycarbonyl groups (preferably having 7 to 30 carbon atoms, more preferably 7 to 20 carbon atoms, and particularly preferably 7 to 12 carbon atoms, and examples thereof include a phenyloxycarbonyl group), acyloxy groups (preferably acyloxy groups having 2 to 30 carbon atoms, more preferably acyloxy groups having 2 to 20 carbon atoms, and particularly preferably acyloxy groups having 2 to 10 carbon atoms, and examples thereof include an acetoxy group and a benzoyloxy group), acylamino groups (preferably acylamino groups having 2 to 30 carbon atoms, more preferably acylamino groups having 2 to 20 carbon atoms, and particularly preferably acylamino groups having 2 to 10 carbon atoms, and examples thereof include an acetylamino group and a benzoylamino group), alkoxycarbonylamino groups (preferably alkoxycarbonylamino groups having 2 to 30 carbon atoms, more preferably alkoxycarbonylamino groups having 2 to 20 carbon atoms, and particularly preferably alkoxycarbonylamino groups having 2 to 12 carbon atoms, and examples thereof include a methoxycarbonylamino group), aryloxycarbonylamino groups (preferably aryloxycarbonylamino groups having 7 to 30 carbon atoms, more preferably aryloxycarbonylamino groups having 7 to 20 carbon atoms, and particularly preferably aryloxycarbonylamino groups having 7 to 12 carbon atoms, and examples thereof include a phenyloxycarbonylamino group), sulfonylamino groups (preferably sulfonylamino groups having 1 to 30 carbon atoms, more preferably sulfonylamino groups having 1 to 20 carbon atoms, and particularly preferably sulfonylamino groups having 1 to 12 carbon atoms, and examples thereof include a methanesulfonylamino group and a benzene sulfonylamino group), sulfamoyl groups (preferably sulfamoyl groups having 0 to 30 carbon atoms, more preferably sulfamoyl groups having 0 to 20 carbon atoms, and particularly preferably sulfamoyl groups having 0 to 12 carbon atoms, and examples thereof include a sulfamoyl group, a methylsulfamoyl group, a dimethylsulfamoyl group, and a phenylsulfamoyl group), carbamoyl groups (preferably carbamoyl groups having 1 to 30 carbon atoms, more preferably carbamoyl groups having 1 to 20 carbon atoms, and particularly preferably carbamoyl groups having 1 to 12 carbon atoms, and examples thereof include a carbamoyl group, a methylcarbamoyl group, a diethylcarbamoyl group, and a phenylcarbamoyl group), alkylthio groups (preferably alkylthio groups having 1 to 30 carbon atoms, more preferably alkylthio groups having 1 to 20 carbon atoms, and particularly preferably alkylthio groups having 1 to 12 carbon atoms, and examples thereof include a methylthio group and an ethylthio group), arylthio groups (preferably arylthio groups having 6 to 30 carbon atoms, more preferably arylthio groups having 6 to 20 carbon atoms, and particularly preferably arylthio groups having 6 to 12 carbon atoms, and examples thereof include a phenylthio group), aromatic heterocyclic thio groups (preferably aromatic heterocyclic thio groups having 1 to 30 carbon atoms, more preferably aromatic heterocyclic thio groups having 1 to 20 carbon atoms, and particularly preferably aromatic heterocyclic thio groups having 1 to 12 carbon atoms, and examples thereof include a pyridylthio group, a 2-benzimidazolylthio group, a 2-benzoxazolylthio group, and a 2-benzothiazolylthio group), sulfonyl groups (preferably sulfonyl groups having 1 to 30 carbon atoms, more preferably sulfonyl groups having 1 to 20 carbon atoms, and particularly preferably sulfonyl groups having 1 to 12 carbon atoms, and examples thereof include a mesyl group and a tosyl group), sulfinyl groups (preferably sulfinyl groups having 1 to 30 carbon atoms, more preferably sulfinyl groups having 1 to 20 carbon atoms, and particularly preferably sulfinyl groups having 1 to 12 carbon atoms, and examples thereof include a methanesulfinyl group and a benzenesulfinyl group), ureido groups (preferably ureido groups having 1 to 30 carbon atoms, more preferably ureido groups having 1 to 20 carbon atoms, and particularly preferably ureido groups having 1 to 12 carbon atoms, and examples thereof include a ureido group, a methylureido group, and a phenylureido group), phosphoric amide groups (preferably phosphoric amide groups having 1 to 30 carbon atoms, more preferably phosphoric amide groups having 1 to 20 carbon atoms, and particularly preferably phosphoric amide groups having 1 to 12 carbon atoms, and examples thereof include a diethylphosphoric amide group and a phenylphosphoric amide group), a hydroxy group, a mercapto group, halogen atoms (for example, a fluorine atom, a chlorine atom, a bromine atom, and an iodine atom), a cyano group, a sulfo group, a carboxyl group, a nitro group, a hydroxamic acid group, sulfino groups, hydrazino groups, imino groups, heterocyclic groups (preferably heterocyclic groups having 1 to 30 carbon atoms, and more preferably heterocyclic groups having 1 to 12 carbon atoms; specific examples of the hetero atom include a nitrogen atom, an oxygen atom, and a sulfur atom; and examples of the heterocyclic groups include an imidazolyl group, a pyridyl group, a quinolyl group, a furyl group, a thienyl group, a piperidyl group, a morpholino group, a benzoxazolyl group, a benzimidazolyl group, a benzothiazolyl group, a carbazolyl group, and an azepinyl group), and silyl groups (preferably silyl groups having 3 to 40 carbon atoms, more preferably silyl groups having 3 to 30 carbon atoms, and particularly preferably silyl groups having 3 to 24 carbon atoms, and examples thereof include a trimethylsilyl group and a triphenylsilyl group). These substituents may further have a substituent.

In formula (IX), $n^{11}$ represents an integer of 1 to 4, and in a case in which $n^{11}$ is an integer of 2 to 4, plural $NR^{11a}R^{12a}$'s may be the same as or different from each other.

Next, the compound represented by formula (X) will be described.

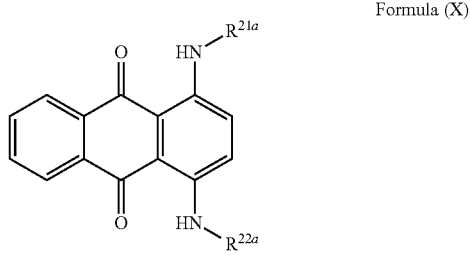

Formula (X)

In formula (X), $R^{21a}$ and $R^{22a}$ each independently represent an alkyl group or an aryl group.

The alkyl group represented by $R^{21a}$ or $R^{22a}$ is preferably an alkyl group having 1 to 30 carbon atoms, more preferably an alkyl group having 1 to 20 carbon atoms, and particularly preferably an alkyl group having 1 to 10 carbon atoms, and examples thereof include a methyl group, an ethyl group, an iso-propyl group, a tert-butyl group, an n-octyl group, an n-decyl group, an n-hexadecyl group, a cyclopropyl group, a cyclopentyl group, and a cyclohexyl group.

The aryl group represented by $R^{21a}$ or $R^{22a}$ is preferably an aryl group having 6 to 30 carbon atoms, more preferably an aryl group having 6 to 20 carbon atoms, and particularly preferably an aryl group having 6 to 12 carbon atoms, and examples thereof include a phenyl group, an o-methylphenyl group, a p-methylphenyl group, a 2,6-dimethylphenyl group, a 2,6-diethylphenylbiphenyl group, a 2,6-dibromophenyl group, a naphthyl group, an anthranyl group, and a phenanthryl group.

Furthermore, the alkyl group or aryl group represented by $R^{21a}$ or $R^{22a}$ may further have a substituent, and examples of the substituent include the examples described for the substituent of the alkyl group, aryl group, or heterocyclic group represented by $R^{11a}$ or $R^{12a}$ in formula (IX). Among these, preferable examples of the substituent include an alkyl group, an aryl group, an amino group, an alkoxy group, an aryloxy group, an acyl group, an alkoxycarbonyl group, an aryloxycarbonyl group, an acyloxy group, an acylamino group, a sulfonylamino group, a sulfamoyl group, a sulfonyl group, an ureido group, a hydroxy group, a halogen atom, a sulfo group, and a carboxyl group. The details and preferable embodiments thereof are the same as the examples described above.

Next, the compound represented by formula (XI) will be described.

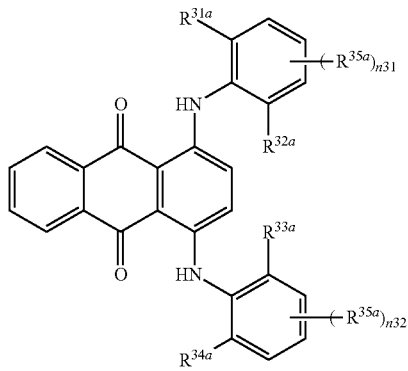

Formula (XI)

In formula (XI), $R^{31a}$, $R^{32a}$, $R^{33a}$, and $R^{34a}$ each independently represent an alkyl group or a halogen atom.

The alkyl group represented by $R^{31a}$, $R^{32a}$, $R^{33a}$, or $R^{34a}$ is preferably an alkyl group having 1 to 10 carbon atoms, more preferably an alkyl group having 1 to 5 carbon atoms, and particularly preferably an alkyl group having 1 to 2 carbon atoms, and examples thereof include a methyl group, an ethyl group, an iso-propyl group, a tert-butyl group, an n-octyl group, an n-decyl group, an n-hexadecyl group, a cyclopropyl group, a cyclopentyl group, and a cyclohexyl group.

Examples of the halogen atom represented by $R^{31a}$, $R^{32a}$, $R^{33a}$, or $R^{34a}$ include a fluorine atom, a chlorine atom, a bromine atom, and an iodine atom, with the chlorine atom and the bromine atom being preferable.

In formula (XI), $R^{35a}$ and $R^{36a}$ each independently represent an alkyl group, an alkoxy group, an aryloxy group, a sulfo group or a salt thereof, an aminosulfonyl group, an alkoxysulfonyl group, or an aryloxysulfonyl group.

The alkyl group represented by $R^{35a}$ or $R^{36a}$ has the same definition as the alkyl group represented by $R^{31a}$, $R^{32a}$, $R^{33a}$, or $R^{34a}$, and the preferable definitions are also the same.

The alkoxy group represented by $R^{35a}$ or $R^{36a}$ is preferably an alkoxy group having 1 to 30 carbon atoms, more preferably an alkoxy group having 1 to 20 carbon atoms, and particularly preferably an alkoxy group having 1 to 10 carbon atoms, and examples thereof include methoxy, ethoxy, butoxy, and 2-ethylhexyloxy.

The aryloxy group represented by $R^{35a}$ or $R^{36a}$ is preferably an aryloxy group having 6 to 30 carbon atoms, more preferably an aryloxy group having 6 to 20 carbon atoms, and particularly preferably an aryloxy group having 6 to 12 carbon atoms, and examples thereof include phenyloxy, 1-naphthyloxy, and 2-naphthyloxy.

The sulfo group or salt thereof represented by $R^{35a}$ or $R^{36a}$ is preferably a group derived from a sulfonic acid group or a sulfonate salt. The sulfonate salt is preferably a quaternary ammonium salt or an amine salt, and particularly preferably sulfonate salt having 4 to 30 carbon atoms (preferably sulfonate salt having 10 to 30 carbon atoms, and more preferably sulfonate salt having 15 to 30 carbon atoms).

The aminosulfonyl group represented by $R^{35a}$ or $R^{36a}$ is preferably an aminosulfonyl group having 1 to 30 carbon atoms, more preferably an aminosulfonyl group having 2 to 20 carbon atoms, and particularly preferably an aminosulfonyl group having 2 to 15 carbon atoms, and specific examples thereof include an ethylaminosulfonyl group, a propylaminosulfonyl group, an isopropylaminosulfonyl group, a butylaminosulfonyl group, an isobutylaminosulfonyl group, a sec-butylaminosulfonyl group, a pentylaminosulfonyl group, an isopentylaminosulfonyl group, a hexylaminosulfonyl group, a cyclohexylaminosulfonyl group, a 2-ethylhexylaminosulfonyl group, a decylaminosulfonyl group, a dodecylaminosulfonyl group, and a phenylaminosulfonyl group, and examples of the dialkylaminosulfonyl group include a dimethylaminosulfonyl group, a diethylaminosulfonyl group, a dipropylaminosulfonyl group, a diisopropylaminosulfonyl group, a dibutylaminosulfonyl group, a disec-butylaminosulfonyl group, a disec-propylaminosulfonyl group, a dihexylaminosulfonyl group, a methylethylaminosulfonyl group, a methylbutylaminosulfonyl group, an ethylbutylaminosulfonyl group, and a phenylmethylaminosulfonyl group. Among these, a dialkylaminosulfonyl group having 4 to 15 carbon atoms in the alkyl moiety is particularly preferable.

The alkoxysulfonyl group represented by $R^{35a}$ or $R^{36a}$ is preferably an alkoxysulfonyl group having 1 to 30 carbon atoms, more preferably an alkoxysulfonyl group having 2 to 20 carbon atoms, even more preferably an alkoxysulfonyl group having 2 to 15 carbon atoms, and particularly preferably an alkoxysulfonyl group having 4 to 15 carbon atoms, and specific examples thereof include a butoxysulfonyl group, a hexyloxysulfonyl group, a decyloxysulfonyl group, and a dodecyloxysulfonyl group.

The aryloxysulfonyl group represented by $R^{35a}$ or $R^{36a}$ is preferably an aryloxysulfonyl group having 6 to 30 carbon atoms, more preferably an aryloxysulfonyl group having 6 to 20 carbon atoms, and particularly preferably an aryloxysulfonyl group having 6 to 15 carbon atoms, and specific examples thereof include a phenoxysulfonyl group and a tolyloxysulfonyl group.

$R^{35a}$ or $R^{36a}$ may further have a substituent and examples of the substituent include the examples described as the substituent of the alkyl group, aryl group, or heterocyclic group represented by $R^{11a}$ or $R^{12a}$ in formula (IX).

In formula (XI), $n^{31}$ and $n^{32}$ each represent an integer of 0 to 2, and in a case in which $n^{31}$ and $n^{32}$ are 2, plural $R^{35a}$'s and $R^{36a}$'s may be the same as or different from each other.

Among the diaminoanthraquinone compounds, a compound selected from the compounds represented by the following formula (XII) or (XIII) is preferable.

(Compound Represented by Formula (XII))

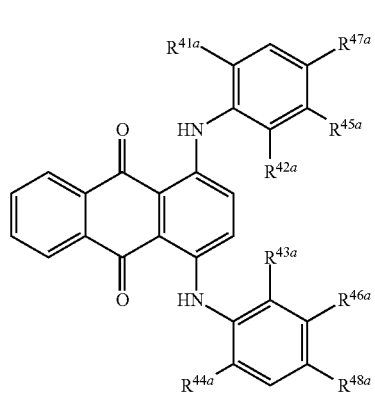

Formula (XII)

In formula (XII), $R^{41a}$, $R^{42a}$, $R^{43a}$, and $R^{44a}$ each independently represent an alkyl group or a halogen atom, and have the same definitions as the alkyl group and the halogen atom in $R^{31a}$, $R^{32a}$, $R^{33a}$, and $R^{34a}$ in formula (XI), and the preferable definitions are also the same.

$R^{45}$, $R^{46a}$, $R^{47a}$, and $R^{48a}$ in formula (XII) each independently represent an alkyl group, a sulfo group or a salt thereof, or an aminosulfonyl group. Any one of $R^{45a}$ and $R^{47a}$, and any one of $R^{46a}$ and $R^{48a}$ each represent a sulfo group or a salt thereof, or an aminosulfonyl group. $R^{45a}$, $R^{46a}$, $R^{47a}$, and $R^{48a}$ have the same definitions as the alkyl group, the sulfo group or salt thereof, and the aminosulfonyl group represented by $R^{35a}$ and $R^{36a}$ in formula (XI), and the preferable definitions are also the same.

(Compound Represented by Formula (XIII))

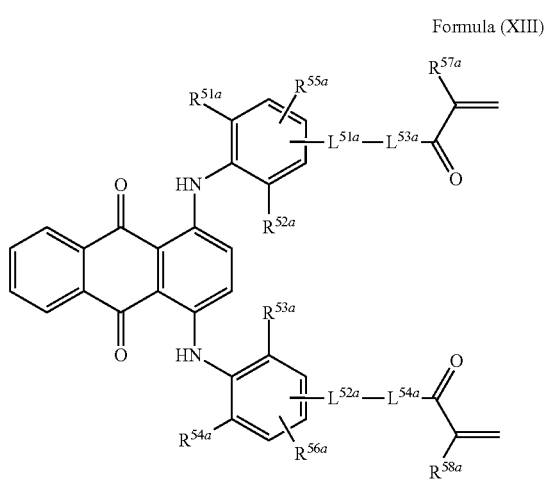

Formula (XIII)

In formula (XIII), $R^{51a}$, $R^{52a}$, $R^{53a}$, and $R^{54a}$ each independently represent an alkyl group or a halogen atom, and have the same definitions as the alkyl group and the halogen atom in $R^{31a}$, $R^{32a}$, $R^{33a}$, and $R^{34a}$ in formula (XI), and the preferable definitions are also the same.

In formula (XIII), $R^{55a}$ and $R^{56a}$ each independently represent a hydrogen atom or an alkyl group, and the alkyl group has the same definition as the alkyl group in $R^{31a}$, $R^{32a}$, $R^{33a}$, and $R^{34a}$ in formula (XI), and the preferable definition is also the same.

Furthermore, $R^{57a}$ and $R^{58a}$ each independently represent a hydrogen atom or an alkyl group, and the alkyl group is preferably an alkyl group having 1 to 10 carbon atoms, more preferably an alkyl group having 1 to 5 carbon atoms, and particularly preferably a methyl group.

In formula (XIII), $L^{51a}$ and $L^{52a}$ each independently represent a divalent linking group, and preferably an alkylene group having 1 to 10 carbon atoms, an arylene group having 6 to 20 carbon atoms, —O—, —S—, —NR—, —SO₂—, —CO—, or a divalent linking group formed by combination of a plurality of these groups. $L^{51a}$ and $L^{52a}$ are more preferably an alkylene group having 1 to 10 carbon atoms, an arylene group having 6 to 12 carbon atoms, a sulfonylamino group, or a divalent linking group formed by combination of a plurality of these groups, and particularly preferably an alkylene group having 1 to 10 carbon atoms, a sulfonylamino group, or a divalent linking group formed by combination of a plurality of these groups.

The alkylene group having 1 to 10 carbon atoms or a divalent linking group formed by the combination thereof with —O— or the like may be unsubstituted or may have a substituent, and examples thereof include ethylene, propylene, a butylene group, an ethyleneoxy group, a propyleneoxy group, an ethyleneaminosulfonyl group, a propyleneaminosulfonyl group, a butyleneaminosulfonyl group, a pentyleneaminosulfonyl group, and a 1-methylethylenesulfonyl group. Among these, alkyleneaminosulfonyl groups having 2 to 10 carbon atoms (e.g.: an ethyleneaminosulfonyl group, a propyleneaminosulfonyl group, a butyleneaminosulfonyl group, and a pentyleneaminosulfonyl group) are preferable.

The arylene group having 6 to 20 carbon atoms or a divalent linking group formed by the combination thereof with —O— or the like may be unsubstituted or may have a substituent. Examples thereof include a phenylene group, a biphenylene group, and a phenyleneaminosulfonyl group, and among these, aryleneaminosulfonyl groups having 6 to 12 carbon atoms (e.g.: a phenyleneaminosulfonyl group) are preferable.

Furthermore, R in —NR— represents a hydrogen atom or an alkyl group having 1 to 10 carbon atoms. Specific examples of the alkyl group include a methyl group, an ethyl group, a propyl group, an isobutyl group, a butyl group, an isobutyl group, a sec-butyl group, and a 2-ethylhexyl group.

In formula (XIII), $L^{53a}$ and $L^{54a}$ each independently represent an oxygen atom or an —NH— group.

Among these, the anthraquinone compound that is preferable in the present invention is a compound selected from the diaminoanthraquinone compounds represented by formula (XII) or (XIII), and the following cases are particularly preferable.

That is, a case in which in formula (XII), $R^{41a}$, $R^{42a}$, $R^{43a}$, and $R^{44a}$ are each a methyl group, an ethyl group, or a bromine atom, $R^{45a}$ and $R^{46a}$ are each an aminosulfonyl group having 2 to 15 carbon atoms, and $R^{47a}$ and $R^{48a}$ are each a methyl group is preferable; and a case in which in formula (XIII), $R^{51a}$, $R^{52a}$, $R^{53a}$, and $R^{54a}$ are each a methyl group, an ethyl group, or a bromine atom, $R^{55a}$ and $R^{56a}$ are each a hydrogen atom or a methyl group, $R^{57a}$ and $R^{58a}$ are a hydrogen atom or a methyl group, $L^{51a}$ and $L^{52a}$ are each an alkyleneaminosulfonyl group having 1 to 10 carbon atoms, an aralkyleneaminosulfonyl group having 7 to 12 carbon atoms, or an alkyleneoxy group having 2 to 10 carbon atoms, and $L^{53a}$ and $L^{54a}$ are each an oxygen atom is preferable.

In these cases, a case in which the dipyrromethene metal complex compound represented by formula (I) is used in combination with the above components is more preferable in that the effect of the present invention is further enhanced.

Specific examples of the anthraquinone compound in the present invention are shown below. However, the present invention is not limited thereto.

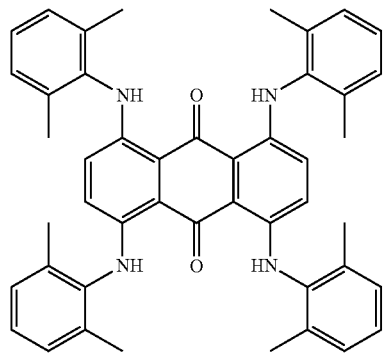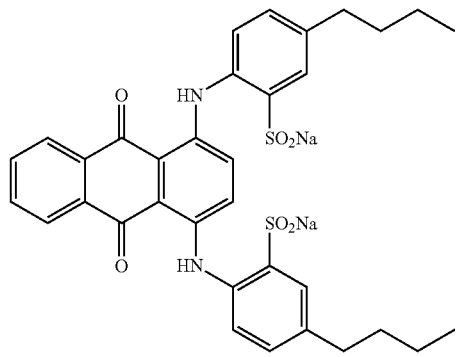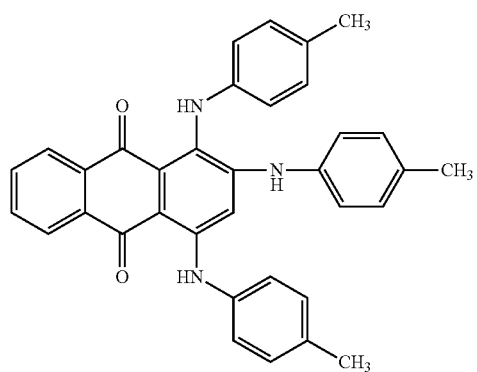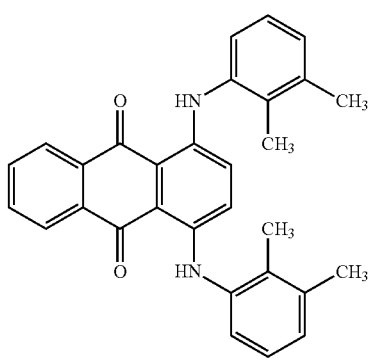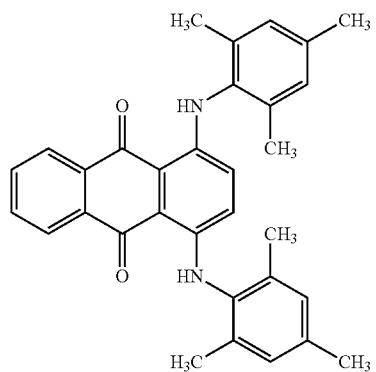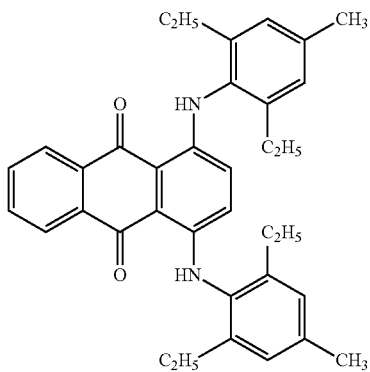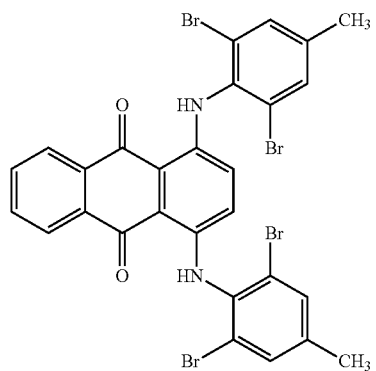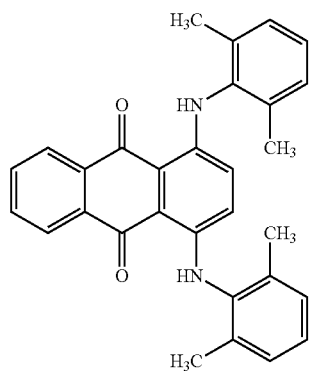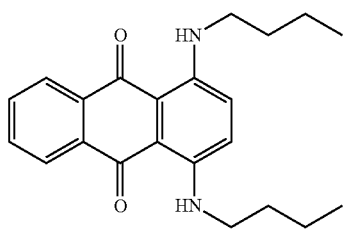

75
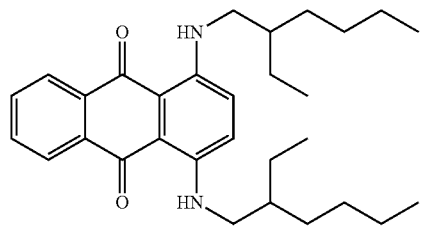
-continued
76
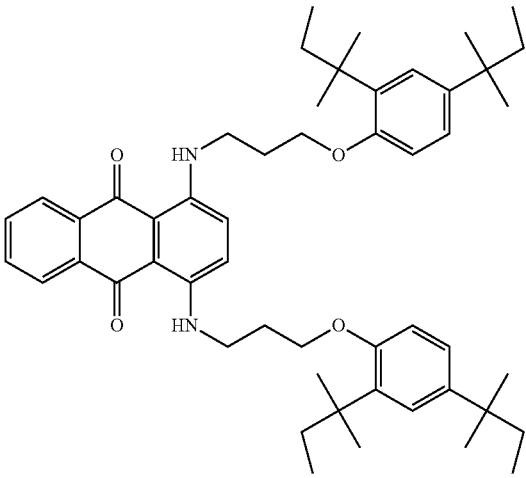
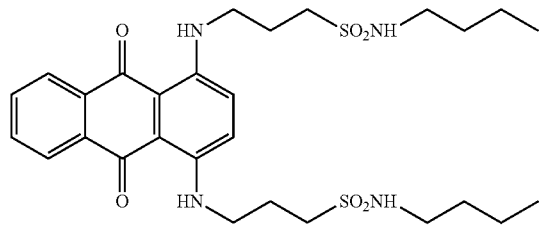
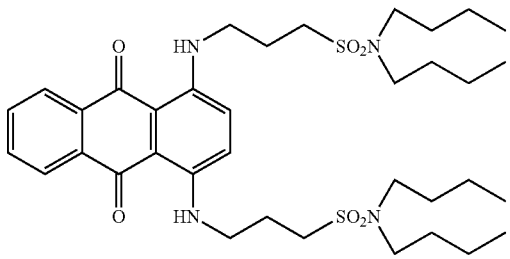
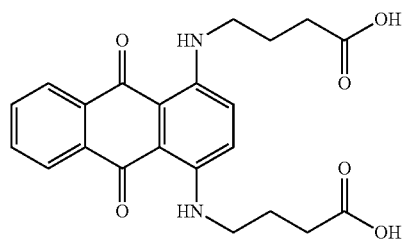
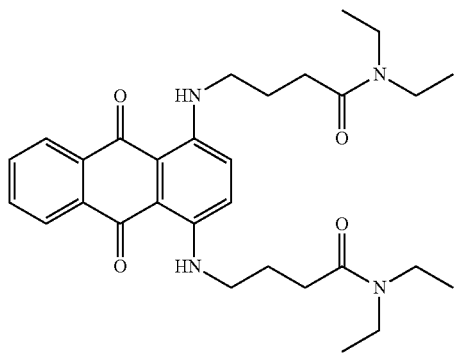
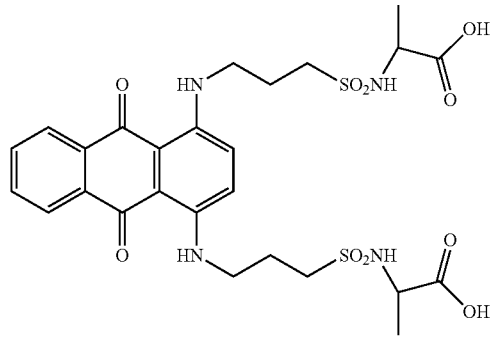
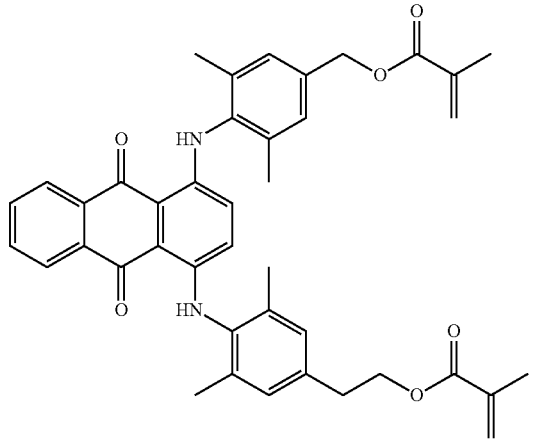

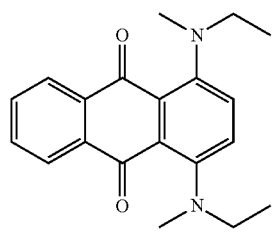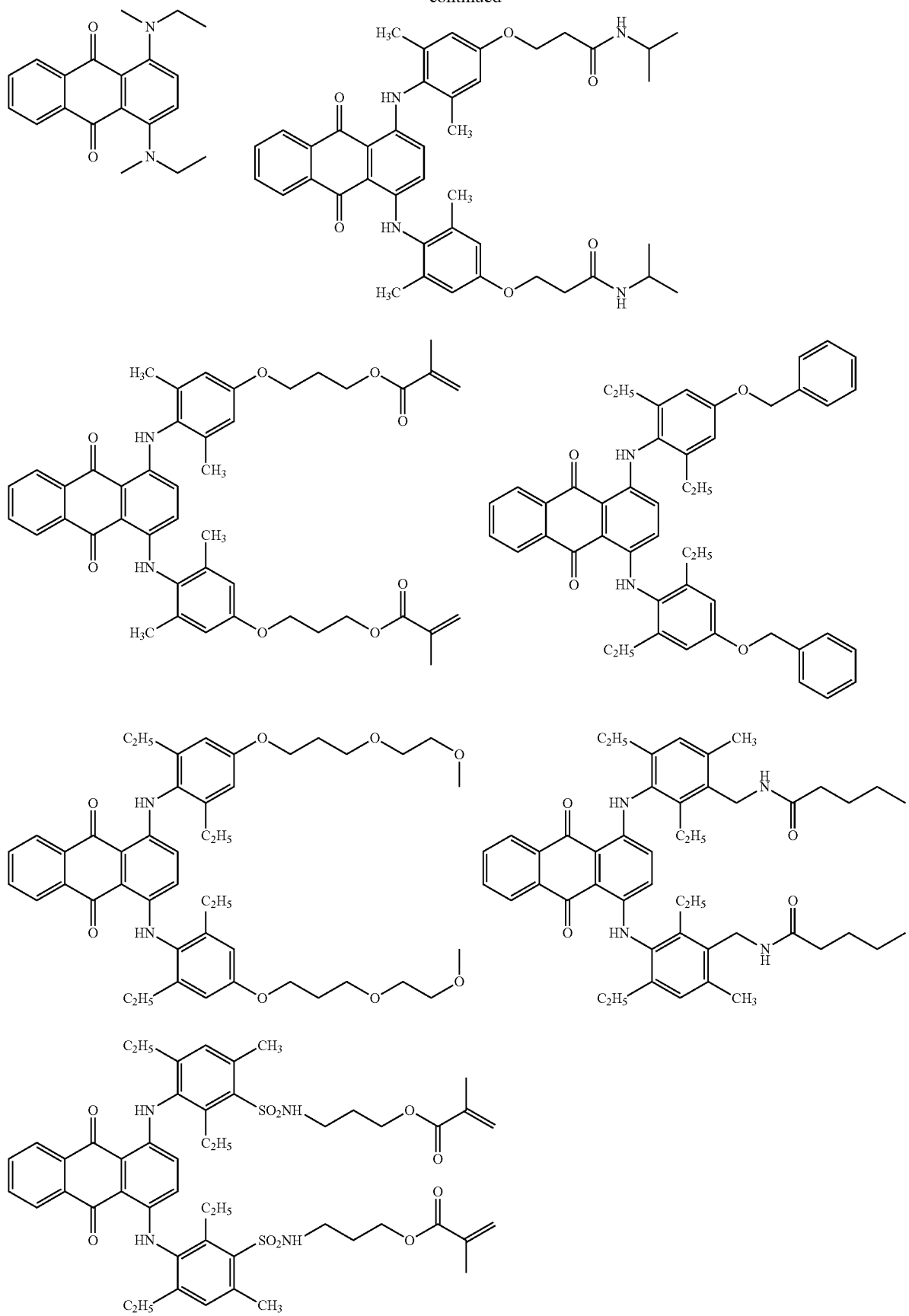

-continued
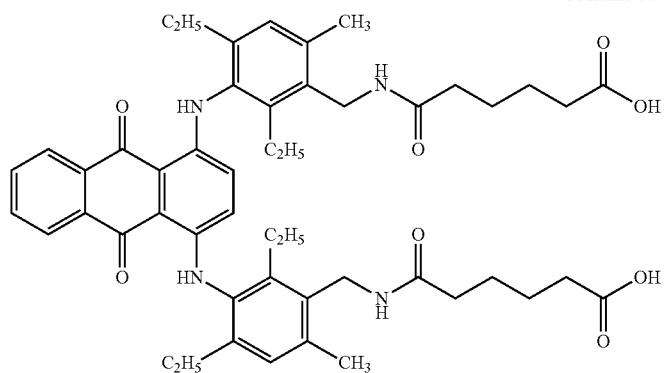
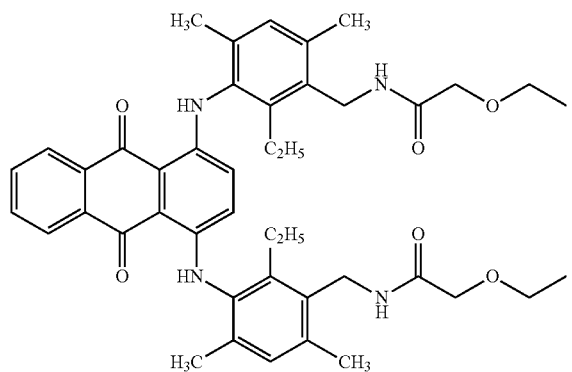
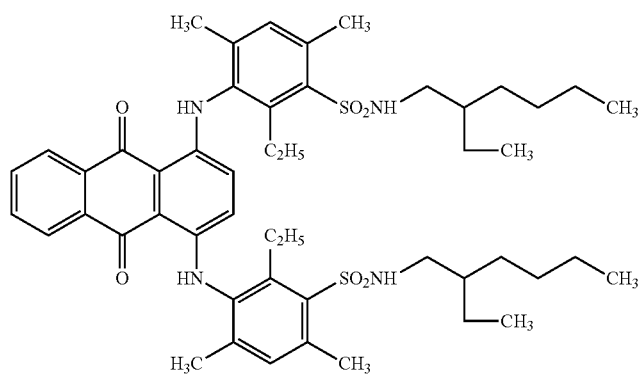
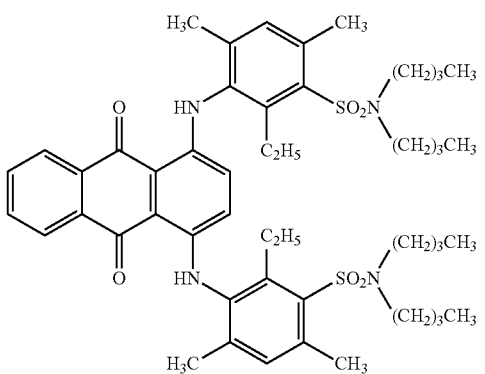
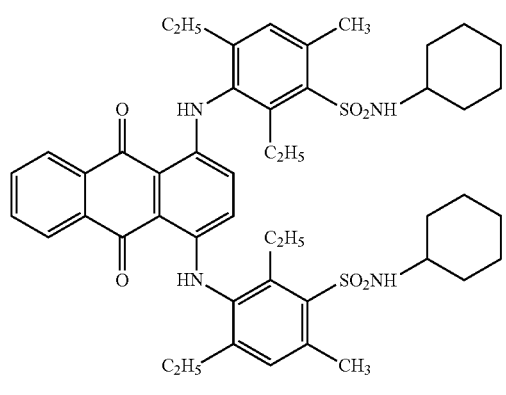
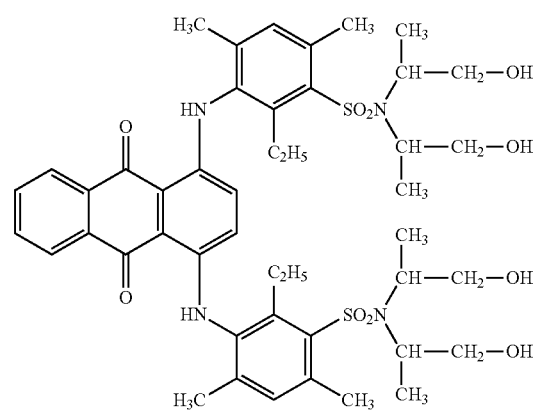

-continued
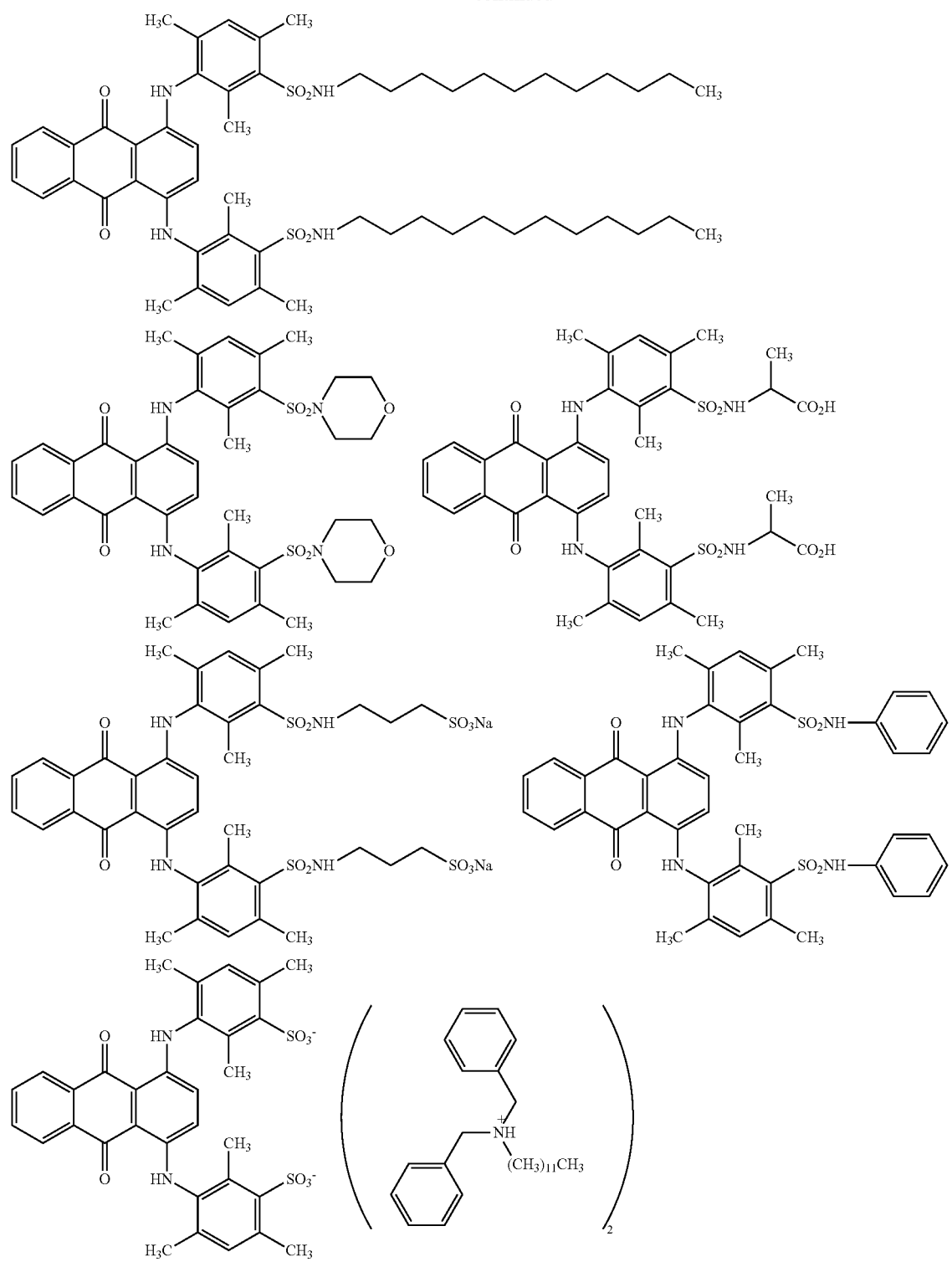

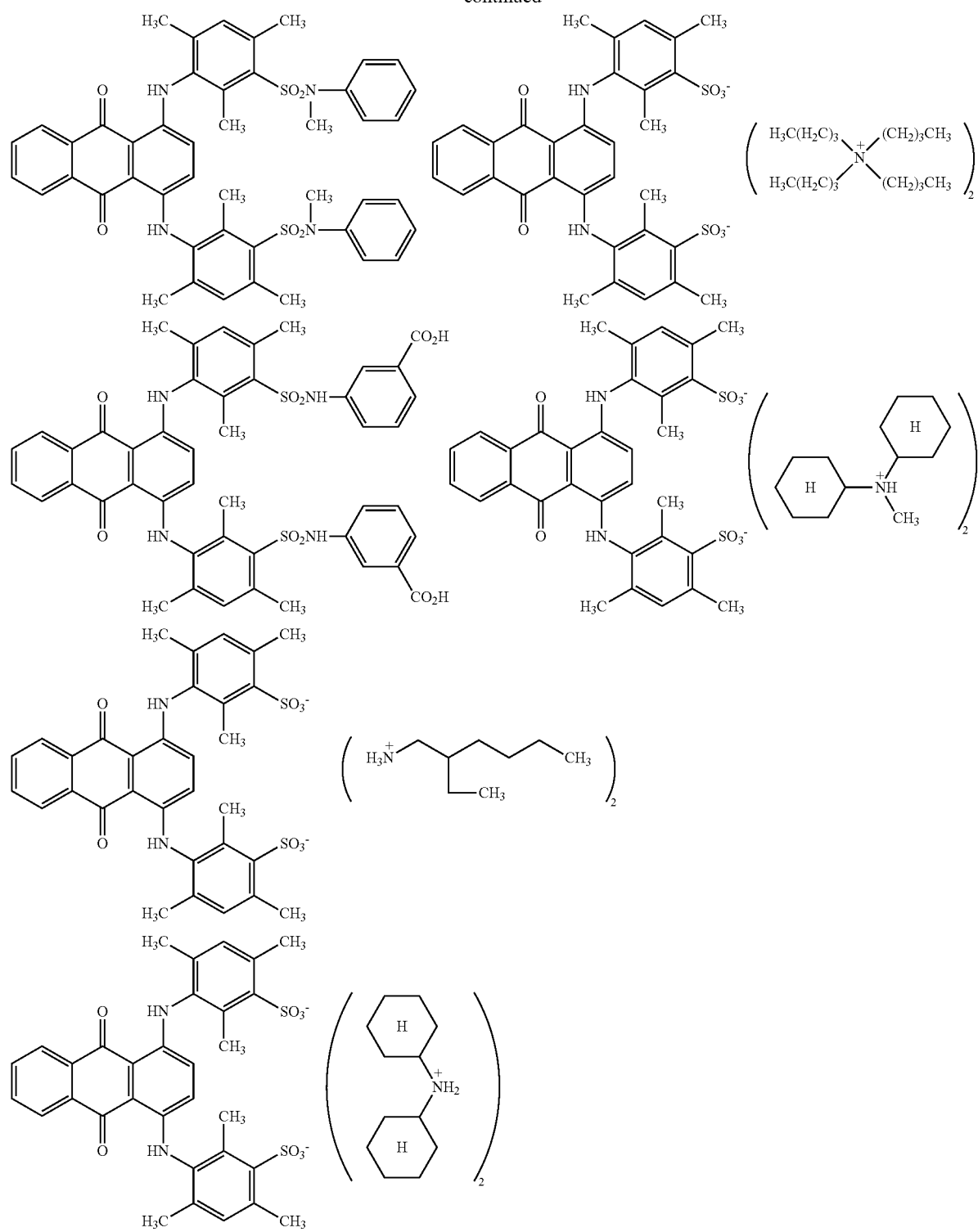

-continued
85
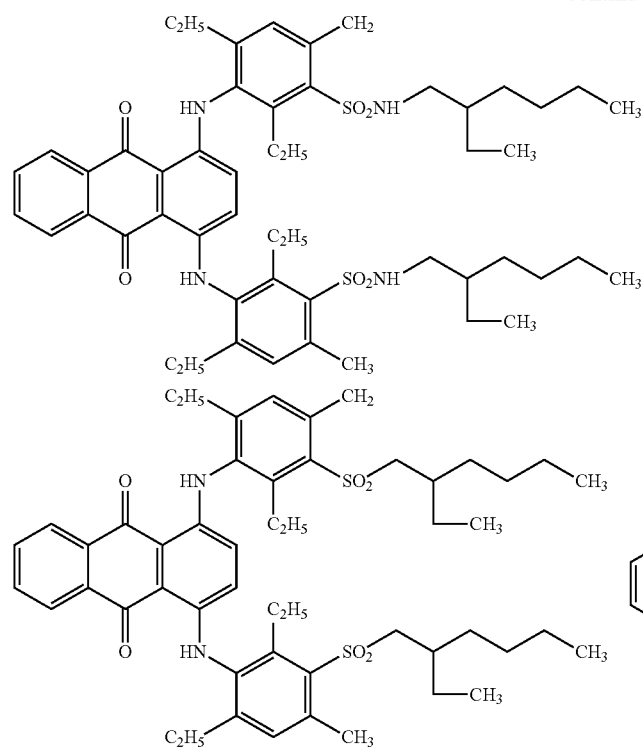
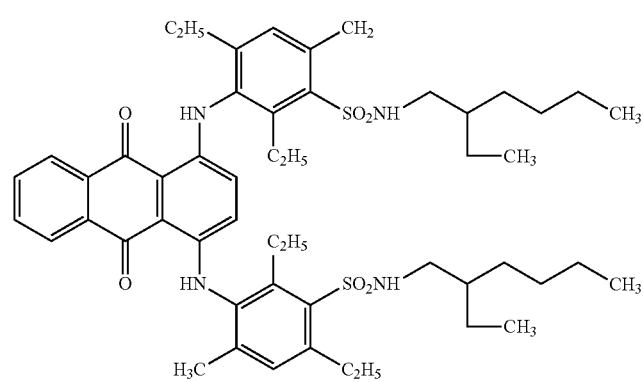
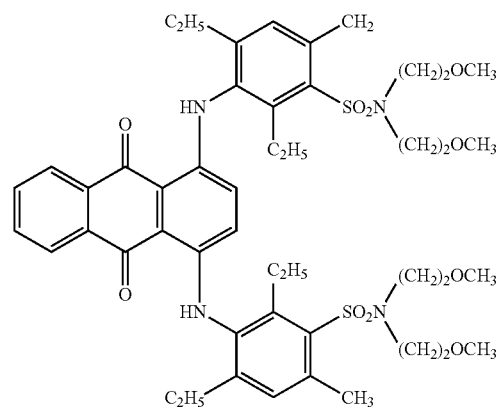
86
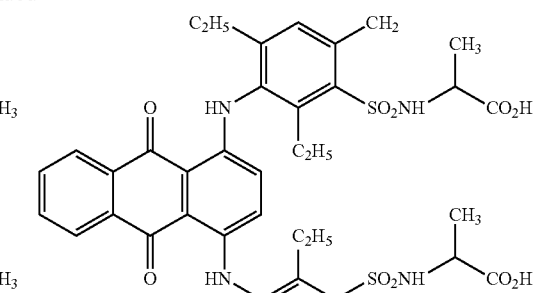
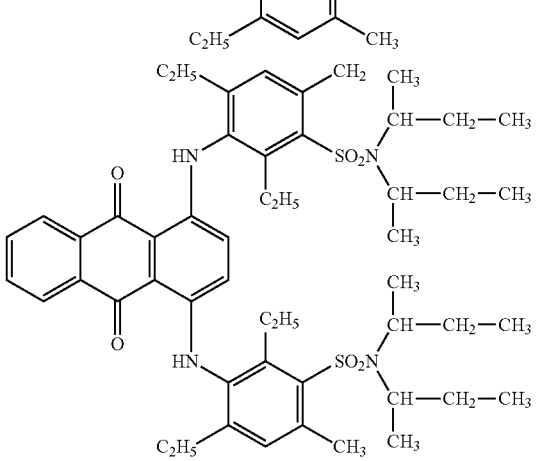
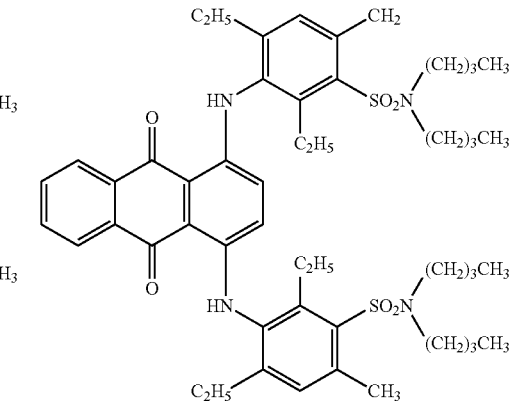
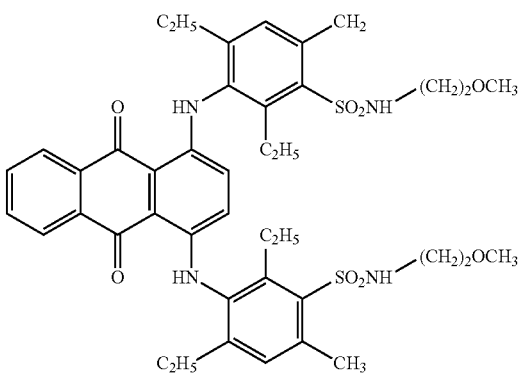

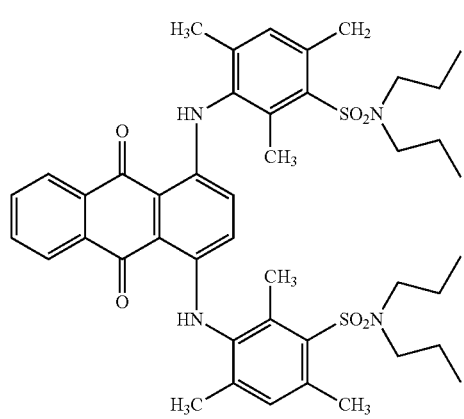

-continued

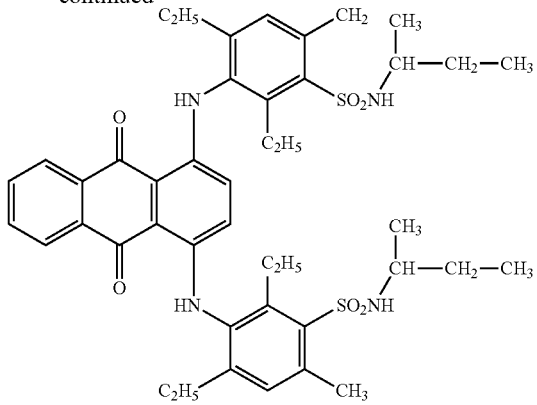

The proportion of the anthraquinone compound to the total amount of all the dye compounds including the specific metal complex compound is preferably 50% by mass or less, and more preferably in the range of 2% by mass to 50% by mass, and even more preferably in the range of 10% by mass to 50% by mass. If the proportion of the anthraquinone compound is 50% by mass or less, the hue of the colored image is good, and the contrast may be more effectively enhanced, while maintaining the toughness.

(Polymerizable Compound)

The colored composition of the present invention preferably includes at least one kind of polymerizable compound. The polymerizable compound is, for example, a polymerizable compound having at least one ethylenically unsaturated double bond, and the polymerizable compound may be selected from components constituting known compositions, and used. Examples thereof include the components described in paragraph Nos. 0010 to 0020 of JP-A No. 2006-23696 and the components described in paragraph Nos. 0027 to 0053 of JP-A No. 2006-64921.

Furthermore, the polymerizable compound is also preferably a urethane-added polymerizable compound prepared using an addition reaction of an isocyanate and a hydroxyl group. Further, urethane acrylates described in JP-A No. S51-37193, JP-B Nos. H02-32293 and H02-16765, and urethane compounds having an ethylene oxide backbone described in JP-B Nos. S58-49860, S56-17654, S62-39417, and S62-39418 are also more preferable.

Other examples of the polymerizable compound include polyfunctional acrylates and methacrylates, such as polyester acrylates, and epoxy acrylates obtained by reacting epoxy resins with (meth)acrylic acids as described in JP-A No. S48-64183, and JP-B Nos. S49-43191 and S52-30490. Further, those introduced as the photocurable monomers and oligomers in Bulletin of Nihon Setchaku Kyokai, Vol. 20, No. 7, pp. 300 to 308 (1984) may be used as well.

Specific examples thereof include pentaerythritol tri(meth) acrylate, pentaerythritol tetra(meth)acrylate, dipentaerythritol penta(meth)acrylate, dipentaerythritol hexa(meth)acrylate, tri((meth)acryloyloxyethyl) isocyanurate, pentaerythritol tetra(meth)acrylate EO-modified products, and dipentaerythritol hexa(meth)acrylate EO-modified products, and preferable examples of its commercially available products include NK Ester A-TMMT, NK Ester A-TMM-3, NK Oligo UA-32P, and NK Oligo UA-7200 (all manufactured by Shin-Nakamura Chemical Co., Ltd.), Aronix M-305, Aronix M-306, Aronix M-309, Aronix M-450, Aronix M-402, and TO-1382 (all manufactured by Toagosei Co., Ltd.) V #802 (manufactured by Osaka Organic Chemical Industry Co., Ltd.), and Kayarad D-330, Kayarad D-320, Kayarad D-310, and Kayarad DPHA (all manufactured by Nippon Kayaku Co., Ltd.).

These polymerizable compounds may be used singly or in combination of two or more kinds thereof.

The content of the polymerizable compound in the total solid content of the colored composition (in the case of two or more kinds, the total content) is preferably from 10% by mass to 80% by mass, more preferably from 15% by mass to 75% by mass, and particularly preferably from 20% by mass to 60% by mass.

(Alkali Soluble Binder)

The alkali soluble binder is not particularly limited as long as it has alkali solubility, and may be preferably selected from the viewpoints of heat resistance, developability, and availability.

Preferably, the alkali soluble binder is a linear organic high-molecular-weight polymer, is soluble in an organic solvent, and is capable of being developed with a weakly alkaline aqueous solution. Examples of such a linear organic high-molecular-weight polymer include polymers having a carboxylic acid group in the side chain, such as methacrylic acid copolymers, acrylic acid copolymers, itaconic acid copolymers, crotonic acid copolymers, maleic acid copolymers, and partially esterified maleic acid copolymers, each described in, for example, JP-A No. S59-44615, JP-B Nos. S54-34327, S58-12577, and S54-25957, and JP-A Nos. S59-53836, and S59-71048. Also, acidic cellulose derivatives having a carboxylic acid group in the side chain are useful.

In addition to those as described above, as the alkali soluble binder in the present invention, an adduct of an acid anhydride and a polymer having a hydroxyl group, a polyhydroxystyrene resin, a polysiloxane resin, poly(2-hydroxyethyl(meth) acrylate), polyvinylpyrrolidone, polyethylene oxide, polyvinyl alcohol, and the like are also useful. Further, the linear organic high-molecular-weight polymer may be formed by the copolymerization of monomers having hydrophilicity, and examples thereof include alkoxyalkyl(meth)acrylate, hydroxyalkyl(meth)acrylate, glycerol(meth)acrylate, (meth) acrylamide, N-methylolacrylamide, secondary or tertiary alkylacrylamide, dialkylaminoalkyl(meth)acrylate, morpholine(meth)acrylate, N-vinylpyrrolidone, N-vinylcaprolactam, vinylimidazole, vinyltriazole, methyl(meth)acrylate, ethyl(meth)acrylate, branched or linear propyl(meth)acrylate, branched or linear butyl(meth)acrylate, and phenoxyhydroxypropyl(meth)acrylate. In addition, a monomer including a tetrahydrofurfuryl group, a phosphoric acid group, a phosphate ester group, a quaternary ammonium salt group, an ethyleneoxy chain, a propyleneoxy chain, a sulfonic acid group or a group derived from a salt thereof, or a morpholinoethyl group, and the like are also useful as the monomer having hydrophilicity.

Moreover, in order to improve the crosslinking efficiency, the alkali soluble binder may have a polymerizable group in a side chain, and a polymer having an allyl group, a (meth)acryloyl group, or an allyloxy alkyl group in a side chain or the like is also useful as the alkali soluble binder. Examples of such a polymer having a polymerizable group include commercial products including DIANAL NR series products (manufactured by Mitsubishi Rayon Co., Ltd.), PHOTOMER 6173 (polyurethane acrylic oligomer containing a COOH group) (manufactured by Diamond Shamrock Co., Ltd.), VISCOAT R-264 and KS RESIST 106 (both manufactured by Osaka Organic Chemical Industry Co., Ltd.), CYCLOMER P series and PLACCEL CF200 series (both manufactured by Daicel Chemical Industries, Ltd.), and EBECRYL 3800 (manufactured by Daicel-Cytec Co., Ltd.). Further, in order to increase the strength of the cured film, alcohol soluble nylon or a polyether of 2,2-bis-(4-hydroxyphenyl)-propane with epichlorohydrin, and the like are also useful.

Among these various alkali soluble binders, a polyhydroxystyrene-based resin, a polysiloxane-based resin, an acrylic resin, an acrylamide-based resin, and an acrylic/acrylamide copolymer resin are preferable from the viewpoint of heat resistance, and an acrylic resin, an acrylamide-based resin, and an acrylic/acrylamide copolymer resin are preferable from the viewpoint of controllability of developability.

Preferable examples of such an acrylic resin include a copolymer comprising a monomer selected from benzyl (meth)acrylate, (meth)acrylic acid, hydroxyethyl(meth)acrylate, and (meth)acrylamide, as well as DIANAL NR series (manufactured by Mitsubishi Rayon Co. Ltd.), KS RESIST-106 (manufactured by Osaka Organic Chemical Industry Ltd.), and CYCLOMER P series and PLACCEL CF200 series (both manufactured by Daicel Chemical Industries, Ltd.).

From the viewpoint of developability and liquid viscosity, the alkali soluble binder is preferably a polymer having a weight average molecular weight (a value in terms of polystyrene measured by using a GPC method) in the range of from 1000 to $2 \times 10^5$, more preferably in the range of from 2000 to $1 \times 10^5$, and particularly preferably in the range of from 5000 to $5 \times 10^4$. These may be used singly or in combination of two or more kinds thereof.

(Photopolymerization Initiator)

The colored composition of the present invention preferably includes at least one kind of photopolymerization initiator. The photopolymerization initiator is not particularly limited as long as it is capable of polymerizing the polymerizable compound. The photopolymerization initiator is preferably selected from the viewpoints of its characteristics, initiation efficiency, absorbing wavelength, availability, cost, and the like.

The photopolymerization initiator is a compound that responds to light for exposure to initiate and promote the polymerization of the polymerizable compound, and preferably a compound that responds to active rays at a wavelength of 300 nm or more to initiate and promote the polymerization of the polymerizable compound. Further, the photopolymerization initiator that does not respond to active rays at a wavelength of 300 nm or more may be preferably used in combination with a sensitizer.

Specific examples of the photopolymerization initiator include an oxime ester compound, an organic halide compound, an oxydiazole compound, a carbonyl compound, a ketal compound, a benzoin compound, an acridine compound, an organic peroxide, an azo compound, a coumarin compound, an azide compound, a metallocene compound, a hexaaryl biimidazole compound, an organic boric acid compound, disulfonic acid compound, an onium salt compound, acyl phosphine (oxide), a benzophenone compound, an acetophenone compound, and derivatives thereof. Among these, in view of sensitivity, an oxime ester compound and a hexaarylbiimidazole compound are preferable.

As the oxime ester compound, the compounds described in JP-A Nos. 2000-80068 and 2001-233842, JP-T No. 2004-534797, WO 2005/080337, WO 2006/018973, JP-A Nos. 2007-210991, 2007-231000, 2007-269779, and 2009-191061, and WO 2009/131189 may be used.

Specific examples of the oxime ester compounds include, but are not limited to, 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, 1-(O-acetyloxime)-1-[9-ethyl-6-(2-butylbenzoyl)-9H-carbazol-3-yl]ethanone, 2-(benzoyloxyimino)-1-[4-(phenylthio)phenyl]-1-octanone, and 2-(acetoxyimino)-4-(4-chlorophenylthio)-1-[9-ethyl-6-(2-methylbenzoyl)-9H-carbazol-3-yl]-1-butanone.

Moreover, in the present invention, a compound represented by the following formula (1) is also suitable as the oxime-based compound from the viewpoints of sensitivity, stability over time, and coloration at a time of post-heating.

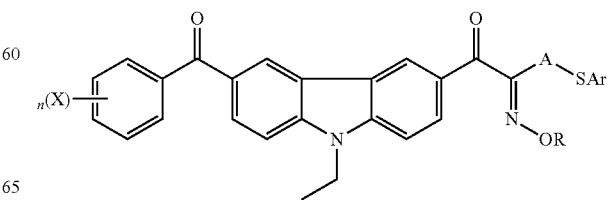

(1)

In formula (1), R and X each independently represent a monovalent substituent, A represents a bivalent organic group, Ar represents an aryl group, and n represents an integer of 0 to 5.

R in formula (1) is preferably an acyl group in view of improvement of sensitivity, and specifically, R is preferably an acetyl group, a propionyl group, a benzoyl group, or a toluoyl group.

A in formula (1) is preferably an unsubstituted alkylene group, an alkylene group substituted with an alkyl group (such as a methyl group, an ethyl group, a tert-butyl group, and a dodecyl group), an alkylene group substituted with an alkenyl group (such as a vinyl group and an allyl group), or an alkylene group substituted with an aryl group (such as a phenyl group, a p-tolyl group, a xylyl group, a cumenyl group, a naphthyl group, an anthryl group, a phenanthryl group, and a styryl group), in view of increasing sensitivity and inhibiting coloration due to heating and storing over time.

Ar in formula (1) is preferably a substituted or unsubstituted phenyl group in view of enhancement of sensitivity and inhibition of coloring due to heating and storing over time. In a case of the substituted phenyl group, preferable examples of the substituent include halogen groups such as a fluorine atom, a chlorine atom, a bromine atom, and an iodine atom.

X in formula (1) is preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent or an amino group which may have a substituent, in view of improvement of solubility in solvents and absorption efficiency in a long wavelength region.

n in formula (1) is preferably an integer of 1 or 2.

Specific examples of the organic halide compound include the compounds described in "Bull Chem. Soc. Japan" 42, 2924 (1969) by Wakabayashi et al., U.S. Pat. No. 3,905,815, JP-B No. S46-4605, JP-A Nos. S48-36281, S55-32070, S60-239736, S61-169835, S61-169837, S62-58241, S62-212401, S63-70243, and S63-298339, "Journal of Heterocyclic Chemistry" 1 (No. 3), (1970)" by M. P. Hutt, and the like, and particularly an oxazole compound and an s-triazine compound substituted with a trihalomethyl group.

Examples of the hexaaryl biimidazole compound include various compounds described in JP-B No. H06-29285, U.S. Pat. Nos. 3,479,185, 4,311,783, 4,622,286, and the like, and specifically, 2,2'-bis(o-chlorophenyl)-4,4',5,5'-tetraphenylbiimidazole,
2,2'-bis(o-bromophenyl)-4,4',5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl)biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole, and
2,2'-bis(o-trifluorophenyl)-4,4',5,5'-tetraphenylbiimidazole.

The photopolymerization initiators may used singly and in combination of two or more kinds thereof. Further, in the case of using an initiator having no absorption at the exposure wavelength, it is necessary to use a sensitizer.

The total content of the photopolymerization initiator is preferably from 0.5% by mass to 30% by mass, more preferably from 2% by mass to 20% by mass, and most preferably from 5% by mass to 18% by mass, based on the total solid content in the colored composition. Within these ranges, the sensitivity during exposure is high and the color characteristics are also good.

(Sensitizer)

A sensitizer may be added to the colored composition of the present invention. Typical examples of the sensitizer that may be used in the present invention include those disclosed in J. V. Crivello, Adv. in Polymer Sci., 62, 1 (1984), specifically including pyrene, perylene, acridine, thioxanthone, 2-chlorothioxanthone, benzoflavin, N-vinylcarbazole, 9,10-dibutoxyanthracene, anthraquinone, benzophenone, coumarin, ketocoumarin, phenanthrene, camphorquinone, and phenothiazine derivatives. The sensitizer is preferably added at a ratio of 50% by mass to 200% by mass, based on the photopolymerization initiator.

(Chain Transfer Agent)

A chain transfer agent may be added to the colored composition of the present invention.

Examples of the chain transfer agent that may be used in the present invention include N,N-dialkylaminobenzoic acid alkyl esters such as N,N-dimethylaminobenzoic acid ethyl ester; mercapto compounds having a heterocyclic ring, such as 2-mercaptobenzothiazole, 2-mercaptobenzoxazole, 2-mercaptobenzoimidazole, N-phenylmercaptobenzoimidazole, 1,3,5-tris(3-mercaptobutyloxyethyl)-1,3,5-triazine-2,4,6(1H,3H,5H)-trione; and aliphatic polyfunctional mercapto compounds such as pentaerythrithol tetrakis(3-mercaptobutyrate) and 1,4-bis(3-mercaptobutylyloxy)butane.

The chain transfer agents may be used singly or in combination of two or more kinds thereof.

The amount of the chain transfer agent added is preferably in the range of 0.01% by mass to 15% by mass, based on the total solid content of the composition of the present invention, from the viewpoint of reducing the sensitivity unevenness, and more preferably from 0.1% by mass to 10% by mass, and particularly preferably from 0.5% by mass to 5% by mass.

(Polymerization Inhibitor)

The colored composition of the present invention may further include a polymerization inhibitor.

The polymerization inhibitor refers to a substance that plays a role in donating hydrogen (or accepting hydrogen), donating energy (or accepting energy), donating an electron (or accepting an electron), or the like to a polymerization initiating species such as radicals generated in a colored photosensitive resin composition by light or heat, thereby deactivating the polymerization initiating species, and thus inhibiting unintended initiation of the polymerization. The polymerization inhibitors described in paragraphs 0154 to 0173 of JP-A No. 2007-334322, or the like may be used.

Among these, preferable examples of the polymerization inhibitor include p-methoxyphenol.

The content of the polymerization inhibitor in the colored composition of the present invention is preferably from 0.0001% by mass to 5% by mass, more preferably from 0.001% by mass to 5% by mass, and particularly preferably from 0.001% by mass to 1% by mass, based on the total mass of the polymerizable compound.

(Organic Solvent)

The colored composition of the present invention may include an organic solvent.

Basically, the organic solvent is not particularly limited as long as the solubility of the respective coexisting components, and coatability of a colored composition are satisfactory, it being preferably selected particularly in consideration of the solubility of solid contents, coatability, and safety.

As the organic solvent, examples of the esters include ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate esters, (e.g.: methyloxyacetate, ethyloxyacetate, butyloxyacetate, (specifically methyl methoxyacetate, ethyl methoxyacetate, butyl methoxyacetate, methyl ethoxyacetate, and ethyl ethoxyacetate)); alkyl 3-oxypropionate esters, 2-oxypropionate alkyl esters, methyl 2-oxy-2-methylpropionate, ethyl 2-oxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate.

Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, methyl 3-ethoxypropionate, and ethyl 3-ethoxypropionate.

Examples of ketones include, for example, methyl ethyl ketone, cyclohexanone, 2-heptanone, and 3-heptanone.

Examples of aromatic hydrocarbons include toluene and xylene.

It is also preferable to mix two or more kinds of the organic solvents from the viewpoints of the solubility of the respective components as described above, the solubility of an alkali soluble binder when the alkali soluble binder is included, and the improvement of the condition of the coated surface. In this case, the organic solvent is particularly preferably a mixed solution including two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

The content of the organic solvent in the colored composition is preferably an amount such that the concentration of the total solid content in the composition is from 5% by mass to 80% by mass, more preferably from 5% by mass to 60% by mass, and particularly preferably from 10% by mass to 60% by mass.

(Surfactant)

The colored photosensitive resin composition of the present invention may further include a surfactant.

As a surfactant, any of anionic, cationic, nonionic, and amphoteric surfactants may be used, but it is preferably a nonionic surfactant. Specific examples thereof include the nonionic surfactants described in paragraph 0058 of JP-A No. 2009-098616, among which fluorine surfactants are preferable.

Examples of other usable surfactants include commercial products such as MEGAFACE F142D, MEGAFACE F172, MEGAFACE F173, MEGAFACE F176, MEGAFACE F177, MEGAFACE F183, MEGAFACE F479, MEGAFACE F482, MEGAFACE F554, MEGAFACE F780, MEGAFACE F781, MEGAFACE F781-F, MEGAFACE R30, MEGAFACE R08, MEGAFACE F-472 SF, MEGAFACE BL20, MEGAFACE R-61, and MEGAFACE R-90 (manufactured by DIC Corporation), FLUORAD FC-135, FLUORAD FC-170C, FLUORAD FC-430, FLUORAD FC-431, and Novec FC-4430 (manufactured by Sumitomo 3M Ltd.), ASAHI GUARD AG7105, 7000, 950, and 7600, SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, and SURFLON SC-106 (manufactured by Asahi Glass Co., Ltd.) and EFTOP EF351, 352, 801, and 802 (manufactured by Mitsubishi Materials Electronic Chemicals Co., Ltd.), and FTERGENT 250 (manufactured by Neos Co., Ltd.).

Moreover, preferable examples of the surfactant include a copolymer including the structural units A and B represented by the following formula (1) and having a weight average molecular weight (Mw) of from 1,000 to 10,000 in terms of polystyrene as measured by gel permeation chromatography using tetrahydrofuran as a solvent.

Structural Unit A

(1)

Structural Unit B

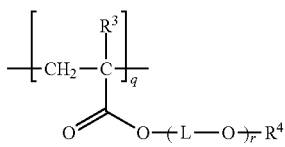

In formula (1), $R^1$ and $R^3$ each independently represent a hydrogen atom or a methyl group, $R^2$ represents a linear alkylene group having 1 to 4 carbon atoms, $R^4$ represents a hydrogen atom or an alkyl group having 1 to 4 carbon atoms, L represents an alkylene group having 3 to 6 carbon atoms, p and q each represent a percentage in terms of weight indicating the polymerization ratio, p represents a numerical value of 10% by mass to 80% by mass, q represents a numerical value of 20% by mass to 90% by mass, r represents an integer of 1 to 18, and n represents an integer of 1 to 10.

L is preferably a branched alkylene group represented by the following formula (2). $R^5$ in formula (2) represents an alkyl group having 1 to 4 carbon atoms, and in terms of compatibility and wettablility to a surface to be coated, it is preferably an alkyl group having 1 to 3 carbon atoms, and more preferably an alkyl group having 2 or 3 carbon atoms. The sum (p+q) of p and q is preferably 100, that is, 100% by mass.

(2)

The weight average molecular weight (Mw) of the copolymer is more preferably from 1,500 to 5,000.

These surfactants may be used singly or in a mixture of two or more kinds thereof. The amount of the surfactant added in the colored composition of the present invention is preferably from 0.01% by mass to 2.0% by mass, and particularly preferably from 0.02% by mass to 1.0% by mass, based on the solid content. Within these ranges, coatability and uniformity of a cured film are improved.

(Adhesion Improver)

The colored composition of the present invention may further include an adhesion improver.

The adhesion improver is a compound that improves adhesion of a cured film to an inorganic material used as a substrate such as glass, a silicon compound such as silicon, silicon oxide, or silicon nitride, gold, copper, aluminum, or the like. Specific examples thereof include a silane coupling agent and a thiol-based compound. The silane coupling agent as an adhesion improver is intended to modify an interface, and any known adhesion improver may be used without limitation.

As the silane coupling agent, the silane coupling agent described in paragraph 0048 of JP-A No. 2009-98616 is preferable, and among these, γ-glycidoxypropyl trialkoxysilane and γ-methacryloxypropyl trialkoxysilane are more preferable. These may be used singly or in combination of two or more kinds thereof.

The content of the adhesion improver in the colored composition of the present invention is preferably from 0.1% by mass to 20% by mass, and more preferably from 0.2% by mass to 5% by mass, based on the amount of the total solid content.

(Crosslinking Agent)

The hardness of the colored cured film formed by curing the colored composition may be further improved by using a crosslinking agent supplementarily in the colored composition of the present invention.

The crosslinking agent is not particularly limited as long as it may cure a film by a crosslinking reaction, and examples thereof include (a) an epoxy resin, (b) a melamine compound, a guanamine compound, a glycoluril compound or a urea compound substituted with at least one substituent selected from a methylol group, an alkoxymethyl group, and an acyloxymethyl group, and (c) a phenol compound, a naphthol compound, or a hydroxyanthracene compound substituted with at least one substituent selected from a methylol group, an alkoxymethyl group, and an acyloxymethyl group. Among these, a polyfunctional epoxy resin is preferable.

With respect to the details of the specific examples of the crosslinking agent, the description in paragraphs 0134 to 0147 of JP-A No. 2004-295116 may be referred to.

(Development Accelerator)

In order to accelerate the alkali solubility of an unexposed area and further improve the developability of the colored composition, a development accelerator may be added. The development accelerator is preferably an organic carboxylic acid compound having a low molecular weight of 1000 or less or a phenol compound having a low molecular weight of 1000 or less.

Specific examples thereof include aliphatic monocarboxylic acids such as formic acid, acetic acid, propionic acid, butyric acid, valeric acid, pivalic acid, caproic acid, diethylacetic acid, enanthic acid, and capric acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cuminic acid, hemellitic acid, and mesitylenic acid; aromatic polycarboxylic acids such as phthalic acid, isophthalic acid, terephthalic acid, trimellitic acid, trimesic acid, mellophanic acid, and pyromellitic acid; phenylacetic acid, hydroatropic acid, hydrocinnamic acid, mandelic acid, phenylsuccinic acid, atropic acid, cinnamic acid, methyl cinnamate, benzyl cinnamate, cinnamylidene acetic acid, coumaric acid, and umbellic acid.

(Other Additives)

As desired, the colored composition of the present invention may include other various additives such as a filler, polymer compounds other than those above, an ultraviolet absorber, an antioxidant or aggregation preventing agents. Examples of these additives include those described in the paragraphs 0155 to 0156 of JP-A No. 2004-295116.

The colored composition of the present invention may include the light stabilizer described in the paragraph 0078 of JP-A No. 2004-295116 or the heat polymerization inhibitor described in the paragraph 0081 of JP-A No. 2004-295116.

<Preparation of Colored Composition>

The embodiment for preparing the colored composition of the present invention is not particularly limited, but it may be prepared by, for example, mixing the above-described respective components such as the specific metal complex compound, the polymerizable compound, and the photopolymerization initiator, and as desired, optional components.

Moreover, during the preparation of the colored composition, the respective components to be included in the colored composition may be mixed at one time, or each of the components may be dissolved or dispersed in a solvent and then combined successively. Further, the order of addition during mixing and the operation conditions are not particularly limited. For example, the composition may be prepared by simultaneously dissolving or dispersing all the components in a solvent, or when needed, the respective components may be suitably prepared as two or more solutions or dispersion liquids that are mixed before use (at the time of coating) to prepare a composition.

Moreover, when the colored composition of the present invention is prepared, it is preferably filtered through a filter after mixing the respective components for the purpose of, for example, removing extraneous substances or reducing defects. A filter conventionally used for filtration and the like may be used without any particular limitation. Specific examples thereof include filters formed of a fluororesin such as PTFE (polytetrafluoroethylene), a polyamide-based resin such as nylon-6 and nylon-6,6, and a polyolefin resin (including a high-density polyolefin and an ultrahigh molecular polyolefin) such as polyethylene and polypropylene (PP). Among these materials, a polyamide-based resin such as nylon-6 and nylon-6,6, or polypropylene (including high-density polypropylene) is preferable.

The pore size of the filter is suitably from about 0.01 μm to 7.0 μm, preferably from about 0.01 μm to 2.5 μm, and more preferably from about 0.01 μm to 2.0 μm. Within this range, fine extraneous substances that inhibit preparation of a uniform colored composition in the later step may be unfailingly removed, and thus, it becomes possible to form a uniform and smooth colored composition.

At the time of using a filter, different filters may be combined. In this case, filtration through a first filter may be performed only once or may be performed two or more times. Further, filters differing in pore size within the range above may be combined to perform the first filtering with the first filter consisting of the plural filters. For the pore size as used herein, the nominal value of filter manufacturer may be referred to. As for the commercially available filter, the filter may be selected from various filters available from, for example, Nihon Pall Corporation, Advantec Toyo Kaisha, Ltd., Nihon Entegris K. K. (the former Nihon Mykrolis Corporation), Kitz Microfilter Corporation, or the like.

As the second filter, a filter formed of the same material or the like as the above-mentioned first filter may be used.

In addition, for example, the filtering through the first filter may be perform for only a pigment dispersion, and after mixing other components with the pigment dispersion to give a colored composition, the second filtering may be performed.

The colored composition of the present invention may be applied to various applications such as a color filter for a solid-state imaging device, a color filter for a liquid crystal display device, an ink for printing, and an ink for ink jet.

Particularly, since the colored cured film obtained by curing the colored composition of the present invention has a high color purity, a high absorption coefficient in a thin layer, and excellent toughness (particularly heat resistance and light resistance), it is useful for forming colored pixels in a color filter for a liquid crystal display device, and a color filter for a solid-state imaging device. In addition, when the colored cured film is applied to a liquid crystal display device, an excellent voltage retention rate when a voltage is applied can be obtained.

<<Color Filter and Method for Producing the Same>>

The color filter of the present invention is configured by providing, on a support, a colored region (colored cured film) formed by the colored composition of the present invention.

The colored region on the support is constituted with, for example, Red (R), Green (G), and Blue (B) colored films constituting the respective pixels of the color filter.

The color filter of the present invention may be formed by any method by which a patterned colored cured region (colored cured film) including the specific metal complex compound can be formed. The color filter of the present invention is preferably prepared using the method for producing the color filter of the present invention.

The method for producing the color filter of the present invention includes a step of applying the colored composition of the present invention onto a support to form a colored composition layer (hereinafter also referred to as a step (A)) and a step of patternwise exposing the formed colored composition layer (preferably through a mask) and developing it to form a patterned colored region (colored cured film) (hereinafter also referred to as a step (B)).

By undergoing these steps plural times, a colored pattern including pixels in the respective colors (three or four colors) is formed, from which a color filter may be obtained.

Moreover, in a preferable embodiment, the method for producing the color filter of the present invention further includes, in particular, a step of irradiating the patterned colored region formed in the step (B) with ultraviolet rays (hereinafter also referred to as a step (C)) and a step of subjecting the colored region irradiated with ultraviolet rays to a heating treatment (hereinafter also referred to as a step (D)).

By such a method, a high-quality color filter to be used in a liquid crystal display device or a solid-state imaging device may be prepared at low cost with less difficulty in processes.

The method for producing the color filter of the present invention will be described more specifically below.

—Step (A)—

In the method for producing the color filter of the present invention, the colored composition of the present invention as mentioned above is first applied onto a support directly or via another layer by a desired method to form a coating film including the colored composition (colored composition layer), and then, as desired, subjected to preliminary curing (pre-baking) to dry the colored composition layer.

Examples of the support include alkali-free glass, soda glass, Pyrex (registered trademark) glass, and quartz glass, that are used for liquid crystal display devices, and substrates with a transparent conductive layer adhered thereto, and photoelectric conversion element substrates used for a solid-state imaging device and the like, for example, a silicon substrate and a plastic substrate. Further, on these supports, a black matrix separating each pixel may be formed and/or a transparent resin layer may be provided in order to promote adhesion and the like. In addition, as desired, an undercoating layer may be formed on these supports in order to improve adhesion to the upper layer, prevent diffusion of the materials, or planarize the surface.

Furthermore, a gas barrier layer and/or a solvent resistant layer is/are preferably provided on the surface of plastic substrates.

A color filter may also be prepared by forming a colored pattern using the colored composition of the present invention on a driving substrate (hereinafter also referred to as "TFT mode liquid crystal driving substrate") provided with a thin film transistor (TFT) of a thin film transistor (TFT) mode color liquid crystal display device.

Examples of the substrate in the TFT mode liquid crystal driving substrate include glass, silicon, polycarbonate, polyester, aromatic polyamide, polyamide imide, and polyimide. These substrates may be subjected, as desired, to a suitable pretreatment such as a chemical treatment with a silane coupling agent or the like, a plasma treatment, ion plating, sputtering, a gaseous phase reaction method, and vacuum deposition. For example, a TFT mode liquid crystal driving substrate having on the surface thereof a passivation film such as a silicon nitride film may be used.

Examples of the method for applying the colored composition of the present invention on a support include coating methods using spin coating, slit coating, cast coating, roll coating, bar coating, and ink jetting.

In the step (A), the method for applying the colored composition of the present invention onto a support is not particularly limited, but a method using a slit nozzle (hereinafter referred to as "slit nozzle coating method"), such as a slit-and-spin method and a spin-less coating method, is preferable.

In the slit nozzle coating method, the slit-and-spin coating method and the spin-less coating method are carried out under various conditions depending on the size of a substrate onto which the composition is applied. For example, when a fifth-generation glass substrate (1100 mm×1250 mm) is coated by the spin-less coating method, the amount of the colored composition discharged from a slit nozzle is usually from 500 μL/sec to 2000 μL/sec, and preferably from 800 μL/sec to 1500 μL/sec, and the coating speed is usually from 50 mm/sec to 300 mm/sec, and preferably from 100 mm/sec to 200 mm/sec.

Furthermore, the solid content of the colored composition used in the step (A) is usually from 10% by mass to 20% by mass, and preferably from 13% by mass to 18% by mass.

In the step (A), usually, after forming the colored composition layer, a pre-baking treatment is performed. If desired, a vacuum treatment may be performed before the pre-baking Vacuum drying is conducted under the conditions where the degree of vacuum is usually from about 0.1 torr to 1.0 torr, and preferably from about 0.2 torr to 0.5 torr.

Examples of the conditions for pre-baking include conditions in which heating is performed at 70° C. to 130° C. for 0.5 minutes to 15 minutes, using a hot plate or an oven.

Furthermore, the thickness of a colored composition layer formed from the colored composition is suitably selected according to the purpose. The thickness for a color filter for a liquid crystal display device is preferably in the range of 0.2 μm to 5.0 μm, more preferably in the range of 1.0 μm to 4.0 μm, and most preferably in the range of 1.5 μm to 3.5 μm.

Further, the thickness for a color filter for a solid-state imaging device is preferably in the range of 0.2 μm to 5.0 μm, more preferably in the range of 0.3 μm to 2.5 μm, and most preferably in the range of 0.3 μm to 1.5 μm.

Furthermore, the thickness of the colored composition layer is a film thickness after the pre-baking.

—Step (B)—

Subsequently, in the method for producing the color filter of the present invention, a coating film (colored composition layer) including the colored composition formed on a support as above is subjected to exposure using, for example, a photomask. As the light or radiation that may be applied for the exposure, g-line, h-line, i-line, j-line, KrF light, and ArF light are preferable, and i-line is particularly preferable. In a case in which i-line is used as irradiated light, it is preferable to irradiate light at an exposure dose of 100 mJ/cm$^2$ to 10000 mJ/cm$^2$.

Furthermore, as other rays for exposure, an ultrahigh, high, medium, or low pressure mercury lamp, a chemical lamp, a carbon arc lamp, a xenon lamp, a metal halide lamp, various visible and ultraviolet laser sources, a fluorescent lamp, a tungsten lamp, sunlight, or the like may be used.

~Exposure Step Using Laser Light Source~

In an exposure system using a laser light source, an ultraviolet laser is preferably used as a light source.

The irradiated light is preferably an ultraviolet laser having a wavelength in the range of 300 nm to 380 nm, and more preferably in the range of 300 nm to 360 nm, from the viewpoint that the irradiated light matches the photosensitive wavelength of a resist. Specifically, in particular, a third harmonic (355 nm) of an Nd:YAG solid laser that has high output and is relatively inexpensive, and XeCl (308 nm) or XeF (353 nm) excimer lasers may be suitably used.

The exposure dose of a product to be exposed (pattern) is preferably in the range of 1 mJ/cm$^2$ to 100 mJ/cm$^2$, and more preferably in the range of 1 mJ/cm$^2$ to 50 mJ/cm$^2$. This range of the exposure dose is preferable from the viewpoints of productivity in the pattern formation.

The exposing device is not particularly limited, and as a commercially available exposing device, CALLISTO (manufactured by V Technology Co., Ltd.), EGIS (manufactured by V Technology Co., Ltd.), DF2200G (manufactured by Dainippon Screen Mfg. Co., Ltd.), or the like may be used. Further, other devices may also be preferably used.

When the color filter for a liquid crystal display device is produced, it is preferable to use light exposure using mainly h-line or i-line with a proximity light exposing machine or a mirror projection light exposing machine. Further, when producing the color filter for a solid-state imaging device, it is preferable to use mainly i-line with a stepper light exposing machine. In addition, when the color filter is produced using a TFT mode liquid crystal driving substrate, as a photomask to be used, a photomask is used in which a pattern for forming a through-hole or a U-shaped depression is provided in addition to a pattern for forming pixels (colored pattern).

The colored composition layer exposed as above may be heated.

Furthermore, exposing may be carried out while nitrogen gas is flowed in a chamber in order to suppress oxidation discoloration of the color material in the colored composition layer.

Subsequently, the colored composition layer after the exposure is developed using a developing liquid. In this manner, a negative-type or positive-type color pattern (resist pattern) may be formed. In the developing step, an uncured area of the coating film after the exposure is eluted with a developing liquid and thus, only a cured fraction remains on the substrate.

Any developing liquid that dissolves the coating film of the colored composition (colored composition layer) in the uncured area while not dissolving the cured area may be used. For example, a combination of various organic solvents or an alkaline aqueous solution may be used.

Examples of the organic solvent used for the development include the solvents as described above to be used when the colored composition of the present invention is produced.

Examples of the alkaline aqueous solution include alkaline aqueous solutions in which an alkaline compound such as sodium hydroxide, potassium hydroxide, sodium carbonate, sodium hydrogen carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene, is dissolved at a concentration from 0.001% by mass to 10% by mass, and preferably from 0.01% by mass to 1% by mass. In a case in which the developing liquid is an alkaline aqueous solution, the alkali concentration may be preferably adjusted to pH 11 to 13, and more preferably to pH 11.5 to 12.5.

To the alkaline aqueous solution, a suitable amount of a water soluble organic solvent such as methanol and ethanol, a surfactant, and the like may be added.

The developing temperature is usually from 20° C. to 30° C., and the developing time is from 20 seconds to 90 seconds.

The development system may be any of a dipping system, a shower system, and a spray system, which may be combined with a swing system, a spinning system, an ultrasonic system, or the like. Before being brought into contact with the developing liquid, the surface to be developed may previously be moistened with water or the like in order to prevent uneven development. Further, the substrate may be inclined for the development.

Further, in a case of preparing a color filter for a solid-state imaging device, paddle development may also be used.

After the development, the film is subjected to a rinsing treatment for washing and removing an excess of the developing liquid, followed by drying and subsequent heat treatment (post-baking) to ensure complete curing.

The rinsing step is usually carried out with pure water, but for saving a rinsing liquid, pure water may be used in final washing, and when washing is initiated, the used pure water may be used, or the substrate may be inclined for washing, or ultrasonic irradiation may also be used during washing.

After the rinsing treatment, and subsequent dehydrating and drying, a heating treatment is usually carried out at about 200° C. to 250° C. The coating film after the development may be subjected to a heating treatment (post-baking) in a continuous or batch system under the above-mentioned conditions with a heating means such as a hot plate, a convection oven (hot air-circulating dryer), and a high-frequency heater.

By carrying out each of the steps described above repeatedly for each color in accordance with the number of desired hues, a color filter having colored cured films (colored pattern) having a plurality of colors formed thereon is prepared.

—Step (C)—

In the method for producing the color filter of the present invention, in particular, the patterned colored region (colored pixels) which is formed using the colored composition may be subjected to post-exposure by irradiation with ultraviolet rays.

—Step (D)—

The patterned colored region that has been subjected to the post-exposure by irradiation with ultraviolet rays as described above is preferably further subjected to a heating treatment. By subjecting the colored region thus formed to a heating treatment (a so-called post-baking treatment), the colored region may be further cured. This heating treatment may be carried out by, for example, a hot plate, various heaters, an oven, or the like.

The temperature during the heating treatment is preferably from 100° C. to 300° C., and more preferably from 150° C. to 250° C. Further, the heating time is preferably from 10 minutes to 120 minutes.

The patterned colored region thus obtained constitutes the pixels in the color filter. In the preparation of a color filter having pixels with plural hues, the steps (A) and (B), and as desired, the steps (C) and (D) may be repeated according to the number of desired colors.

Furthermore, every time when the formation of a colored composition layer having a single color, the exposure, and the development are completed (every one color), the step(s) (C) and/or (D) may be carried out, or after the formation of all the colored composition layers having a desired number of colors, the exposure, and the development are completed, the step(s) (C) and/or (D) may be carried out, collectively.

Since the colored composition of the present invention is used, the color filter obtained by the method for producing the color filter of the present invention (color filter of the present invention) provides vivid colors and high contrast when an image is displayed, and the color filter has excellent toughness (in particular, heat resistance and light resistance) and voltage retention rate.

The color filter of the present invention can be used in a liquid crystal display device or a solid-state imaging device, and is suitable, in particular, in the applications of a liquid crystal display device. When it is used in a liquid crystal display device, it is possible to display an image having excellent spectroscopic characteristics and contrast while using a dye as a colorant and accomplishing good hues, and furthermore, its voltage retention rate is also excellent.

With respect to the application of the colored composition of the present invention, although explanation is mainly given focusing on application to formation of a colored pattern of a color filter, the colored composition is also applicable to formation of a black matrix separating colored patterns (pixels) constituting a color filter.

The black matrix may be formed on a substrate by carrying out each of the processes of applying, exposure, and development using a colored composition including processed pigments of black pigments, such as carbon black and titanium black, and then, as desired, post-baking <<Liquid Crystal Display Device>>

The liquid crystal display device of the present invention includes the color filter of the present invention as described above.

In a case in which the color filter of the present invention is used in a liquid crystal display device, although a metal complex dye having excellent spectroscopic characteristics and heat resistance is included as a colorant, the voltage retention rate at the time of applying voltage is not decreased, the orientation defect of liquid crystal molecules due to a decrease in specific resistance is suppressed, and the color tone of the image displayed is good and the display characteristics are excellent.

Therefore, the liquid crystal display device including the color filter of the present invention may display a high quality image having a good color tone and excellent display characteristics.

The definition of a display device and the details of each display device are given, for example, in "Electronic Display Devices" (published by Akio Sasaki, Kogyo Chosakai Publishing Co., Ltd., 1990), "Display Devices" (edited by Sumiaki Ibuki, published by Sangyo Tosho Publishing Co., Ltd., 1989), and the like. The liquid crystal display devices are described, for example, in "Next Generation Liquid Crystal Display Techniques" (edited by Tatsuo Uchida, published by Kogyo Chosakai Publishing Co., Ltd., 1994). Liquid crystal display devices to which the present invention may be applied are not particularly limited, and the present invention may be used for various liquid crystal display devices such as those described, for example, in "Next Generation Liquid Crystal Display Techniques".

The color filter in the present invention may be used in a color TFT mode liquid crystal display device. The details of the color TFT mode liquid crystal display devices are described, for example, in "Color TFT Liquid Crystal Displays" (published by Kyoritsu Shuppan Co., Ltd., 1996). Further, the present invention may be applied to a liquid crystal display device with a wider view angle such as an in-plane switching (IPS) system or a multi-domain vertical alignment (MVA) system, or STN, TN, VA, OCS, FFS, R-OCB, and the like.

Moreover, the color filter in the present invention may also be applied to a COA (Color-filter On Array) mode, which has high luminance and high definition. In the COA mode liquid crystal display device, the color filter layer may be required to satisfy the normal required characteristics as mentioned above, and further the required characteristics for an interlayer dielectric film such as a low dielectric constant and resistance to a removal liquid. The color filter according to the present invention, which is formed using a dye having excellent hue, exhibits excellent color purity and light transmittance, and has a color pattern (pixels) with excellent color. Therefore, the color filter according to the present invention may provide a COA mode liquid crystal display device with high resolution and excellent long-term durability. In order to satisfy the required characteristics of a low dielectric constant, a resin coating may be provided on the color filter layer.

These image display modes are described, for example, on page 43 of "EL, PDP, LCD Displays—Trends in Techniques and Markets" (published by Research Study Division of Toray Research Center, Inc., 2001) and the like.

The liquid crystal display device including the color filter in the present invention includes not only the color filter in the present invention but also various members such as an electrode substrate, a polarization film, a phase difference film, a back light, a spacer, and a view angle compensation film. The color filter of the present invention may be applied to a liquid crystal display device including these various known members. These members are described, for example, in "94 Market for Liquid Crystal Display Related Materials and Chemicals" (Kentaro Shima, published by CMC Publishing Co., Ltd., 1994), and "2003 Current State and Outlook for Liquid Crystal Related Markets" (Ryokichi Omote, published by Fuji Chimera Research Institute, Inc., 2003).

Back lights are described, for example, in SID meeting Digest 1380 (2005) (A. Konno et. al) and Monthly Display, December, 2005, pp. 18 to 24 (Hiroyasu Shima) and pp. 25 to 30 (Takaaki Yagi).

When the color filter in the present invention is used in a liquid crystal display device, high-contrast display may be achieved in combination with a conventionally known three-wavelength cold-cathode tube. Further, by using red, green and blue LED light sources (RGB-LED) as a back light, a liquid crystal display device having high luminance, high color purity, and good color reproducibility may be provided.

<<Solid-State Imaging Device>>

The solid-state imaging device of the present invention includes the color filter of the present invention as described above.

The configuration of the solid-state imaging device of the present invention is a configuration including the color filter of the present invention, and is not particularly limited as long as it functions as a solid-state imaging device. Examples thereof include the following configurations.

Examples of the configuration include a configuration in which plural photodiodes constituting a light-receiving area of a solid-state imaging device (a CCD image sensor, a CMOS image sensor, and the like) and a transfer electrode formed of polysilicon or the like are provided on a support, a light-shielding film including tungsten and the like having openings in the light-receiving area only of the photodiode is provided on the photodiode and the transfer electrode, a device protecting film including silicon nitride, formed so as to cover the entire surface of the light-shielding film and the light-receiving area of the photodiode, is provided on the light-shielding film, and the color filter of the present invention is provided on the device protecting film.

In addition, the configuration may be a configuration in which a light-collecting means (for example, a microlens, which shall apply hereinafter) is provided under a color filter (at the side closer to a support) on the device protecting layer or a configuration in which a light-collecting means is provided on a color filter.

EXAMPLES

Hereinafter, the present invention will be specifically described with reference to Examples, but the present invention is not limited to the Examples below as long as it does not depart from the subject matter. Further, "parts" and "%" are based on mass unless indicated otherwise.

Example 1

Synthesis of Specific Metal Complex Compound

Synthesis Example of Exemplary Compounds A-3 and A-10

According to the following reaction scheme A, the exemplary compounds A-3 and A-10 described above as specific examples of the specific metal complex compound were synthesized.

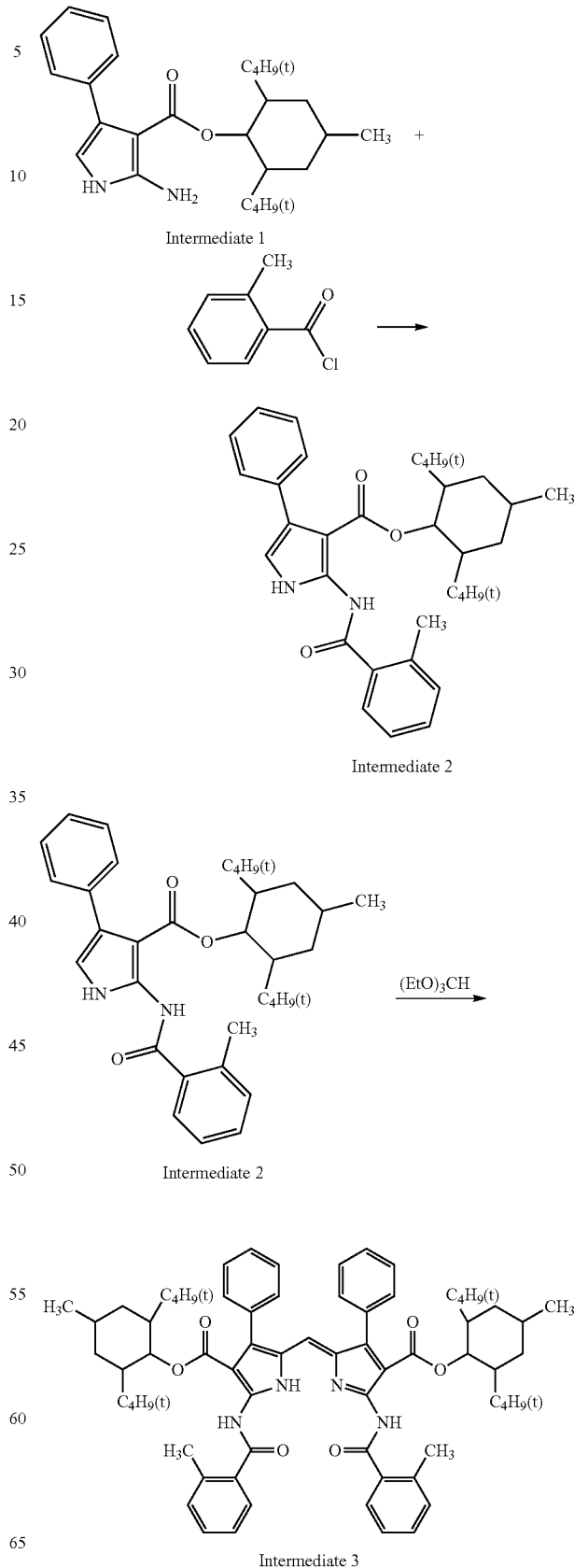

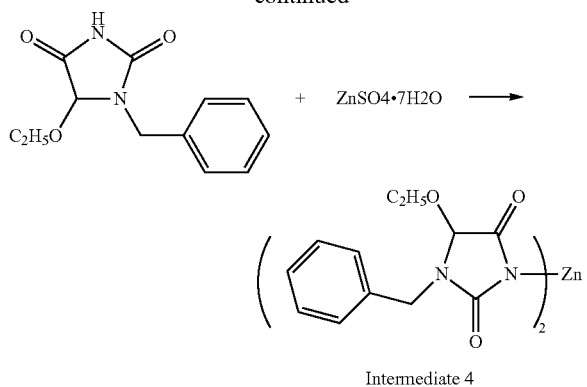

Intermediate 4

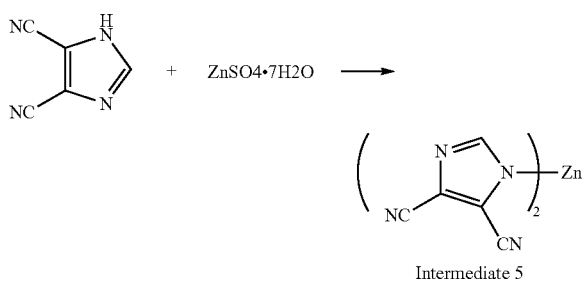

Intermediate 5

Intermediate 3 + Intermediate 4 ⟶

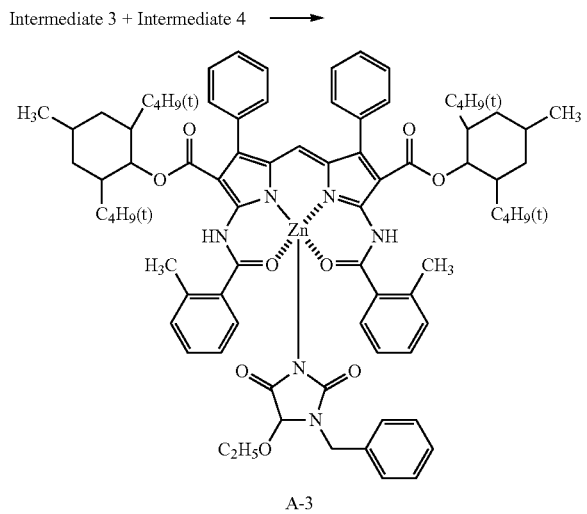

A-3

Intermediate 3 + Intermediate 5 ⟶

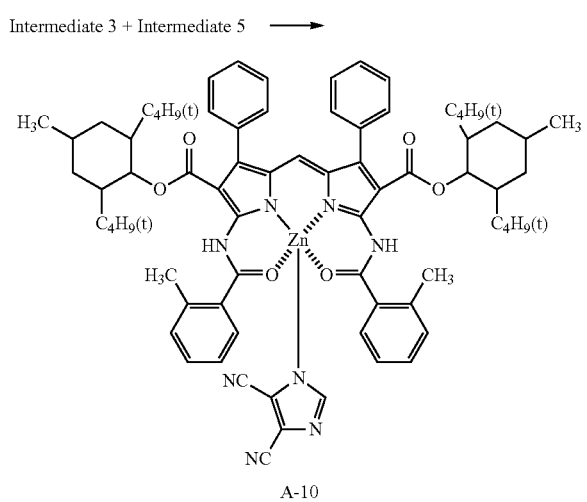

A-10

(Synthesis of Intermediate 1)

The intermediate 1 was synthesized by the method described in U.S. Patent Application Publication No. 2008/0076044.

Intermediates 2 to 5, and the exemplary compounds A-3 and A-10 were synthesized in the following manner.

(Synthesis of Intermediate 2)

To 225.8 g (0.55 mol) of the intermediate 1 obtained by the method described in U.S. Patent Application Publication No. 2008/0076044 was added 690 ml of acetonitrile, followed by stirring under ice-cooling. To this solution was added dropwise 93.5 g (0.61 mol) of o-toluoyl chloride. Thereafter, to this liquid was added dropwise 52.2 g (0.66 mol) of pyridine, followed by stirring for 1 hour under ice-cooling, and stirring for 2 hours at room temperature. After completion of the reaction, the precipitated solid was filtered, and the solid was washed with acetonitrile and dried. Thus, 229 g (yield: 79%) of the intermediate 2 was obtained.

Furthermore, the details of $^1$H-NMR (CDCl$_3$) as measured with respect to the obtained intermediate 2 were as follows: δ: 11.04 (d, 2H), 7.64 (d, 1H), 7.45 to 7.23 (m, 8H), 6.37 (d, 1H), 5.86 (s, 1H), 2.60 (s, 3H), 1.27 to 1.12 (m, 3H), 1.06 to 0.92 (m, 2H), 0.84 (s, 18H), 0.70 (d, 3H), 0.63 to 0.47 (m, 2H).

(Synthesis of Intermediate 3)

To 420 ml of acetic anhydride were added 222.1 g (0.42 mol) of the intermediate 2 and 31.1 g (0.21 mol) of triethyl orthoformate, followed by stirring at room temperature. To this solution was added dropwise 630 ml of trifluoroacetic acid, followed by stirring at room temperature for 3 hours. After completion of the reaction, the reaction liquid was poured into a solution formed by adding 940 g of sodium hydrogen carbonate to 6400 ml of water, followed by extraction with 3200 ml of ethyl acetate and neutralization with a saturated aqueous sodium hydrogen carbonate solution. The solution was dried over sodium sulfate and filtered, and the filtrate was concentrated under reduced pressure. To the obtained solid was added 2600 ml of methanol, followed by heating and stirring at 60° C. for 1 hour, then filtering without cooling, and washing with methanol again, and the obtained solid was dried. Thus, 170.3 g (76%) of the intermediate 3 was obtained.

Furthermore, the details of $^1$H-NMR (CDCl$_3$) as measured with respect to the obtained intermediate 3 were as follows: δ: 11.10 (s, 2H), 7.72 (d, 2H), 7.39 to 7.13 (m, 16H), 6.12 (s, 1H), 5.85 (s, 2H), 2.70 (s, 6H), 1.29 to 1.08 (m, 6H), 1.02 to 0.92 (m, 4H) 0.80 (s, 36H), 0.64 (d, 6H), 0.44 to 0.31 (m, 4H).

(Synthesis of Intermediate 4)

To 30 ml of methanol were added 15.46 g (0.066 mol) of 1-benzyl-5-ethoxyhydantoin and 12.73 g (0.066 mol) of a 28% sodium methoxide methanol solution, followed by stirring at room temperature. To this liquid was added a solution formed by dissolving 8.63 g (0.03 mol) of zinc sulfate heptahydrate in 50 ml of water, followed by stirring at room temperature for 2 hours. After completion of stirring, the precipitated solid was filtered and the solid was washed with water, and dried. Thus, 15.4 g (97%) of the intermediate 4 was obtained.

Furthermore, the details of $^1$H-NMR (CDCl$_3$) as measured with respect to the obtained intermediate 4 were as follows: δ: 7.30 to 7.20 (m, 10H), 4.84 to 4.68 (m, 4H), 4.17 to 4.12 (m, 2H), 3.59 to 3.24 (m, 4H), 1.26 to 0.96 (m, 6H).

(Synthesis of Intermediate 5)

To 100 ml of methanol were added 7.8 g (0.066 mol) of 4,5-dicyanoimidazole, and 12.73 g (0.066 mol) of a 28% sodium methoxide methanol solution, followed by stirring at room temperature. To this liquid was added a solution formed by dissolving 8.63 g (0.03 mol) of zinc sulfate heptahydrate in 50 ml of water, followed by stirring at room temperature for 2 hours. After completion of stirring, the precipitated solid was filtered and the solid was washed with water and dried to obtain 8.1 g (90%) of the intermediate 5.

Furthermore, the details of $^1$H-NMR (CDCl$_3$) as measured with respect to the obtained intermediate 5 were as follows: δ: 1.25 (s, 2H).

(Synthesis of Exemplary Compound A-3)

To 50 ml of tetrahydrofuran was added 5.34 g (5 mmol) of the intermediate 3, followed by stirring at room temperature, and to this liquid was added 3.72 g (7 mmol) of the intermediate 4, followed by stirring for 3 hours. Subsequently, the insolubles were filtered off and then the filtrate was evaporated to obtain crude A-3. Then, to the crude A-3 was added 50 ml of methanol, followed by heating and stirring at 50° C. for 1 hour and then filtering, which was repeated three times. The solid thus obtained was dried to obtain 6.5 g (95%) of the exemplary compound A-3.

Furthermore, the details of $^1$H-NMR (CDCl$_3$) as measured with respect to the obtained exemplary compound A-3 were as follows: δ: 11.62 (s, 2H), 7.78 (d, 2H), 7.45 to 7.19 (m, 21H), 6.38 (s, 1H), 5.87 (s, 2H), 4.76 to 4.72 (m, 2H), 4.15 (d, 1H), 3.42 to 3.37 (m, 1H), 3.25 to 3.20 (m, 1H), 2.64 (d, 6H), 1.28 to 1.14 (m, 6H), 1.01 to 0.94 (m, 7H), 0.87 (s, 18H), 0.75 (s, 18H), 0.65 (d, 6H), 0.57 to 0.48 (m, 2H), 0.27 to 0.15 (m, 2H).

Furthermore, the molar absorption coefficient (∈) of the obtained compound in the ethyl acetate solution was measured using a spectrophotometer (UV-1800 PC, manufactured by Shimadzu Corporation), and the absorbance (Abs) at the maximum absorption wavelength (λmax) was normalized to 1.0 and the absorbance at 450 nm was evaluated.

The maximum absorption wavelength λmax and the molar absorption coefficient (∈) of the exemplary compound A-3 were 558 nm and 137000, respectively. Further, the results of the absorbance (Abs value), the maximum absorption wavelength λmax, and the molar absorption coefficient (∈) are shown in Table 1 below.

(Synthesis of Exemplary Compound A-10)

To 50 ml of tetrahydrofuran was added 5.34 g (5 mmol) of the intermediate 3, followed by stirring at room temperature, and to this liquid was added 2.1 g (7 mmol) of the intermediate 5, followed by stirring at 50° C. for 3 hours. Subsequently, the insolubles were filtered off and then the filtrate was evaporated to obtain a crude A-10. Then, to the crude A-10 was added 50 ml of methanol, followed by heating and stirring at 50° C. for 1 hour and then filtering, which was repeated three times. The solid thus obtained was dried to obtain 5.8 g (93%) of the exemplary compound A-10.

Furthermore, the details of $^1$H-NMR (CDCl$_3$) as measured with respect to the obtained exemplary compound A-10 were as follows: δ: 11.90 (s, 2H), 7.79 (d, 2H), 7.55 to 7.14 (m, 16H), 6.42 (s, 1H), 5.87 (s, 2H), 2.65 (d, 6H), 1.28 to 1.20 (m, 7H), 1.03 to 0.99 (m, 4H), 0.83 (d, 36H), 0.68 (d, 6H), 0.48 to 0.21 (m, 4H).

In addition, by the same method as the case with the exemplary compound A-1, the maximum absorption wavelength λmax and the molar absorption coefficient (∈) were measured. The maximum absorption wavelength λmax and the molar absorption coefficient (∈) of the exemplary compound D-2 were 558 nm and 135000.

Example 2

By a method similar to the reaction scheme in Example 1, the respective exemplary compounds (specific metal complex compounds) shown in Table 1 below were synthesized, and also, by the same method as in Example 1, the compounds were identified, and the maximum absorption wavelength λmax and molar absorption coefficient (∈) thereof were measured.

The measurement results and the results of the exemplary compounds obtained in Example 1 are shown in Table 1.

TABLE 1

| Exemplary compound | ∈ | λmax (nm) | Abs value at 450 nm with normalization of Abs = 1.0 at λmax |
|---|---|---|---|
| A-1 | 134000 | 558 | 0.006 |
| A-2 | 129000 | 558 | 0.012 |
| A-3 | 137000 | 558 | 0.009 |
| A-4 | 128000 | 558 | 0.007 |
| A-5 | 133000 | 558 | 0.015 |
| A-6 | 131000 | 558 | 0.023 |
| A-8 | 130000 | 558 | 0.021 |
| A-9 | 128000 | 558 | 0.013 |
| A-10 | 135000 | 558 | 0.008 |
| A-11 | 138000 | 560 | 0.011 |
| A-12 | 139000 | 560 | 0.011 |
| A-15 | 132000 | 560 | 0.006 |
| A-18 | 112000 | 555 | 0.056 |
| A-21 | 131000 | 559 | 0.013 |
| A-24 | 130000 | 559 | 0.007 |
| A-25 | 129000 | 558 | 0.013 |
| A-28 | 127000 | 558 | 0.021 |
| A-34 | 129000 | 563 | 0.008 |
| A-38 | 122000 | 550 | 0.064 |
| A-57 | 113000 | 559 | 0.025 |
| A-64 | 116000 | 551 | 0.045 |
| A-80 | 122000 | 558 | 0.026 |

From the results shown in Table 1, it was found that the compound of the present invention has a high molar absorption coefficient (∈), a low absorbance at 450 nm, and excellent color separation, and is suitable for a color filter.

<Examples of Colored Composition and Color Filter>

Examples and Comparative Examples of the colored compositions including the specific metal complex compounds synthesized above and the color filters obtained using the colored compositions are shown below.

Example 3

First, the respective components used in the preparation of the respective colored compositions including the colored compositions of the present Examples are shown below.

(S-1) A pigment dispersion liquid obtained by mixing 12.8 parts of C. I. Pigment Blue 15:6 and 7.2 parts of an acrylic pigment dispersant with 80.0 parts of propylene glycol monomethyl ether acetate, and sufficiently dispersing the pigment using a bead mill.

(T-1) Polymerizable Compound: Kayarad DPHA (manufactured by Nippon Kayaku Co., Ltd.)

(U-1) Binder Resin: Propylene glycol monomethyl ether acetate solution (solid content 40.0% by mass) of benzyl methacrylate/methacrylic acid (75/25 [mass ratio]) copolymer (weight average molecular weight: 12,000)

(V-1) Photopolymerization initiator:
2-(Benzoyloxyimino)-1-[4-(phenylthio)phenyl]-1-octanone
(V-2) Photopolymerization initiator:
2-(Acetoxyimino)-4-(4-chlorophenylthio)-1-[9-ethyl-6-(2-methylbenzoyl)-9H-carbazol-3-yl]-1-butanone
(W-1) Photopolymerization initiation auxiliary agent:
4,4'-Bis(diethylamino)benzophenone
(X-1) Solvent: Propylene glycol monomethyl ether acetate
(X-2) Solvent: Ethyl 3-ethoxypropionate (Y-1) Surfactant: MEGAFACE F781-F (manufactured by DIC Corporation)

—B1. Preparation of Colored Composition (Coating Liquid)—

The components having the following composition were mixed to prepare a colored composition 1.

<Composition>

| | |
|---|---|
| Specific metal complex compound: Exemplary compound A-1 | 6.9 parts |
| (Dipyrromethene Metal Complex Compound) | |
| Pigment dispersion liquid: (S-1) | 43.0 parts |
| Polymerizable compound: (T-1) | 103.4 parts |
| Binder resin: (U-1) | 212.2 parts |
| (Value in terms of solid content: 84.9 parts) | |
| Photopolymerization initiator: (V-1) | 21.2 parts |
| Photosensitizer: (W-1) | 3.5 parts |
| Organic solvent: (X-1) | 71.9 parts |
| Organic solvent: (X-2) | 3.6 parts |
| Surfactant: (Y-1) | 0.06 parts |

—B2. Preparation of Color Filter using Colored Composition, and Evaluation—

The colored composition 1 (color resist liquid) obtained in B1. above was coated on a 100 mm×100 mm glass substrate (1737, manufactured by Corning Inc.) so that an x value as an index of a color density became 0.150, and dried in an oven at 90° C. for 60 seconds (pre-baking) Thereafter, the coating film was exposed at 200 mJ/cm² (illuminance 20 mW/cm²) by a high-pressure mercury lamp through a photomask having a mask hole width of 10 μm to 100 μm for evaluation of a resolution, and the coating film after the exposure was covered with a 1% aqueous solution of an alkali developing liquid CDK-1 (manufactured by Fujifilm Electronic Materials Co., Ltd.), and pure water was sprayed thereonto in a shower-like manner to wash out the developing liquid. Then, the coating film which had been subjected to exposure and development as described above was heat-treated in an oven at 220° C. for 1 hour (post-baking), and a patterned colored cured film for a color filter was formed on the glass substrate to prepare a colored filter substrate 1 (color filter 1).

—Evaluation—

The following evaluations on the colored filter 1 obtained above were carried out. The evaluation results are shown in Table 2 below.

<1. Heat Resistance>

For a heat resistance test, the color filter 1 was heated by a hot plate at 250° C. for 10 minutes. Then, a ΔE*ab value that was a color difference between before and after the heat resistance test was measured using a colorimeter (trade name: MCPD-1000; manufactured by Otsuka Electronics Co., Ltd.) and was evaluated in accordance with the following criteria. A smaller ΔE*ab value indicates a better heat resistance.

Evaluation Criteria
5: ΔE*ab value<3
4: 3≤ΔE*ab value<5
3: 5≤ΔE*ab value<10
2: 10≤ΔE*ab value<20
1: 20≤ΔE*ab value <2. Light Resistance>

For a light resistance test, the color filter 1 was irradiated with light using a xenon lamp at 50,000 lux for 20 hours (equivalent to 1,000,000 lux·hour). Then, a ΔE*ab value that was a color difference between before and after the light resistance test was measured. A smaller ΔE*ab value indicates a better light resistance.

Evaluation Criteria
5: ΔE*ab value<3
4: 3≤ΔE*ab value<5
3: 5≤ΔE*ab value<10
2: 10≤ΔE*ab value<20
1: 20≤ΔE*ab value <3. Luminance>

The luminance of the color filter 1 was measured using a microscopic spectrocolorimeter OSP-SP200 manufactured by Olympus Corporation, and evaluated based on the Y value. A higher Y value indicates better performance as a color filter for liquid crystal display.

<4. Voltage Retention Rate>

The colored composition 1 was coated on a glass substrate equipped with an ITO electrode (trade name: 1737, manufactured by Corning) so as to have a film thickness after drying of 2.0 μm, and was dried in an oven at 90° C. for 60 seconds (pre-baking). Thereafter, the coating film was exposed at 100 mJ/cm² (illuminance 20 mW/cm²) without a mask, and developed at 25° C. using a 1% by mass aqueous solution of an alkali developing liquid (trade name: CDK-1, manufactured by Fujifilm Electronic Materials Co., Ltd.), and the coating film after water-washing and drying was heat-treated in an oven at 230° C. for 30 minutes (post-baking) to form a colored cured film. The substrate on which the colored cured film had been formed and a substrate on which only an ITO electrode had been deposited into a predetermined shape were laminated with a sealing agent including 5 μm glass beads, and a liquid crystal MJ971189 (trade name) manufactured by Merck was injected between the substrates to prepare a liquid crystal cell.

Then, the liquid crystal cell was placed in a constant temperature bath at 70° C. for 48 hours, and then a voltage retention rate of the liquid crystal cell was measured with a liquid crystal voltage retention rate measuring system VHR-1 A type (trade name) manufactured by Toyo corporation under the following measurement conditions, and was evaluated in accordance with the following criteria.

A smaller voltage retention rate of the liquid crystal cell means that the liquid crystal cell cannot maintain the applied voltage at a predetermined level for 16.7 msec to orient the liquid crystal sufficiently.

A higher score denotes a better voltage retention rate.

<Measurement Conditions>

Distance between electrodes: 5 to 15 μm
Applied voltage pulse amplitude: 5 V
Applied voltage pulse frequency: 60 Hz
Applied voltage pulse width: 16.67 msec
Voltage retention rate: voltage of liquid crystal cell after 16.7 msec/voltage applied at 0 msec×100(%)

<Evaluation Criteria>
5: 90% or more
4: 85% or more but less than 90%
3: 80% or more but less than 85%
2: 75% or more but less than 80%
1: less than 75%

Examples 4 to 24

Color filters 2 to 22 were prepared in the same manner as in Example 3 except that the colored compositions 2 to 22 were used which were prepared by replacing the exemplary compound A-1 used in the preparation of the colored composition 1 with each of the compounds shown in Table 2 (all are the compounds described above as the exemplary compound of the specific metal complex compound) and adjusting the ratio of the exemplary compound to the pigment dispersion liquid (S-1) to adjust the chromaticity in Example 3.

Evaluation was carried out in the same manner as in Example 3 using the colored compositions 2 to 22 and the color filters 2 to 22. The results are shown in Table 2.

Example 25

A color filter 23 was obtained in the same manner as in Example 3 except that the components in the following composition were mixed to prepare a colored composition 23 and the colored composition 23 was used instead of the colored composition 1 in Example 3.

<Composition>

| | |
|---|---|
| Specific metal complex compound: Exemplary compound A-2 | 6.9 parts |
| Pigment dispersion liquid: (S-1) | 43.0 parts |
| Polymerizable compound: (T-1) | 103.4 parts |
| Binder resin: (U-1) | 212.2 parts |
| (Value in terms of solid content: 84.9 parts) | |
| Photopolymerization initiator: (V-2) | 21.2 parts |
| Photosensitizer: (W-1) | 3.5 parts |
| Organic solvent: (X-1) | 71.9 parts |
| Organic solvent: (X-2) | 3.6 parts |
| Surfactant: (Y-1) | 0.06 parts |

Examples 26 to 28

Color filters 24 to 26 were prepared in the same manner as in Example 25 except that the exemplary compound A-2 used in the preparation of the colored composition 23 was replaced with each of the compounds shown in Table 2 (all are the compounds described above as the exemplary compound of the specific metal complex compound) and the ratio of the exemplary compound to the pigment dispersion liquid (S-1) was adjusted to adjust the chromaticity, thereby preparing the colored compositions 24 to 26.

Evaluation was carried out in the same manner as in Example 3, using the colored compositions 24 to 26 and the color filters 24 to 26. The results are shown in Table 2.

Example 29

A color filter 27 was obtained in the same manner as in Example 3 except that the components in the following composition were mixed to prepare a colored composition 27 and the colored composition 27 was used instead of the colored composition 1 in Example 3.

Evaluation was carried out in the same manner as in Example 3, using the colored composition 27 and the color filter 27. The results are shown in Table 2.

<Composition>

| | |
|---|---|
| Specific metal complex compound: Exemplary compound A-3 | 4.7 parts |
| Pigment dispersion liquid: (S-1) | 42.1 parts |
| The following Compound (5) | 2.3 parts |

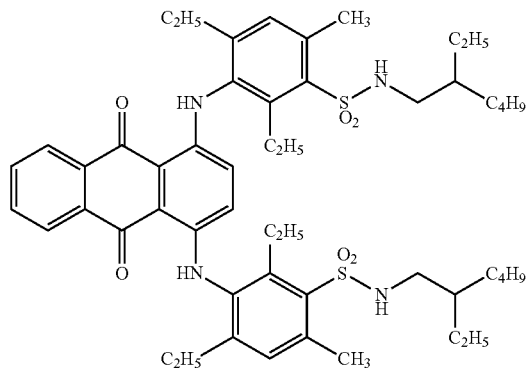

Compound (5)

| | |
|---|---|
| Polymerizable compound: (T-1) | 103.4 parts |
| Binder resin: (U-1) | 212.2 parts |
| (Value in terms of solid content: 84.9 parts) | |
| Photopolymerization initiator: (V-2) | 21.2 parts |
| Photosensitizer: (W-1) | 3.5 parts |
| Organic solvent: (X-1) | 71.9 parts |
| Organic solvent: (X-2) | 3.6 parts |
| Surfactant: (Y-1) | 0.06 parts |

Example 30

A color filter 28 was obtained in the same manner as in Example 29 except that the exemplary compound A-3 was replaced with the exemplary compound A-10 to prepare a colored composition 28 in the preparation of the colored composition 27 of Example 29.

Evaluation was carried out in the same manner as in Example 3, using the colored composition 28 and the color filter 28. The results are shown in Table 2.

Comparative Examples 1 to 4

Color filters C1 to C4 were obtained in the same manner as in Example 3 except that the exemplary compound A-1 was replaced with each of the comparative compounds shown in Table 2 and the ratio of the comparative compound to the pigment dispersion liquid (S-1) was adjusted to adjust the chromaticity, thereby preparing the comparative colored compositions C1 to C4, in the preparation of the colored composition 1 of Example 3.

Evaluation was carried out in the same manner as in Example 3 using the colored compositions C1 to C4 and the color filters C1 to C4. The results are shown in Table 2.

Furthermore, the details of the comparative compounds 1 and 2 shown in Table 2 are as follows.

Comparative compound 1

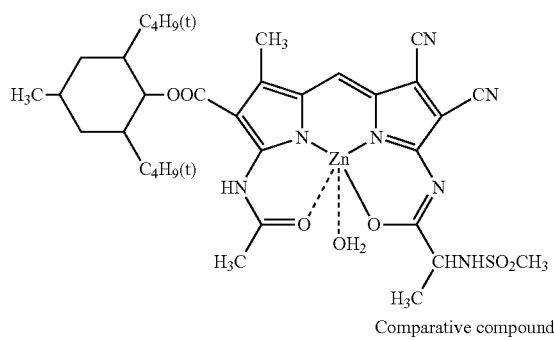

Comparative compound 2

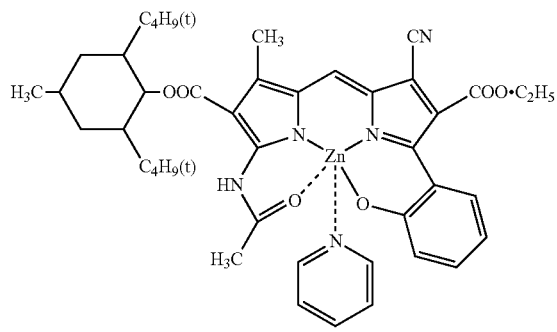

Comparative Example 5

A color filter C5 was obtained in the same manner as in Example 25 except that the exemplary compound A-2 was replaced with C. I. Acid Violet 17 to prepare a colored composition C5 in the preparation of colored composition 23 of Example 25.

Evaluation was carried out in the same manner as in Example 3, using the colored composition C5 and the color filter C5. The results are shown in Table 2.

Comparative Example 6

A color filter C6 was obtained in the same manner as in Example 29 except that the exemplary compound A-3 was replaced with C. I. Acid Violet 49 to prepare a colored composition C6 in the preparation of colored composition 27 of Example 29.

Evaluation was carried out in the same manner as in Example 3, using the colored composition C6 and the color filter C6. The results are shown in Table 2.

TABLE 2

|  | Exemplary compound or comparative compound | Colored composition | Color filter | Heat resistance | Light resistance | Luminance (Y value) | Voltage retention rate |
|---|---|---|---|---|---|---|---|
| Example 3 | A-1 | Colored composition 1 | Color filter 1 | 4 | 5 | 10.6 | 4 |
| Example 4 | A-2 | Colored composition 2 | Color filter 2 | 5 | 5 | 10.7 | 5 |
| Example 5 | A-3 | Colored composition 3 | Color filter 3 | 5 | 5 | 10.8 | 5 |
| Example 6 | A-4 | Colored composition 4 | Color filter 4 | 4 | 5 | 10.6 | 4 |
| Example 7 | A-5 | Colored composition 5 | Color filter 5 | 5 | 5 | 10.6 | 5 |
| Example 8 | A-6 | Colored composition 6 | Color filter 6 | 5 | 5 | 10.7 | 5 |
| Example 9 | A-8 | Colored composition 7 | Color filter 7 | 4 | 5 | 10.6 | 5 |
| Example 10 | A-9 | Colored composition 8 | Color filter 8 | 4 | 5 | 10.7 | 4 |
| Example 11 | A-10 | Colored composition 9 | Color filter 9 | 5 | 5 | 10.8 | 5 |
| Example 12 | A-11 | Colored composition 10 | Color filter 10 | 5 | 5 | 10.9 | 5 |
| Example 13 | A-12 | Colored composition 11 | Color filter 11 | 5 | 5 | 10.7 | 5 |
| Example 14 | A-15 | Colored composition 12 | Color filter 12 | 5 | 5 | 10.9 | 5 |
| Example 15 | A-18 | Colored composition 13 | Color filter 13 | 5 | 5 | 10.5 | 5 |
| Example 16 | A-21 | Colored composition 14 | Color filter 14 | 5 | 5 | 10.6 | 5 |
| Example 17 | A-24 | Colored composition 15 | Color filter 15 | 5 | 5 | 10.7 | 5 |
| Example 18 | A-25 | Colored composition 16 | Color filter 16 | 5 | 5 | 10.8 | 5 |
| Example 19 | A-28 | Colored composition 17 | Color filter 17 | 4 | 5 | 10.6 | 4 |
| Example 20 | A-34 | Colored composition 18 | Color filter 18 | 5 | 5 | 10.4 | 5 |

TABLE 2-continued

| | Exemplary compound or comparative compound | Colored composition | Color filter | Heat resistance | Light resistance | Luminance (Y value) | Voltage retention rate |
|---|---|---|---|---|---|---|---|
| Example 21 | A-38 | Colored composition 19 | Color filter 19 | 5 | 5 | 10.4 | 5 |
| Example 22 | A-57 | Colored composition 20 | Color filter 20 | 5 | 5 | 10.4 | 5 |
| Example 23 | A-64 | Colored composition 21 | Color filter 21 | 5 | 5 | 10.5 | 5 |
| Example 24 | A-80 | Colored composition 22 | Color filter 22 | 4 | 5 | 10.8 | 4 |
| Example 25 | A-2 | Colored composition 23 | Color filter 23 | 5 | 5 | 10.7 | 5 |
| Example 26 | A-3 | Colored composition 24 | Color filter 24 | 5 | 5 | 10.8 | 5 |
| Example 27 | A-10 | Colored composition 25 | Color filter 25 | 5 | 5 | 10.8 | 5 |
| Example 28 | A-12 | Colored composition 26 | Color filter 26 | 5 | 5 | 10.7 | 5 |
| Example 29 | A-3 | Colored composition 27 | Color filter 27 | 5 | 5 | 10.7 | 5 |
| Example 30 | A-10 | Colored composition 28 | Color filter 28 | 5 | 5 | 10.7 | 5 |
| Comparative Example 1 | C.I. Acid Violet 17 | Colored composition C1 | Color filter C1 | 4 | 4 | 8.7 | 1 |
| Comparative Example 2 | C.I. Acid Violet 49 | Colored composition C2 | Color filter C2 | 2 | 1 | 8.5 | 1 |
| Comparative Example 3 | Comparative compound 1 | Colored composition C3 | Color filter C3 | 4 | 4 | 9.9 | 2 |
| Comparative Example 4 | Comparative compound 2 | Colored composition C4 | Color filter C4 | 4 | 4 | 9.8 | 2 |
| Comparative Example 5 | C.I. Acid Violet 17 | Colored composition C5 | Color filter C5 | 4 | 4 | 8.6 | 1 |
| Comparative Example 6 | C.I. Acid Violet 49 | Colored composition C6 | Color filter C6 | 2 | 1 | 8.3 | 1 |

As seen in Table 2, in the color filter of each Example in which the specific metal complex compound was used, an unexpectedly great effect of improvement of the luminance (Y value) was found, as compared with the color filters of Comparative Examples 1, 2, 5, and 6 in which conventionally known compounds were used. Further, in each Example in which the specific metal complex compound was used, it was possible to maintain a high voltage retention rate, as compared with Comparative Examples 3 and 4 in which conventionally known dipyrromethene metal complex compounds were used.

<Contrast>

For the color filters obtained in Examples 5, 11, 29, and 30, and Comparative Examples 1, 2, 3, and 4, the contrast was evaluated in the following method. The results are shown in Table 3.

The obtained color filter was sandwiched between two polarizing films, and the value of luminance in a case in which the polarizing axes of the two polarizing films were parallel and the value of luminance in a case in which the polarizing axes of the two polarizing films were orthogonal were measured using a color luminance meter (Type No.: BM-5A manufactured by TOPCON Corporation), and a value obtained by dividing a luminance in a case in which the polarizing axes of the two polarizing films were parallel by a luminance in a case in which the polarizing axes of the two polarizing films were orthogonal was used as a contrast. A higher contrast indicates better performance as a color filter for liquid crystal display.

TABLE 3

| | Exemplary compound or comparative compound | Contrast |
|---|---|---|
| Example 5 | A-3 | 21,000 |
| Example 11 | A-10 | 20,500 |
| Example 29 | A-3 | 23,000 |
| Example 30 | A-10 | 23,000 |
| Comparative Example 1 | C.I. Acid Violet 17 | 16,000 |
| Comparative Example 2 | C.I. Acid Violet 49 | 15,000 |
| Comparative Example 3 | Comparative compound 1 | 18,000 |
| Comparative Example 4 | Comparative compound 2 | 18,000 |

As seen in Table 3, in the color filters of Examples 5, 11, 29, and 30 in which the specific metal complex compounds were used, an unexpectedly great effect of improvement of the contrast was found, as compared with the color filters of Comparative Examples 1 and 2 in which conventionally known compounds were used and the color filters of Comparative Examples 3 and 4 in which conventionally known dipyrromethene metal complex compounds were used. Further, the color filters of Examples 29 and 30 using the specific metal complex compounds and the anthraquinone compounds exhibited a particularly high contrast.

From the results above, the color filter prepared using the specific metal complex compound has toughness (heat resistance and light resistance), a good hue, a high contrast, a high voltage retention rate, and the like, and therefore, the specific metal complex compound may be mentioned as a dye having high general versatility.

What is claimed is:

1. A colored composition comprising at least one selected from the group consisting of a compound represented by the following formula (I) and a tautomer thereof:

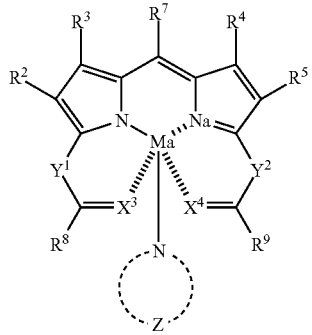
(I)

wherein in formula (I), $R^2$, $R^3$, $R^4$, and $R^5$ each independently represent a hydrogen atom or a monovalent substituent; $R^2$ and $R^3$ may be bonded to each other to form a 5-, 6-, or 7-membered saturated or unsaturated ring; $R^4$ and $R^5$ may be bonded to each other to form a 5-, 6-, or 7-membered saturated or unsaturated ring; $R^7$ represents a hydrogen atom, a halogen atom, an alkyl group, an aryl group, or a heterocyclic group; Ma represents a metal or a metal compound; $X^3$ and $X^4$ each independently represent NR, a nitrogen atom, an oxygen atom, or a sulfur atom, wherein R represents a hydrogen atom, an alkyl group, an alkenyl group, an aryl group, a heterocyclic group, an acyl group, an alkylsulfonyl group, or an arylsulfonyl group; $Y^1$ and $Y^2$ each independently represent NRc, a nitrogen atom, or a carbon atom, wherein Rc represents a hydrogen atom, an alkyl group, an alkenyl group, an aryl group, a heterocyclic group, an acyl group, an alkylsulfonyl group, or an arylsulfonyl group; $R^8$ and $R^9$ each independently represent an alkyl group, an alkenyl group, an aryl group, a heterocyclic group, an alkoxy group, an aryloxy group, an alkylamino group, an arylamino group, or a heterocyclic amino group; $R^8$ and $Y^1$ may be bonded to each other to form a 5-, 6-, or 7-membered ring; $R^9$ and $Y^2$ may be bonded to each other to form a 5-, 6-, or 7-membered ring; and Z represents an atomic group that is combined with an adjacent nitrogen atom to form a structure represented by the following formula (II) or (III):

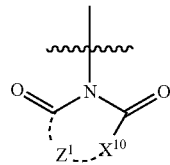
(II)

wherein in formula (II), $X^{10}$ represents $NR^{15}$, an oxygen atom, or a sulfur atom, wherein $R^{15}$ represents a hydrogen atom, an alkyl group, an alkenyl group, an aryl group, a heterocyclic group, an acyl group, an alkylsulfonyl group, or an arylsulfonyl group; and $Z^1$ represents an atomic group that includes a chain structure containing zero or one nitrogen atom and a carbon atom and connects an adjacent carbonyl carbon and $X^{10}$ by the chain structure to form a 5- or 6-membered ring;

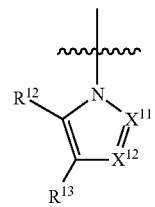
(III)

wherein in formula (III), $X^{11}$ and $X^{12}$ each independently represent a nitrogen atom or $CR^{16}$, wherein $R^{16}$ represents a hydrogen atom or a substituent; and $R^{12}$ and $R^{13}$ each independently represent a hydrogen atom or a monovalent substituent.

2. The colored composition according to claim 1, wherein Ma in formula (I) represents Fe, Zn, Co, V=O, or Cu.

3. The colored composition according to claim 2, further comprising a polymerizable compound and a photopolymerization initiator.

4. The colored composition according to claim 2, further comprising a polymerizable compound; a photopolymerization initiator; and either a pigment or an anthraquinone compound or both of the pigment and the anthraquinone compound.

5. The colored composition according to claim 2, further comprising a polymerizable compound; a photopolymerization initiator; and either a pigment or an anthraquinone compound or both of the pigment and the anthraquinone compound, wherein the anthraquinone compound is a compound represented by the following formula (IX):

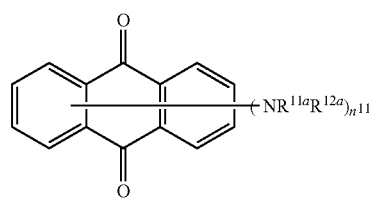
Formula (IX)

wherein in formula (IX), $R^{11a}$ and $R^{12a}$ each independently represent a hydrogen atom, an alkyl group, an aryl group, or a heterocyclic group, but $R^{11a}$ and $R^{12a}$ do not represent a hydrogen atom simultaneously; and $n^{11}$ represents an integer of from 1 to 4, and in a case in which $n^{11}$ represents an integer of from 2 to 4, a plurality of $NR^{11a}R^{12a}$'s may be the same as or different from each other.

6. The colored composition according to claim 2, further comprising a polymerizable compound; a photopolymerization initiator; and either a pigment or an anthraquinone compound or both of the pigment and the anthraquinone compound, wherein the anthraquinone compound is a compound represented by the following formula (IX):

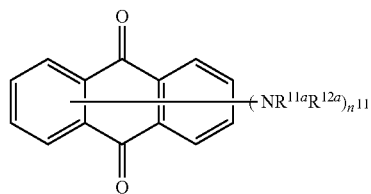

Formula (IX)

wherein in formula (IX), $R^{11a}$ and $R^{12a}$ each independently represent a hydrogen atom, an alkyl group, an aryl group, or a heterocyclic group, but $R^{11a}$ and $R^{12a}$ do not represent a hydrogen atom simultaneously; and $n^{11}$ represents an integer of from 1 to 4, and in a case in which $n^{11}$ represents an integer of from 2 to 4, a plurality of $NR^{11a}R^{12a}$'s may be the same as or different from each other, wherein a content of the at least one selected from the group consisting of a compound represented by formula (I) and a tautomer thereof is from 0.1% by mass to 30% by mass based on a total solid content of the colored composition.

7. The colored composition according to claim 1, further comprising a polymerizable compound and a photopolymerization initiator.

8. The colored composition according to claim 1, further comprising either a pigment or an anthraquinone compound, or both of the pigment and the anthraquinone compound.

9. The colored composition according to claim 8, wherein the anthraquinone compound is a compound represented by the following formula (IX):

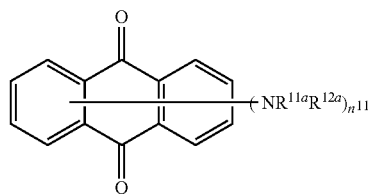

Formula (IX)

wherein in formula (IX), $R^{11a}$ and $R^{12a}$ each independently represent a hydrogen atom, an alkyl group, an aryl group, or a heterocyclic group, but $R^{11a}$ and $R^{12a}$ do not represent a hydrogen atom simultaneously; and $n^{11}$ represents an integer of from 1 to 4, and in a case in which $n^{11}$ represents an integer of from 2 to 4, a plurality of $NR^{11a}R^{12a}$'s may be the same as or different from each other.

10. The colored composition according to claim 1, wherein a content of the at least one selected from the group consisting of a compound represented by formula (I) and a tautomer thereof is from 0.1% by mass to 30% by mass based on a total solid content of the colored composition.

11. A colored cured film obtained by curing the colored composition according to claim 1.

12. A color filter comprising the colored cured film according to claim 11.

13. A liquid crystal display device comprising the color filter according to claim 12.

14. A solid-state imaging device comprising the color filter according to claim 12.

15. A method for producing a color filter, comprising:
applying the colored composition according to claim 1 onto a support to form a colored composition layer; and
patternwise exposing and developing the formed colored composition layer to form a patterned colored region.

16. A liquid crystal display device comprising a color filter produced by the method for producing a color filter according to claim 15.

17. A solid-state imaging device comprising a color filter produced by the method for producing a color filter according to claim 15.

18. A compound represented by the following formula (I) or a tautomer thereof:

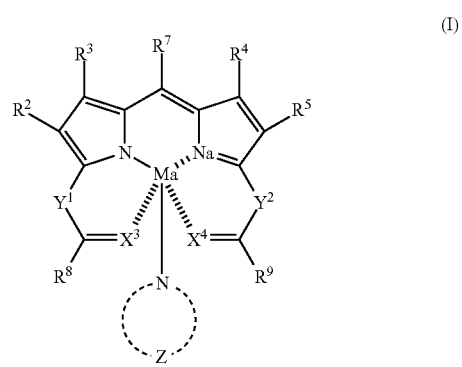

(I)

wherein in formula (I), $R^2$, $R^3$, $R^4$, and $R^5$ each independently represent a hydrogen atom or a monovalent substituent; $R^2$ and $R^3$ may be bonded to each other to form a 5-, 6-, or 7-membered saturated or unsaturated ring; $R^4$ and $R^5$ may be bonded to each other to form a 5-, 6-, or 7-membered saturated or unsaturated ring; $R^7$ represents a hydrogen atom, a halogen atom, an alkyl group, an aryl group, or a heterocyclic group; Ma represents a metal or a metal compound; $X^3$ and $X^4$ each independently represent NR, a nitrogen atom, an oxygen atom, or a sulfur atom, wherein R represents a hydrogen atom, an alkyl group, an alkenyl group, an aryl group, a heterocyclic group, an acyl group, an alkylsulfonyl group, or an arylsulfonyl group; $Y^1$ and $Y^2$ each independently represent NRc, a nitrogen atom, or a carbon atom, wherein Rc represents a hydrogen atom, an alkyl group, an alkenyl group, an aryl group, a heterocyclic group, an acyl group, an alkylsulfonyl group, or an arylsulfonyl group; $R^8$ and $R^9$ each independently represent an alkyl group, an alkenyl group, an aryl group, a heterocyclic group, an alkoxy group, an aryloxy group, an alkylamino group, an arylamino group, or a heterocyclic amino group; $R^8$ and $Y^1$ may be bonded to each other to form a 5-, 6-, or 7-membered ring; $R^9$ and $Y^2$ may be bonded to each other to form a 5-, 6-, or 7-membered ring; and Z represents an atomic group that is combined with an adjacent nitrogen atom to form a structure represented by the following formula (II) or (III):

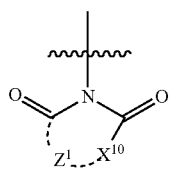

(II)

wherein in formula (II), $X^{10}$ represents $NR^{15}$, an oxygen atom, or a sulfur atom, wherein $R^{15}$ represents a hydrogen atom, an alkyl group, an alkenyl group, an aryl group, a heterocyclic group, an acyl group, an alkylsulfonyl group, or an arylsulfonyl group; and $Z^1$ represents an atomic group that includes a chain structure containing zero or one nitrogen atom and a carbon atom and connects an adjacent carbonyl carbon and $X^{10}$ by the chain structure to form a 5- or 6-membered ring;

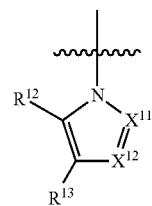

(III)

wherein in formula (III), $X^{11}$ and $X^{12}$ each independently represent a nitrogen atom or $CR^{16}$, wherein $R^{16}$ represents a hydrogen atom or a substituent; and $R^{12}$ and $R^{13}$ each independently represent a hydrogen atom or a monovalent substituent.

* * * * *